United States Patent
Yamanaka et al.

(10) Patent No.: US 6,372,558 B1
(45) Date of Patent: *Apr. 16, 2002

(54) ELECTROOPTIC DEVICE, DRIVING SUBSTRATE FOR ELECTROOPTIC DEVICE, AND METHOD OF MANUFACTURING THE DEVICE AND SUBSTRATE

(75) Inventors: Hideo Yamanaka; Hisayoshi Yamoto; Yuichi Sato, all of Kanagawa; Hajime Yagi, Tokyo, all of (JP)

(73) Assignee: Sony Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/376,840

(22) Filed: Aug. 18, 1999

(30) Foreign Application Priority Data

Aug. 18, 1998 (JP) .......................... 10-231855
Sep. 9, 1998 (JP) .......................... 10-255275

(51) Int. Cl.$^7$ ........................ H01L 21/00; H01L 21/84; G02F 1/136
(52) U.S. Cl. ................... 438/149; 438/150; 438/155; 349/42; 349/43
(58) Field of Search ............................ 438/149, 29, 30, 438/150, 155; 349/41, 42, 43, 47, 84, 139

(56) References Cited

U.S. PATENT DOCUMENTS

| | | | | | |
|---|---|---|---|---|---|
| 4,469,527 | A | * | 9/1984 | Sugano et al. | 148/15 |
| 4,498,226 | A | * | 2/1985 | Inoue et al. | 29/576 |
| 5,757,455 | A | * | 5/1998 | Sugiyama et al. | 349/129 |
| 5,818,550 | A | * | 10/1998 | Kadota et al. | 349/43 |
| 6,055,034 | A | * | 4/2000 | Zhang et al. | 349/151 |

OTHER PUBLICATIONS

Hattori et al., "Noise reduction of pHEMTs with plasmaless SiN passivation by catalytic CVD", GaAs IC Sympossium, 1997, 19 th Annual, pp. 78–80, Oct. 1997.*

* cited by examiner

Primary Examiner—Matthew Smith
Assistant Examiner—Lex H. Malsawma
(74) Attorney, Agent, or Firm—Sonnenschein, Nath & Rosenthal

(57) ABSTRACT

The present invention provides an active matrix substrate having a built-in high-performance driver, in which a single crystal silicon thin film having high electron/hole mobility is uniformly deposited at a relatively low temperature, and an electrooptic device such as a thin film semiconductor device for display including the active matrix substrate. The single crystal silicon thin film is deposited by hetero epitaxial growth by a catalytic CVD method or the like using a crystalline sapphire thin film formed on the substrate as a seed so that the single crystal silicon layer obtained is used for top gate type MOSTFTs of the electrooptic device such as a LED or the like in which a display region and a peripheral driving circuit region are integrated.

27 Claims, 75 Drawing Sheets

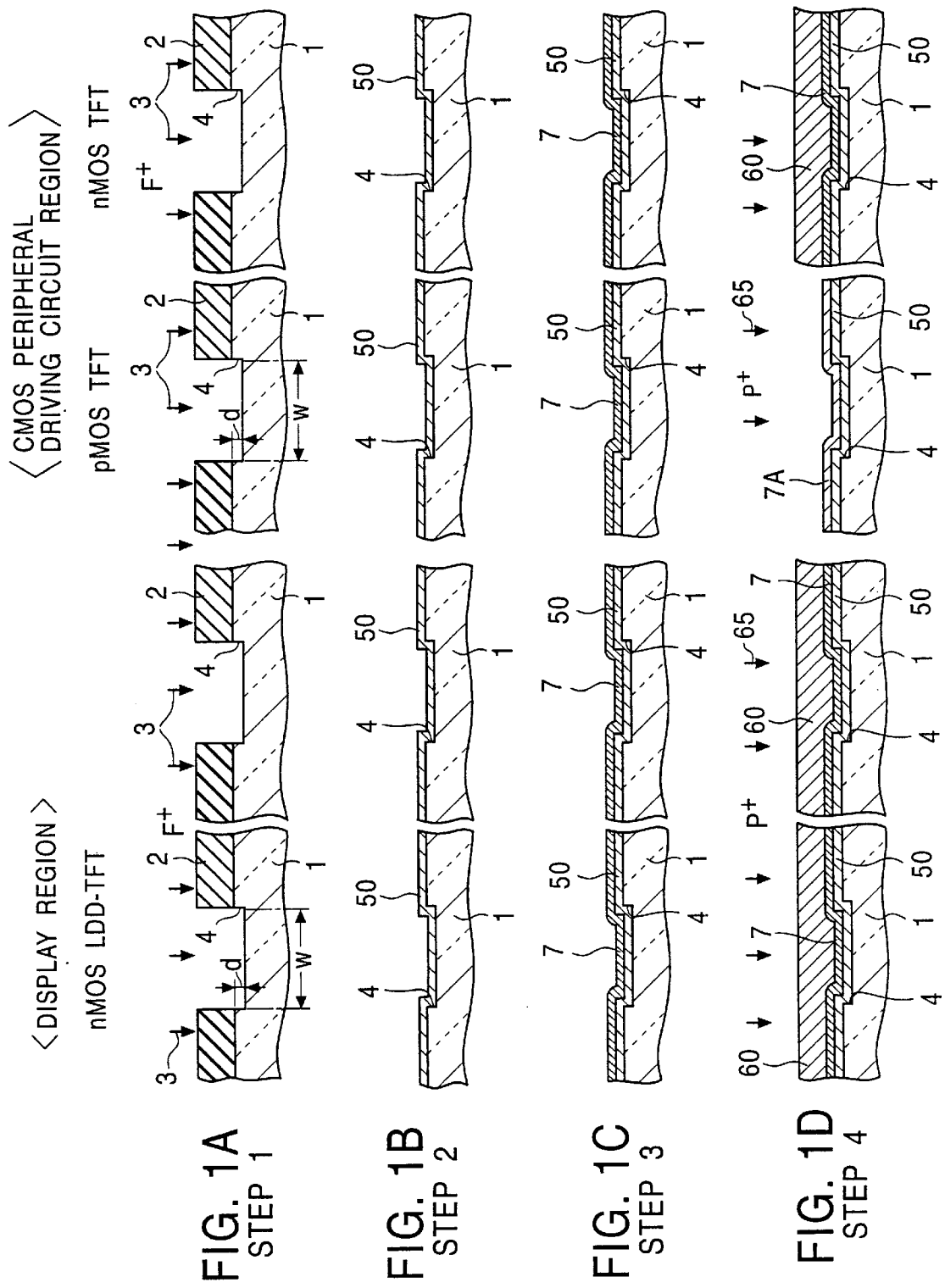

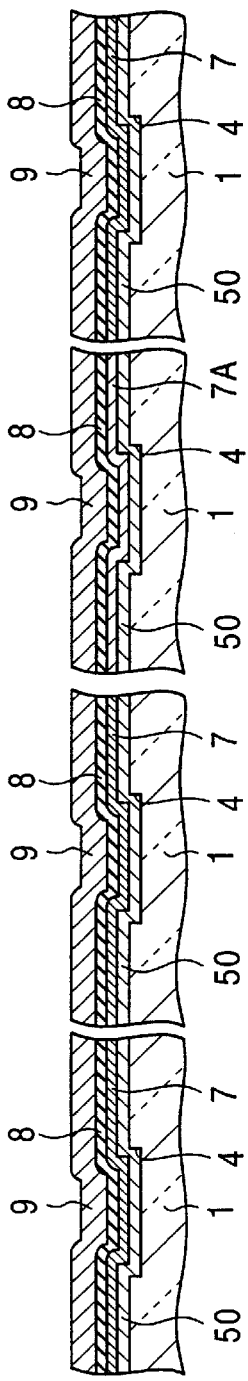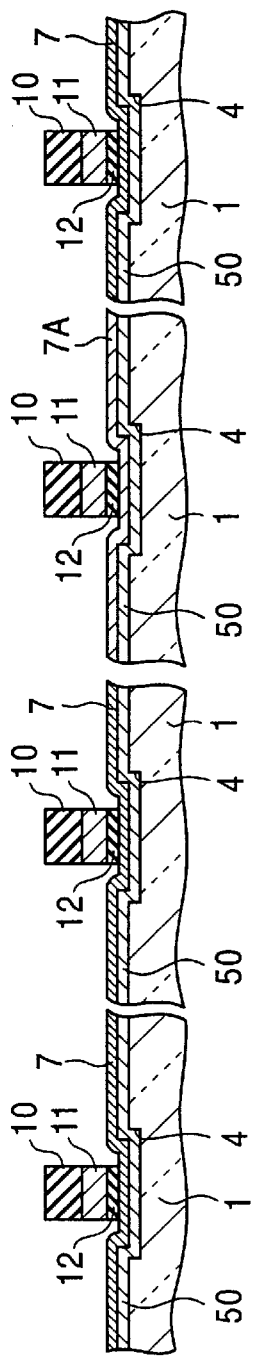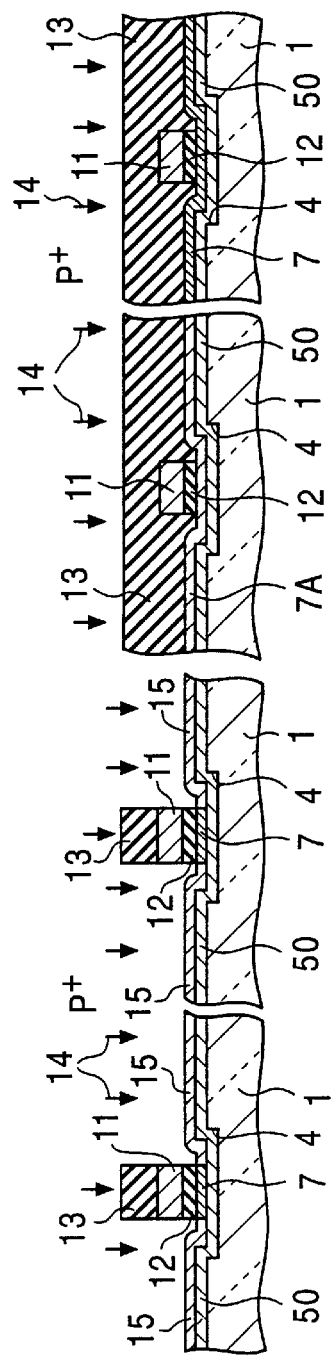
FIG. 2A STEP 5
FIG. 2B STEP 6
FIG. 2C STEP 7

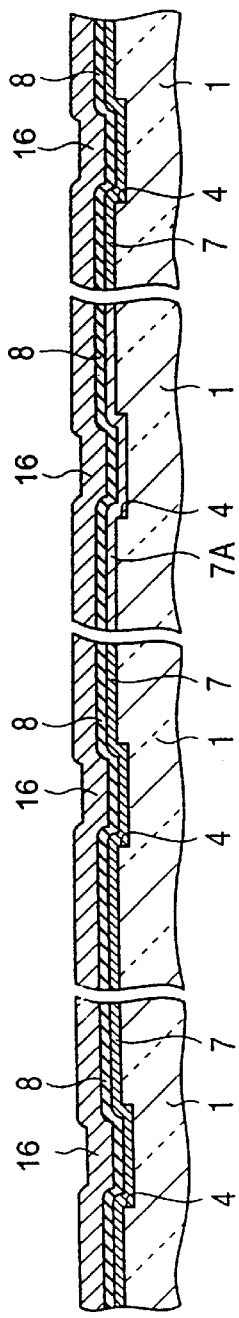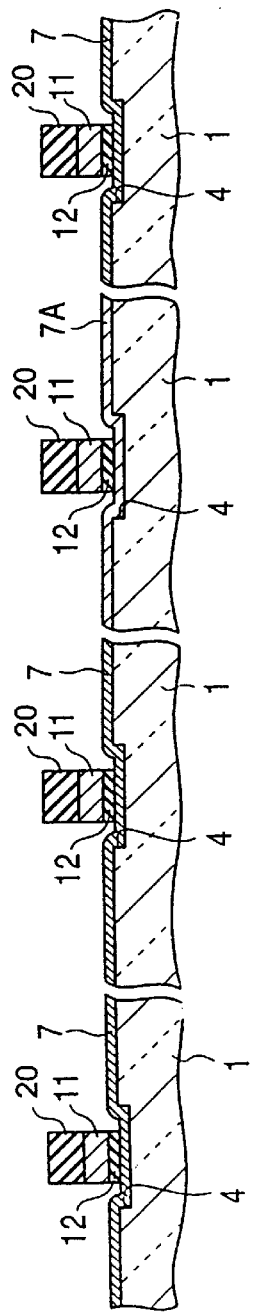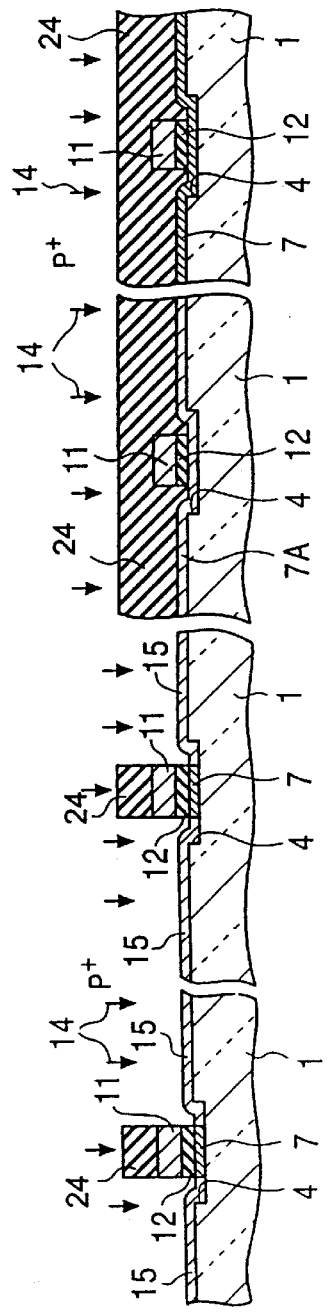
FIG. 3A STEP 8
FIG. 3B STEP 9
FIG. 3C STEP 10

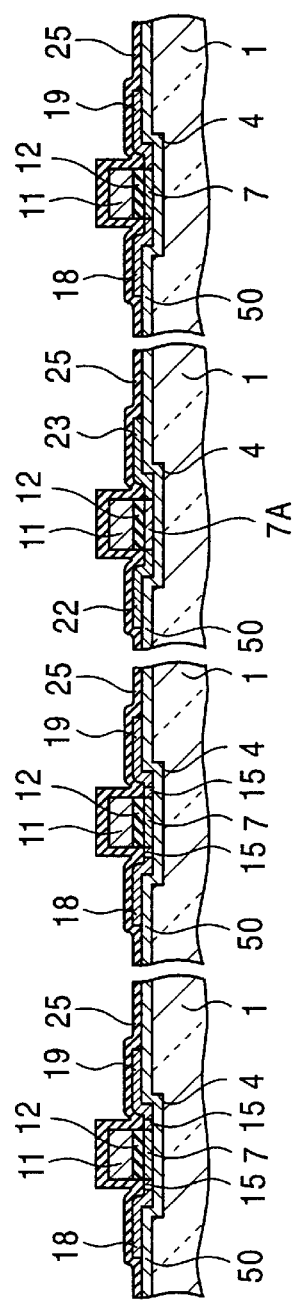
FIG. 4A STEP 11
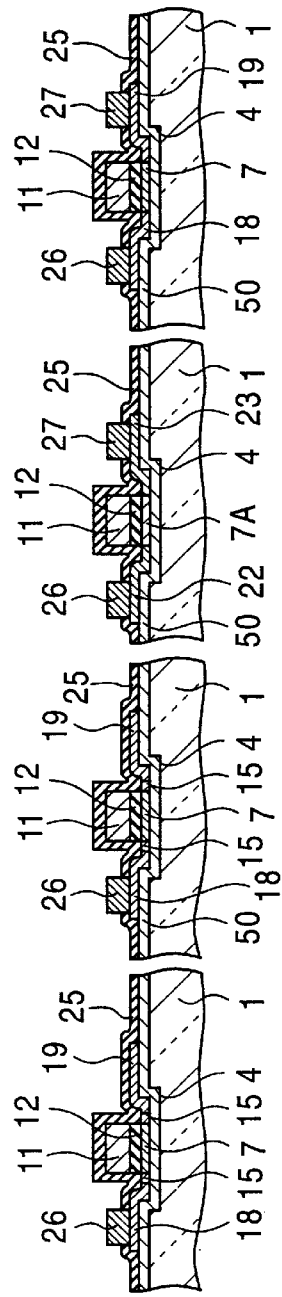
FIG. 4B STEP 12
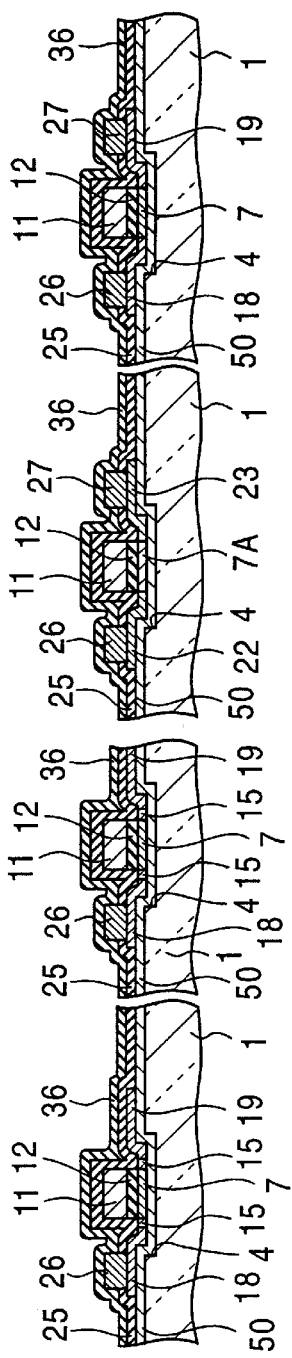
FIG. 4C STEP 13

STEP 14

STEP 15

STEP 16

FIG. 12

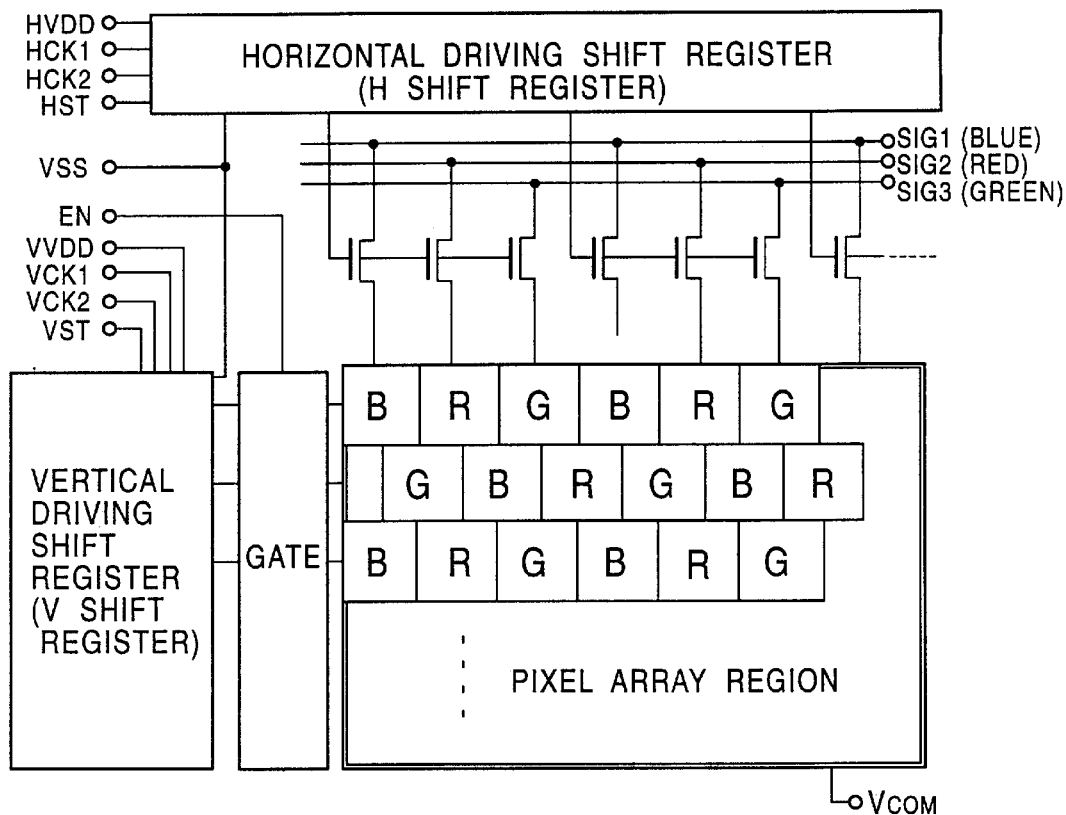

VCOM : COMMON ELECTRODE VOLTAGE
HVDD : POWER INPUT TERMINAL FOR H DRIVER
VVDD : POWER INPUT TERMINAL FOR V DRIVER
HCK1 : CLOCK INPUT TERMINAL FOR DRIVING H SHIFT REGISTER
HCK2 : CLOCK INPUT TERMINAL FOR DRIVING H SHIFT REGISTER
VCK1 : CLOCK INPUT TERMINAL FOR DRIVING V SHIFT REGISTER
VCK2 : CLOCK INPUT TERMINAL FOR DRIVING V SHIFT REGISTER
HST : START PULSE INPUT TERMINAL FOR DRIVING H SHIFT REGISTER
VST : START PULSE INPUT TERMINAL FOR DRIVING V SHIFT REGISTER
VSS : GND TERMINAL FOR H AND V DRIVERS
SIG1 : VOLTAGE OF VIDEO SIGNAL INPUT TERMINAL (BLUE)
SIG2 : VOLTAGE OF VIDEO SIGNAL INPUT TERMINAL (RED)
S1G3 : VOLTAGE OF VIDEO SIGNAL INPUT TERMINAL (GREEN)

STEP 14

STEP 15

STEP 16

STEP 13

STEP 14

STEP 15

STEP 16

<DISPLAY REGION>

STEP 1

STEP 2

STEP 3

STEP 4

STEP 5

STEP 6

STEP 7

FIG. 19A STEP 8
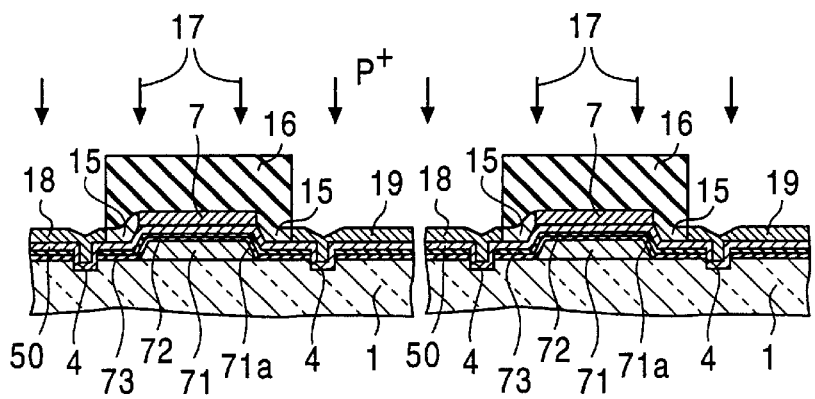
FIG. 19B STEP 9
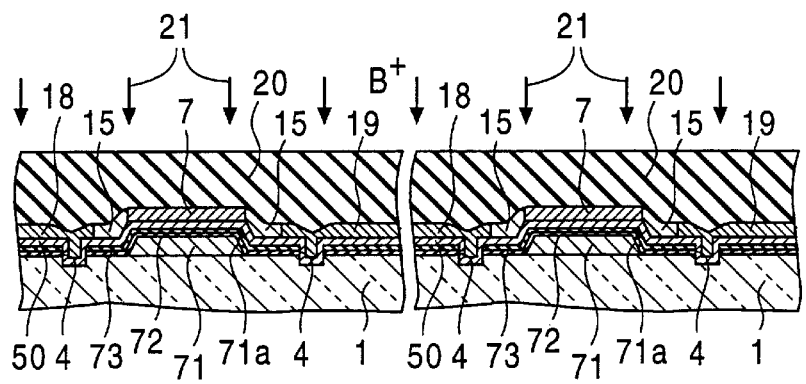
FIG. 19C STEP 10
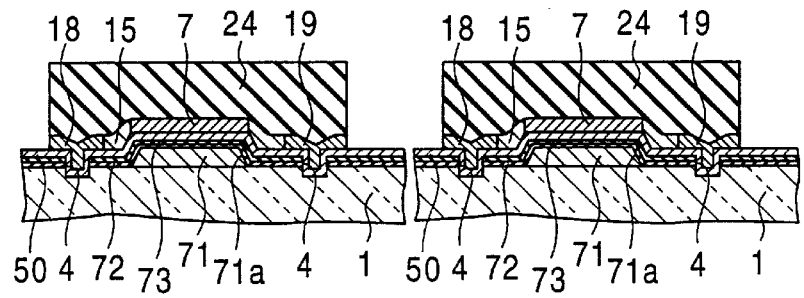
FIG. 19D STEP 11
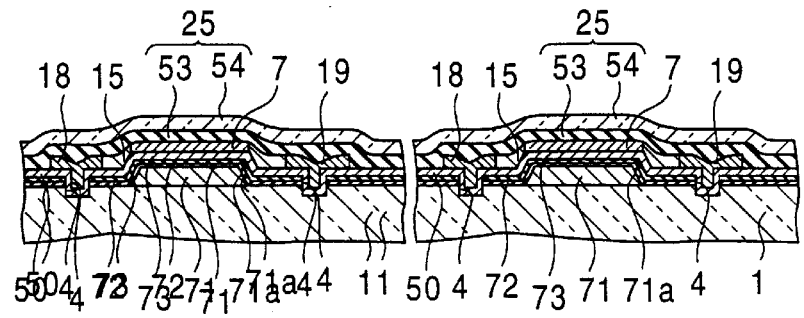

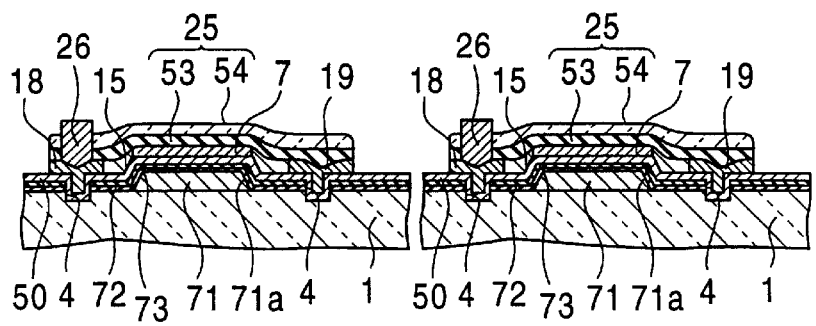
FIG. 20A STEP 12
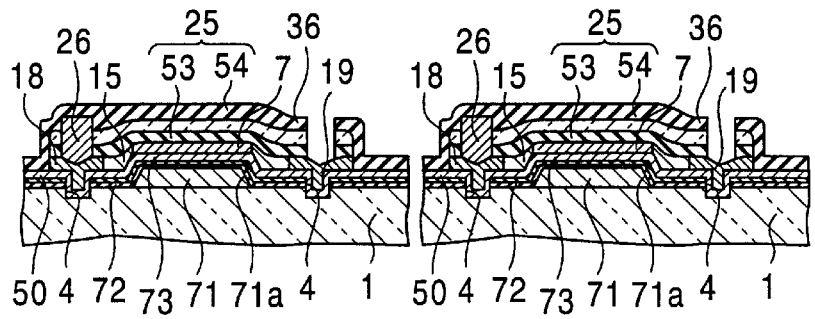
FIG. 20B STEP 13
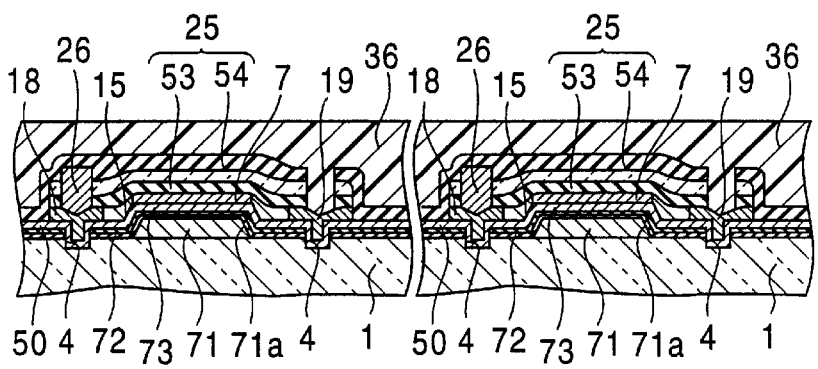
FIG. 20C STEP 14
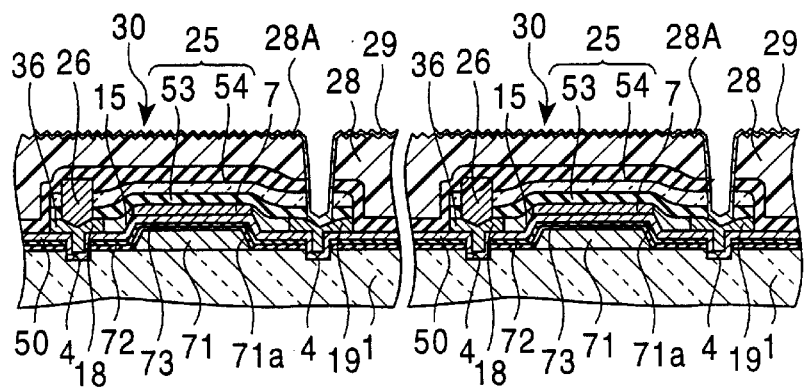
FIG. 20D STEP 15

⟨DISPLAY REGION⟩

STEP 3

STEP 4

STEP 5

<DISPLAY REGION>

STEP 7

STEP 8

STEP 9

STEP 10

STEP 11

STEP 12

STEP 13

STEP 14

STEP 15

STEP 16

STEP 17

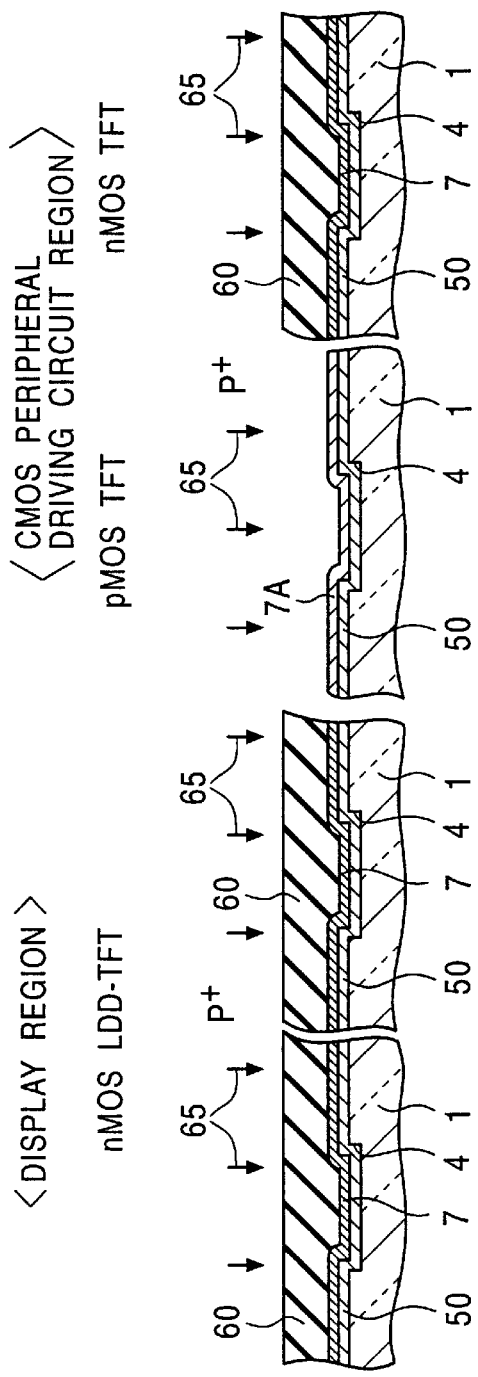
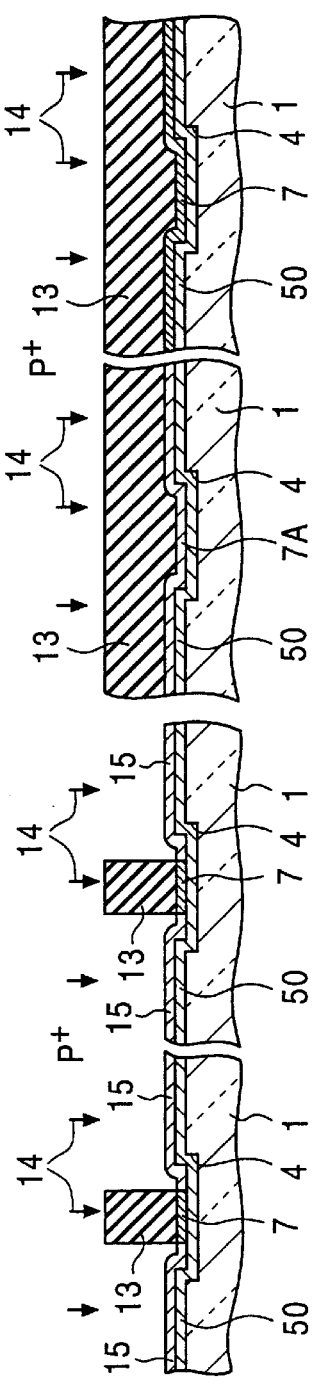
FIG. 25A STEP 4
FIG. 25B STEP 5

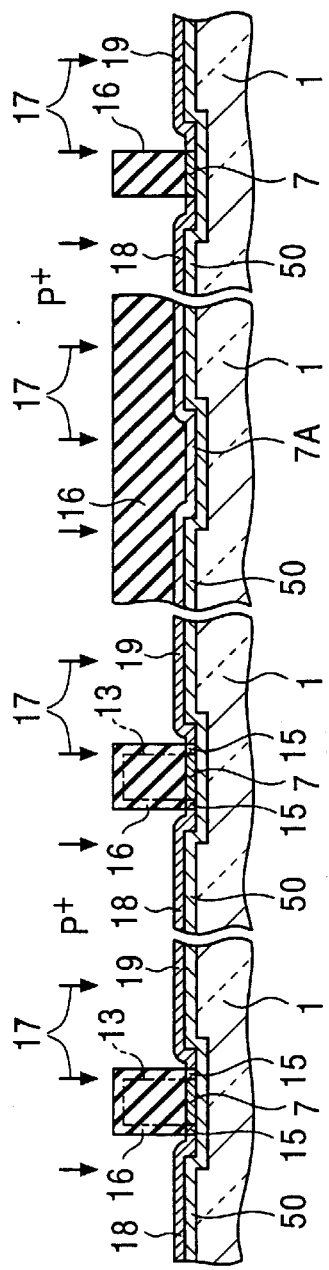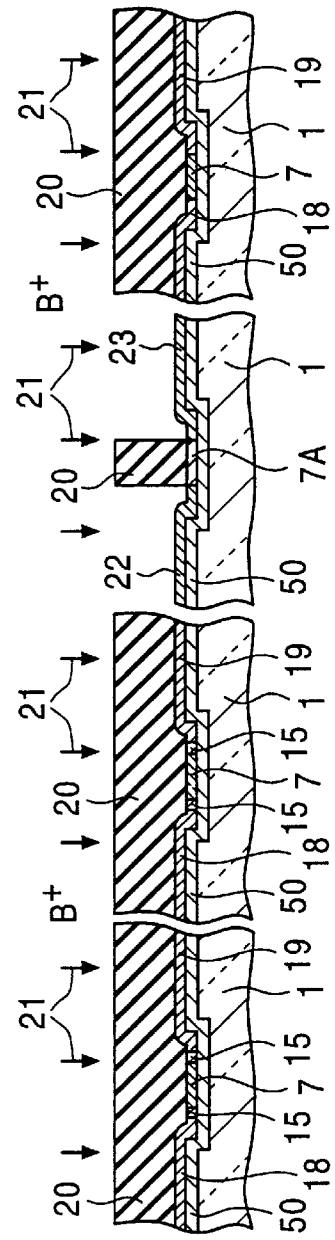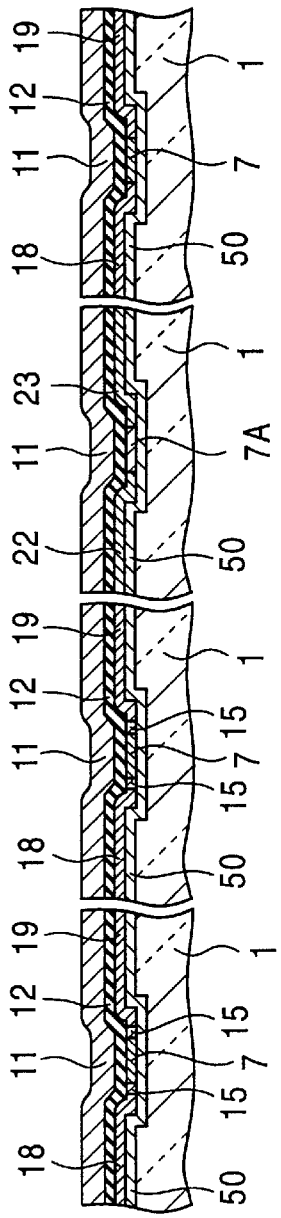
FIG. 26A STEP 6
FIG. 26B STEP 7
FIG. 26C STEP 8

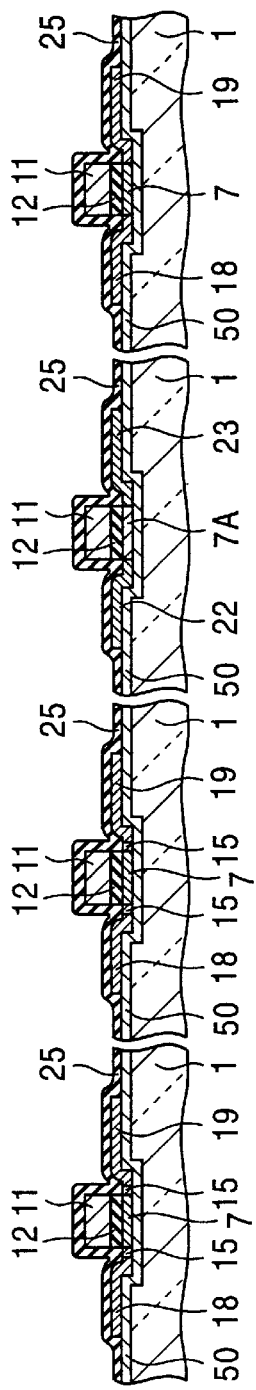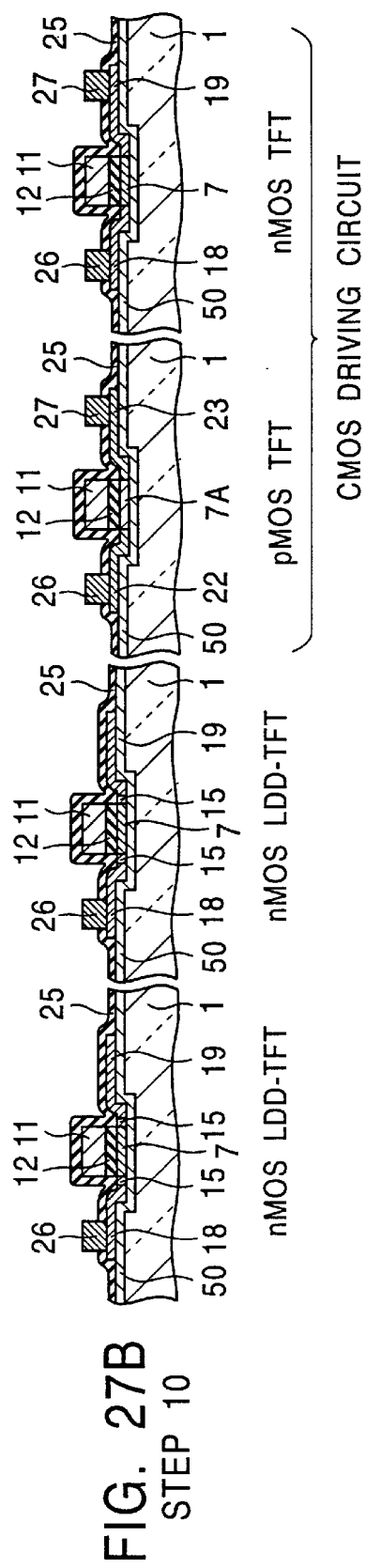
FIG. 27A STEP 9
FIG. 27B STEP 10

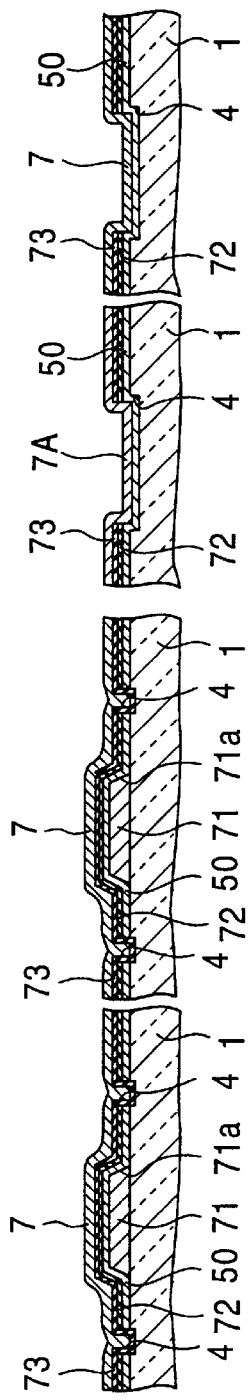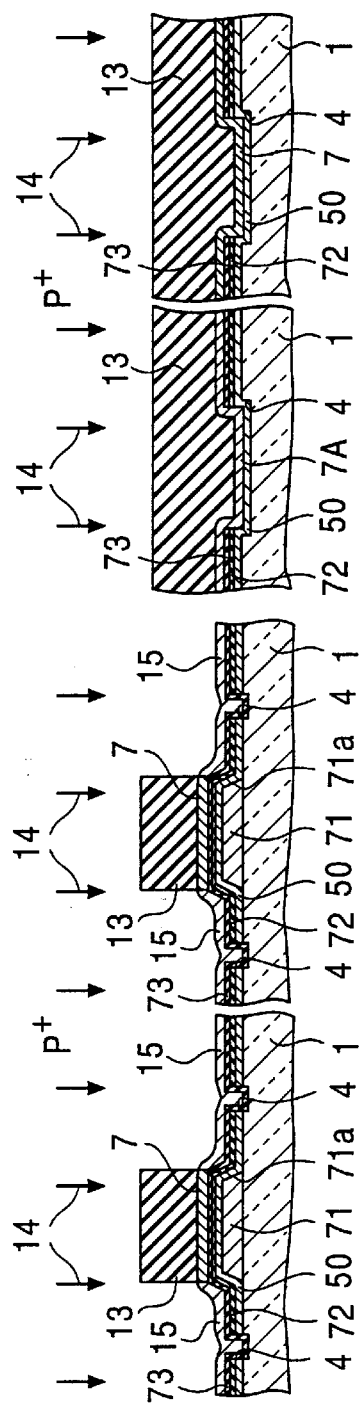
FIG. 28A STEP 5
FIG. 28B STEP 6

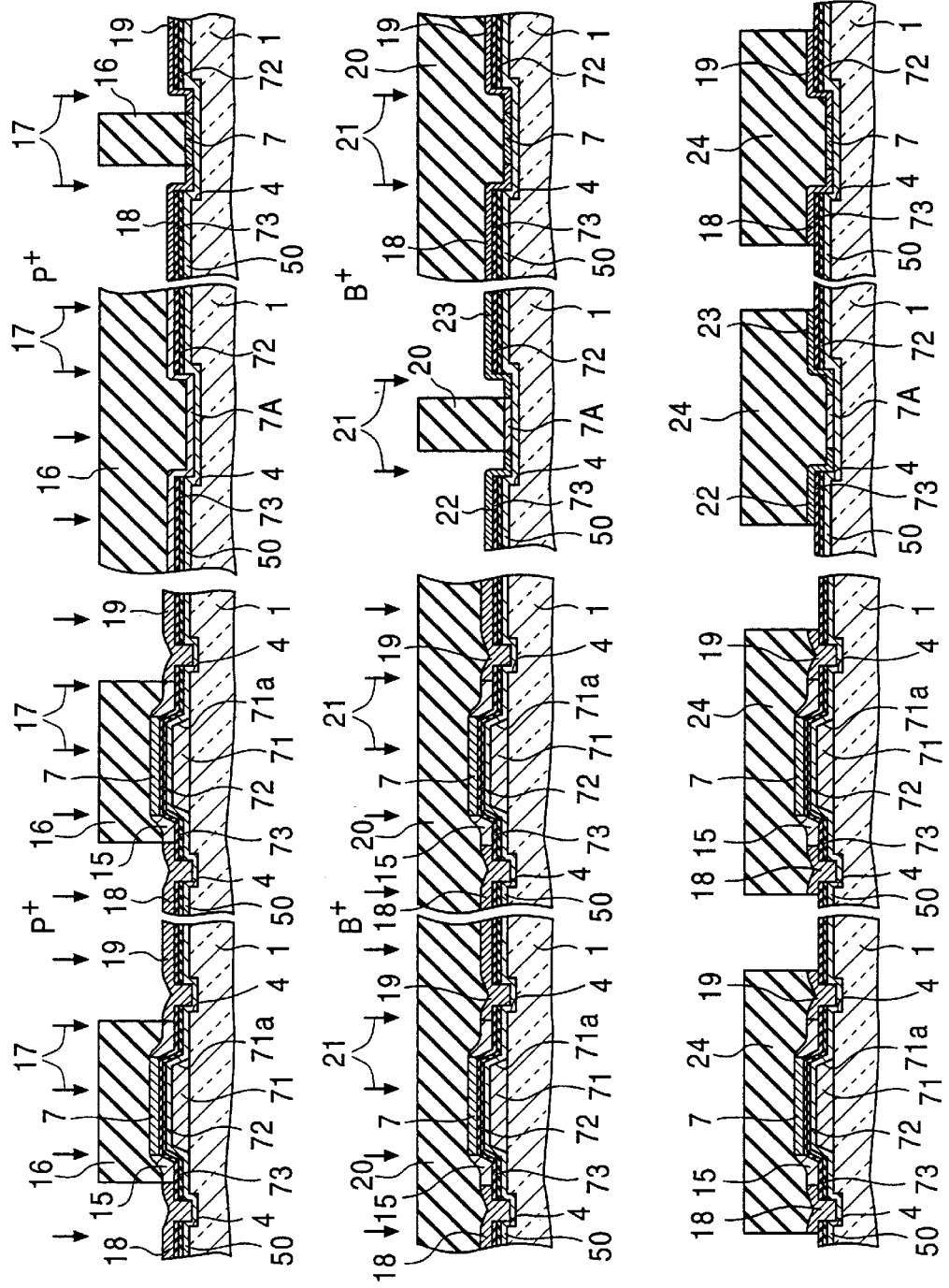
FIG. 29A STEP 8
FIG. 29B STEP 9
FIG. 29C STEP 10

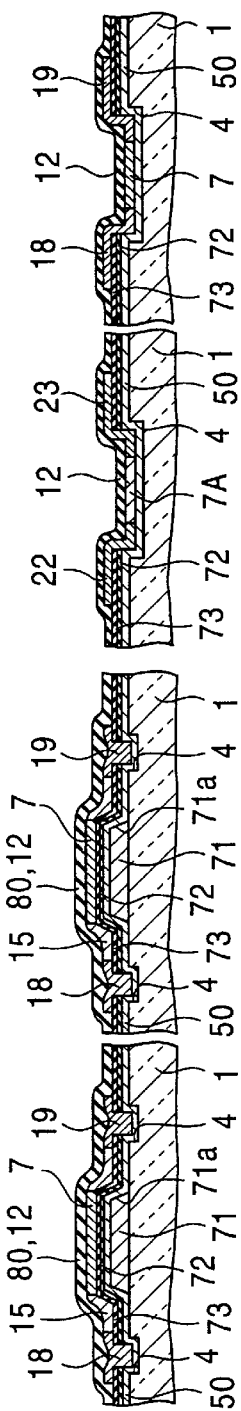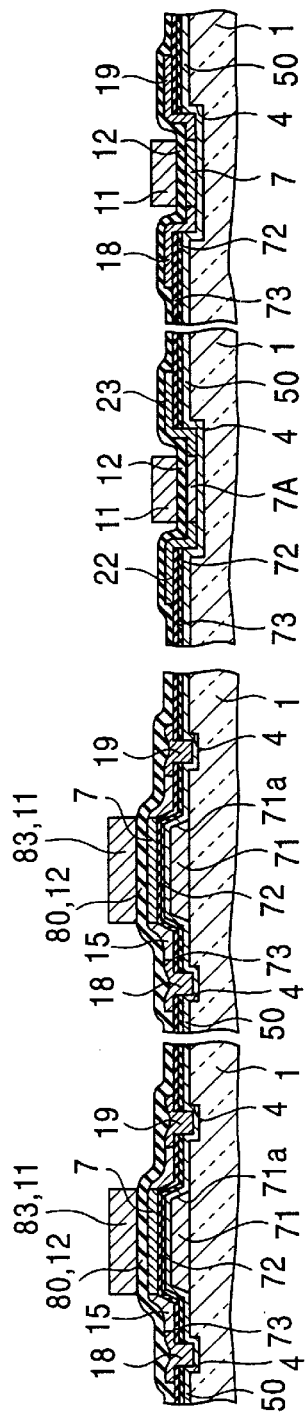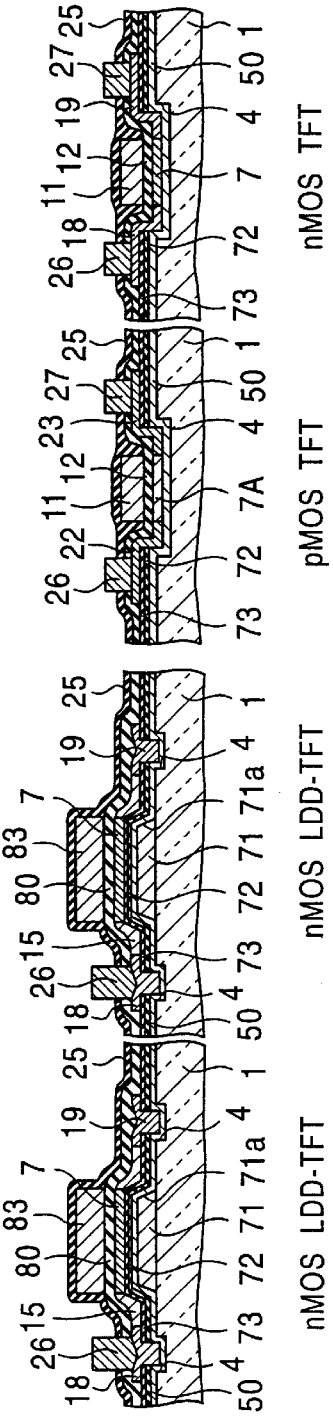
FIG. 30A STEP 11
FIG. 30B STEP 12
FIG. 30C STEP 13

FIG. 36
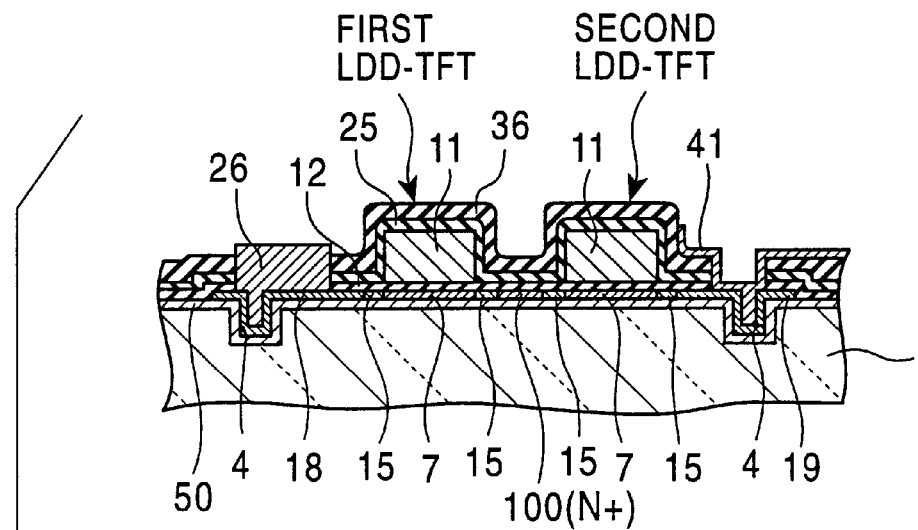
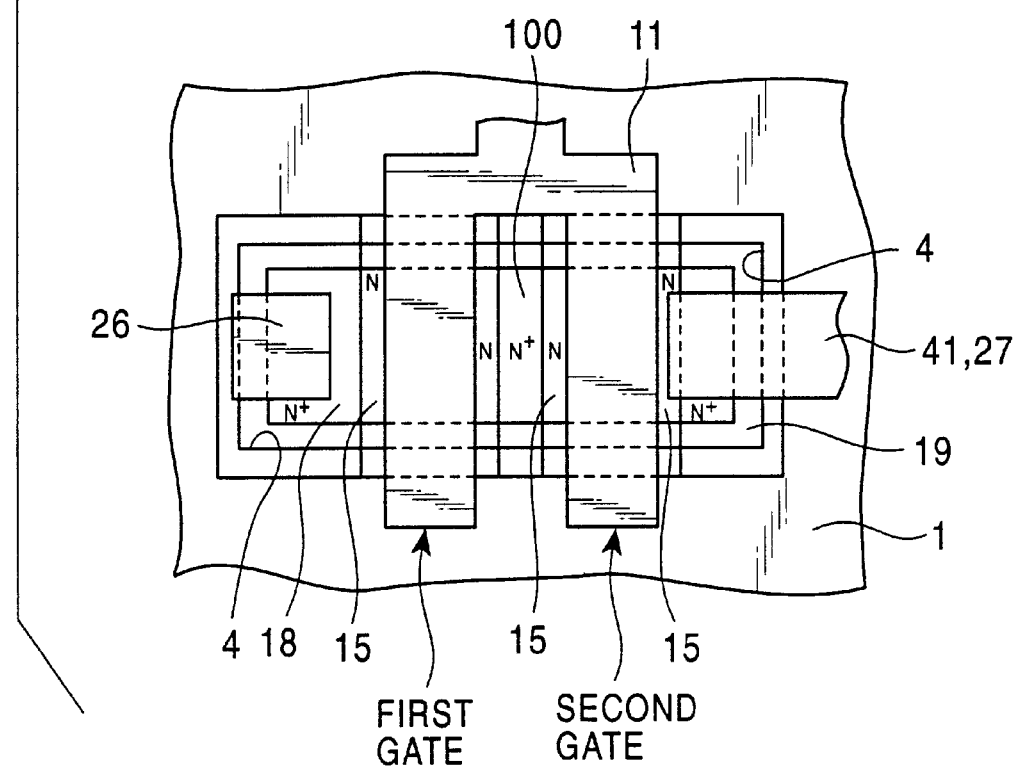

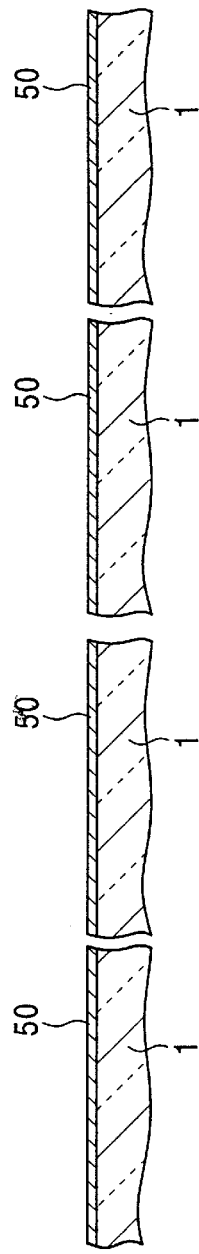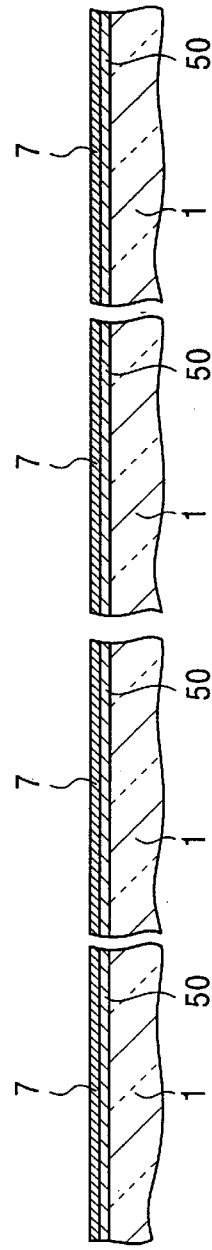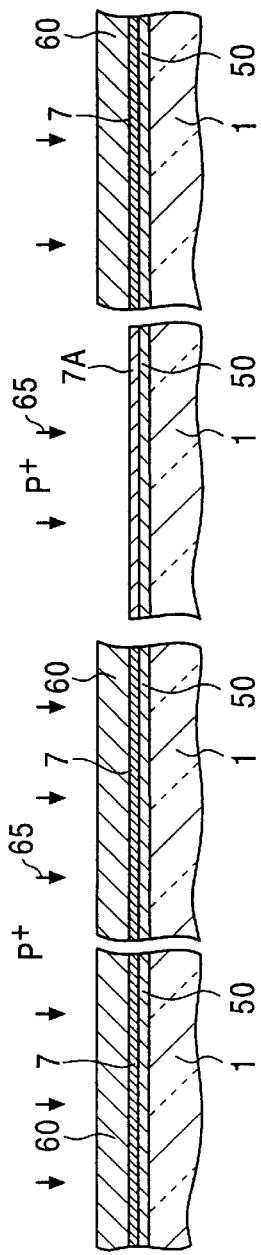
FIG. 40A STEP 1
FIG. 40B STEP 2
FIG. 40C STEP 3

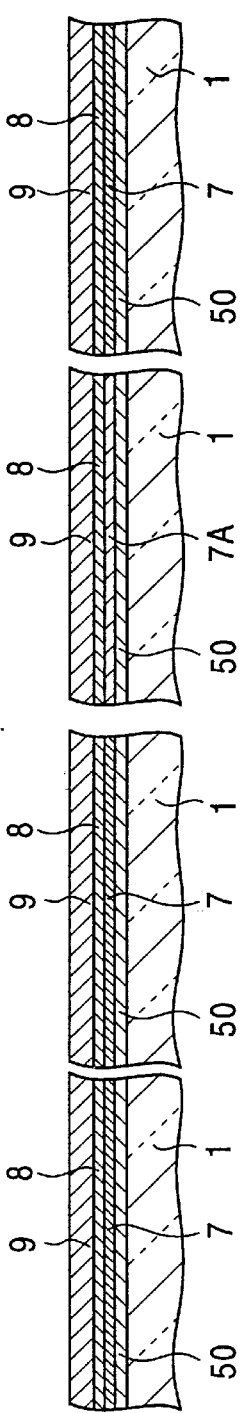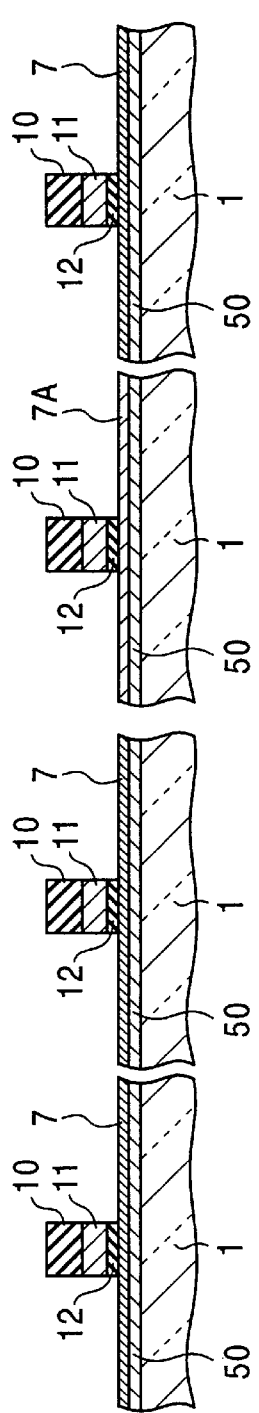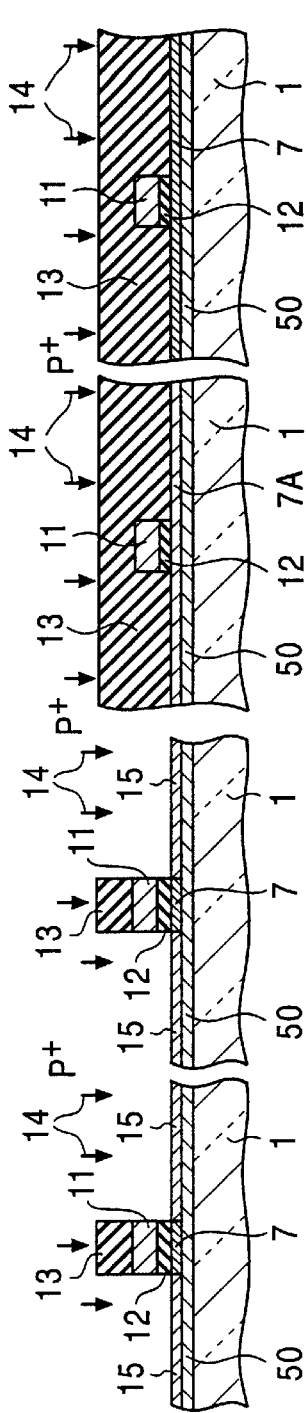
FIG. 41A STEP 4   FIG. 41B STEP 5   FIG. 41C STEP 6

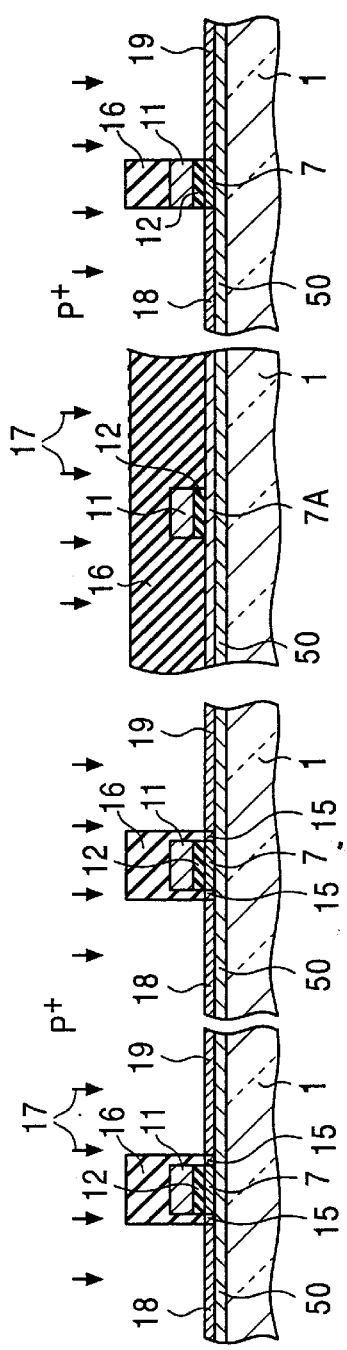
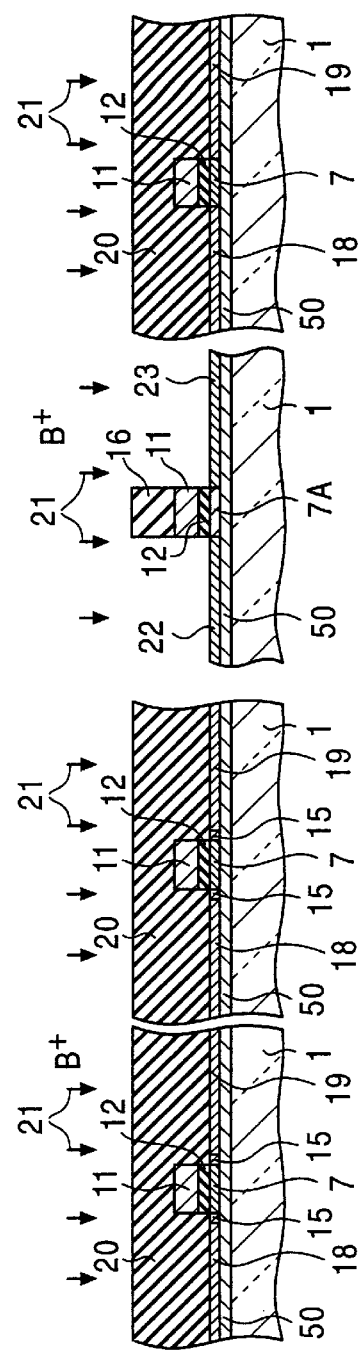
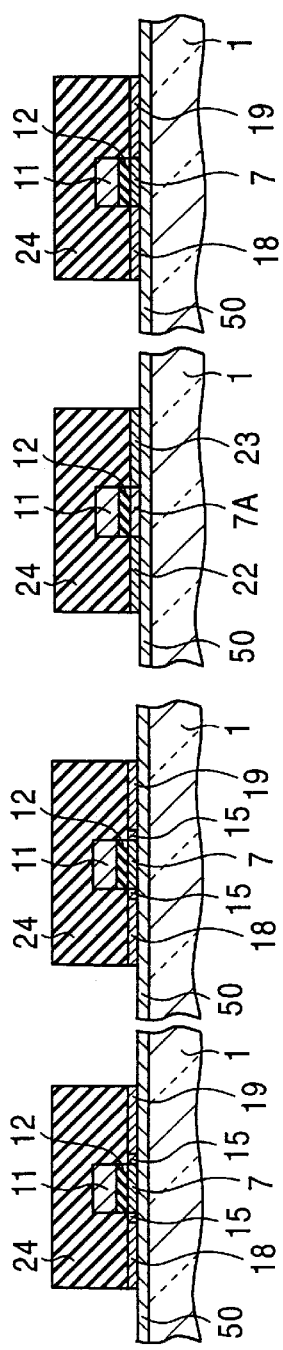
FIG. 42A STEP 7
FIG. 42B STEP 8
FIG. 42C STEP 9

STEP 10

STEP 11

STEP 12

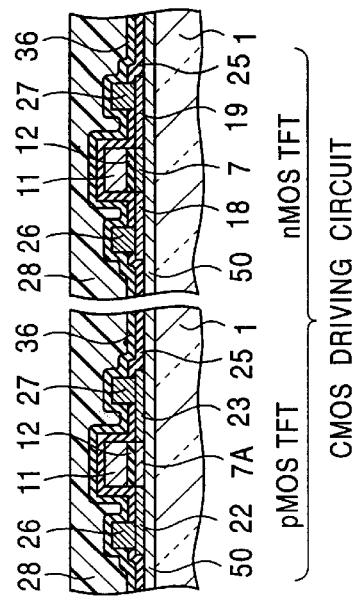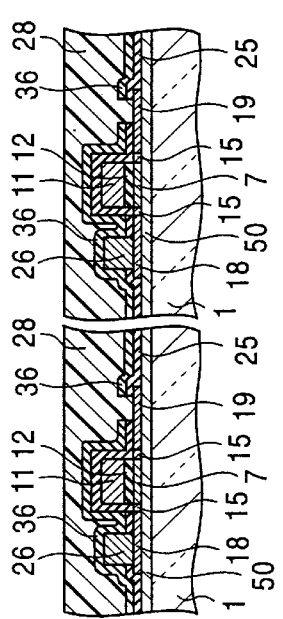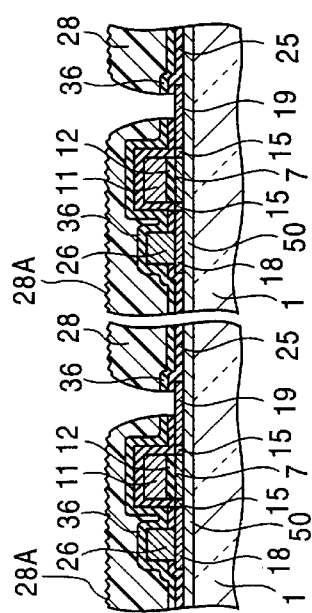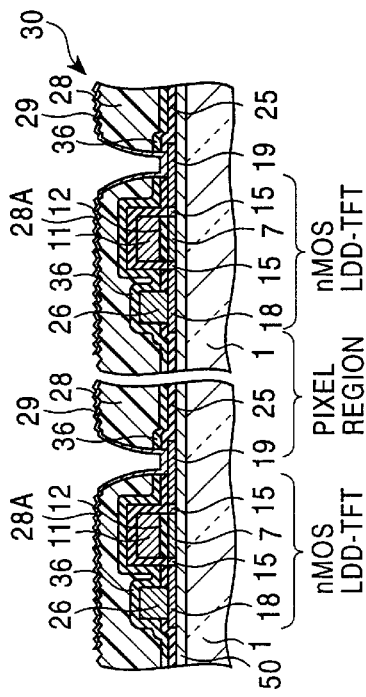
FIG. 44A STEP 13
FIG. 44B STEP 14
FIG. 44C STEP 15

STEP 13

STEP 14

STEP 15

STEP 12

STEP 13

STEP 14

STEP 15

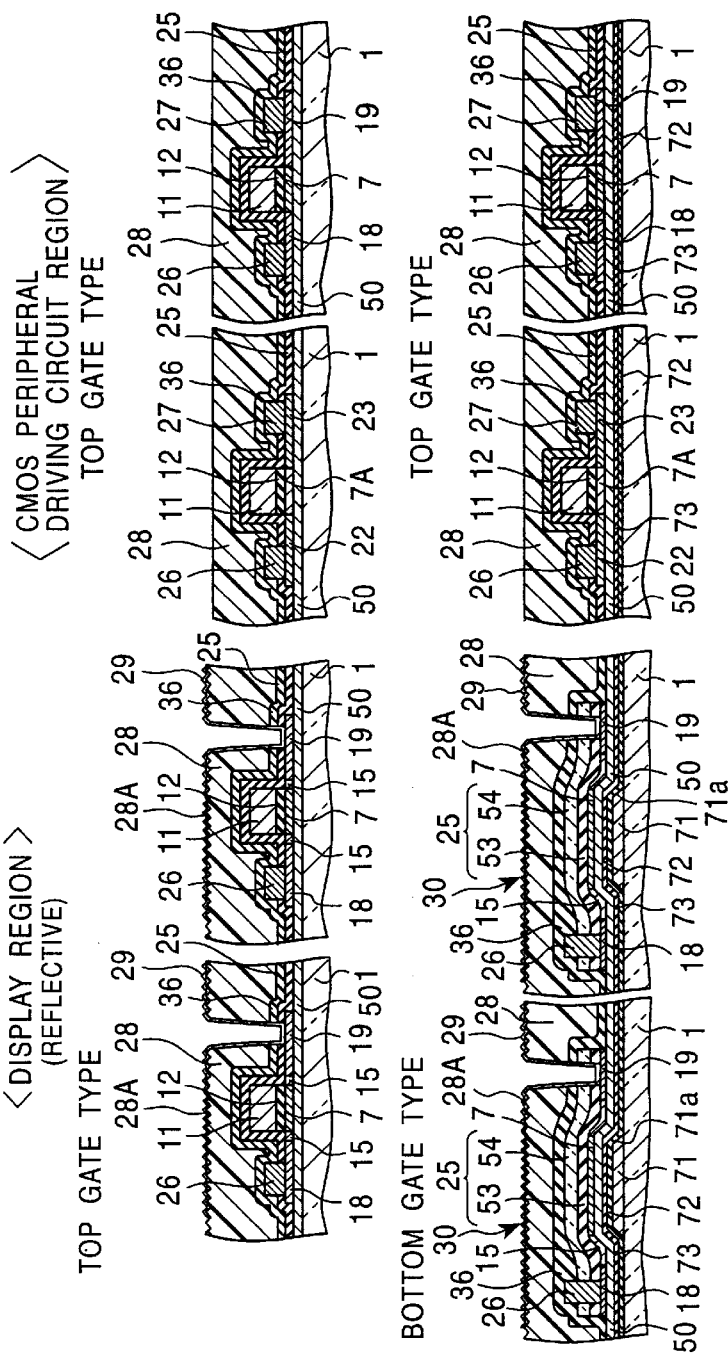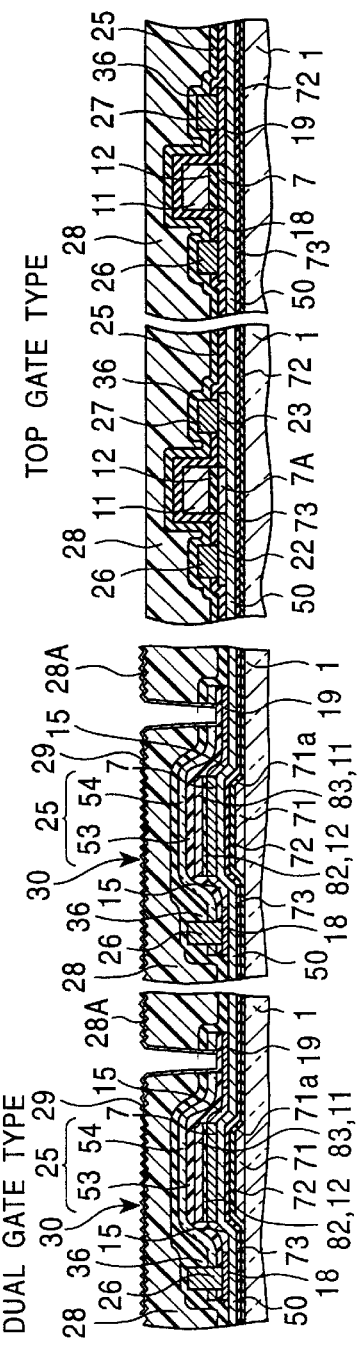
FIG. 49A
FIG. 49B
FIG. 49C

STEP 1

STEP 2

STEP 3

STEP 4

STEP 5

STEP 6

STEP 7

STEP 8

STEP 9

STEP 10

STEP 11

STEP 12

STEP 13

STEP 14

STEP 3

STEP 4

STEP 5

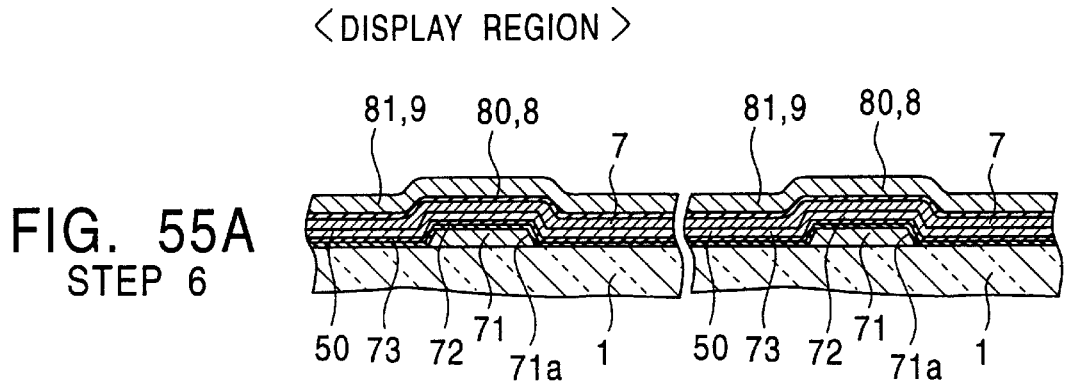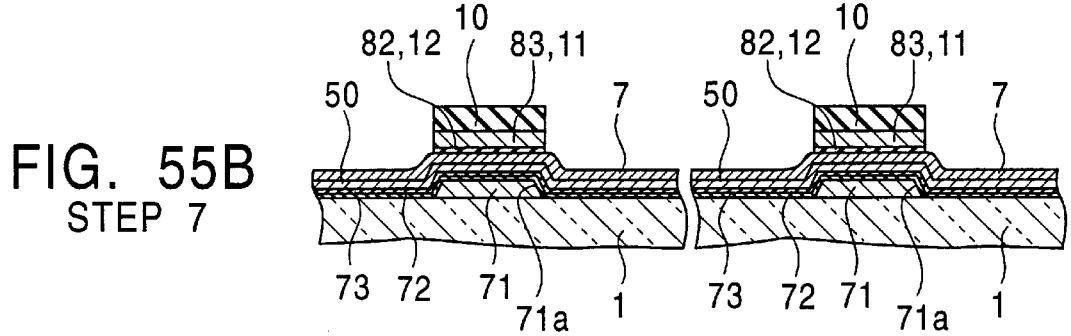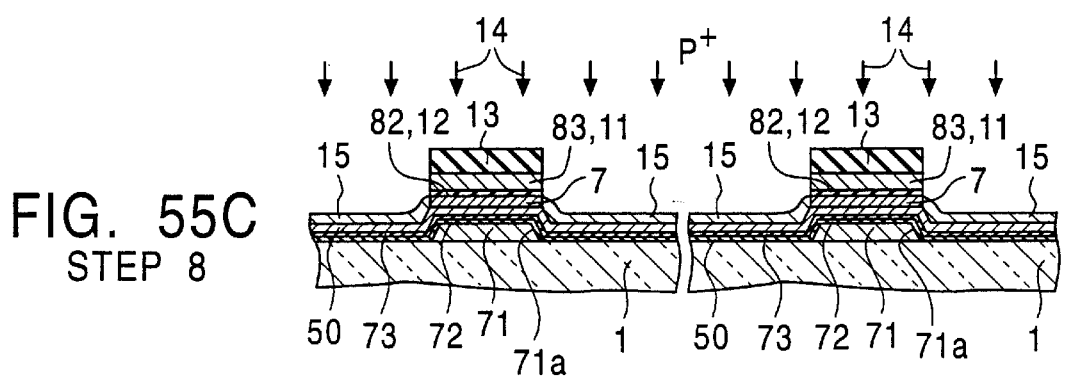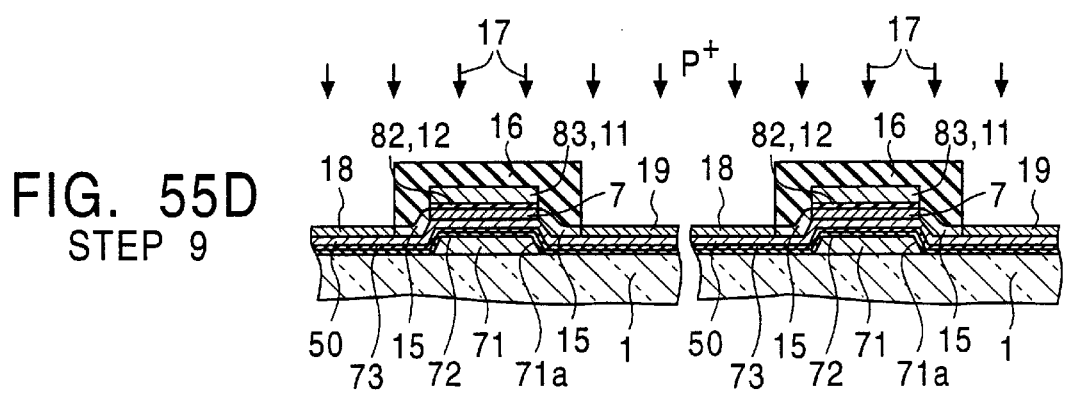

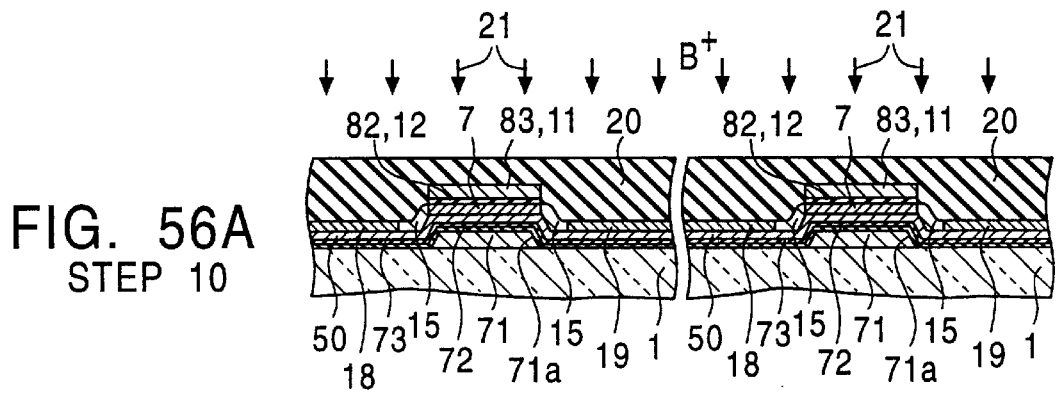
FIG. 56A STEP 10
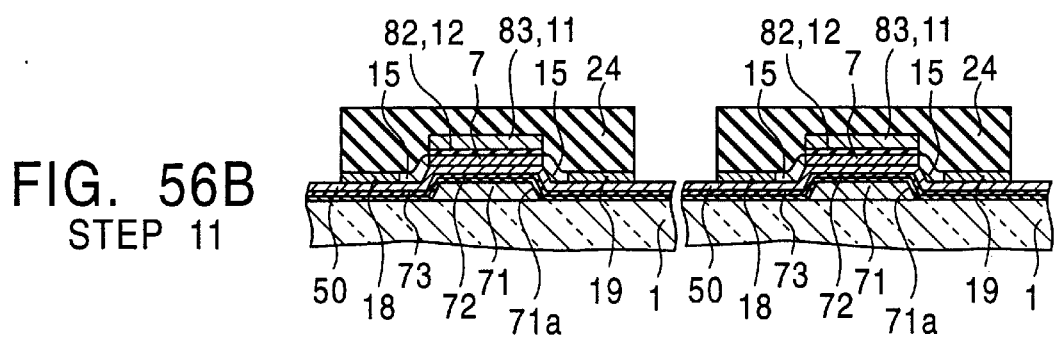
FIG. 56B STEP 11
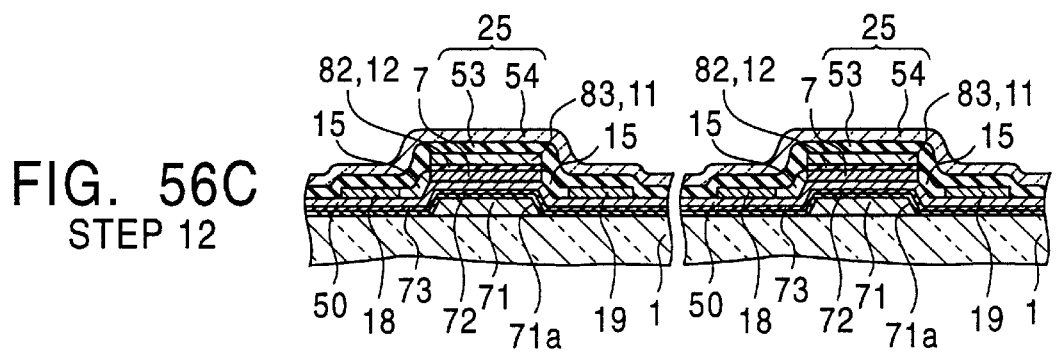
FIG. 56C STEP 12
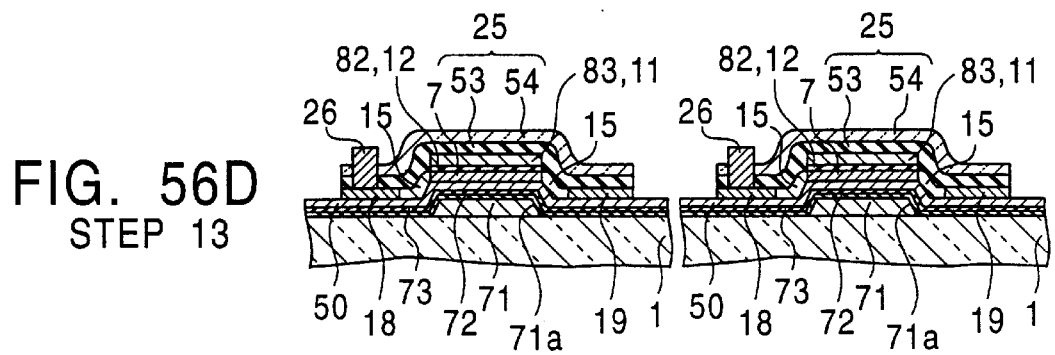
FIG. 56D STEP 13

STEP 14

STEP 15

STEP 16

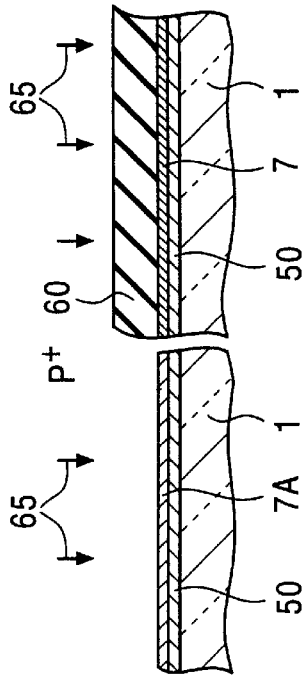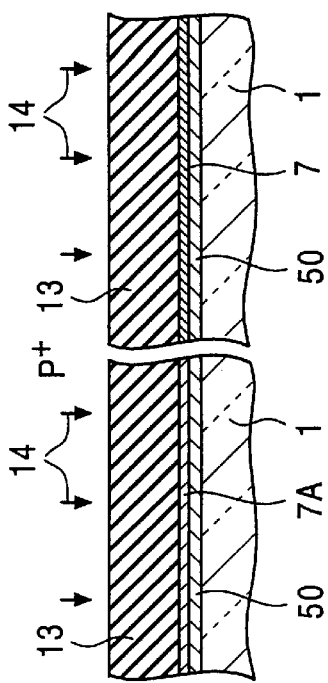
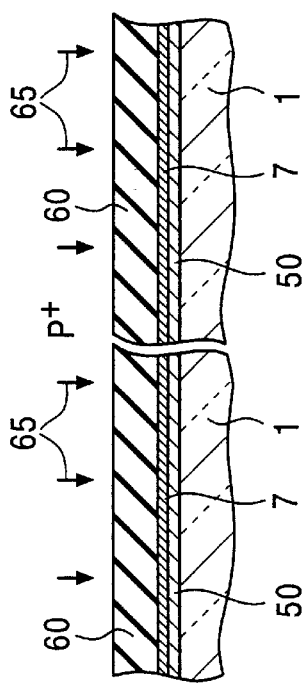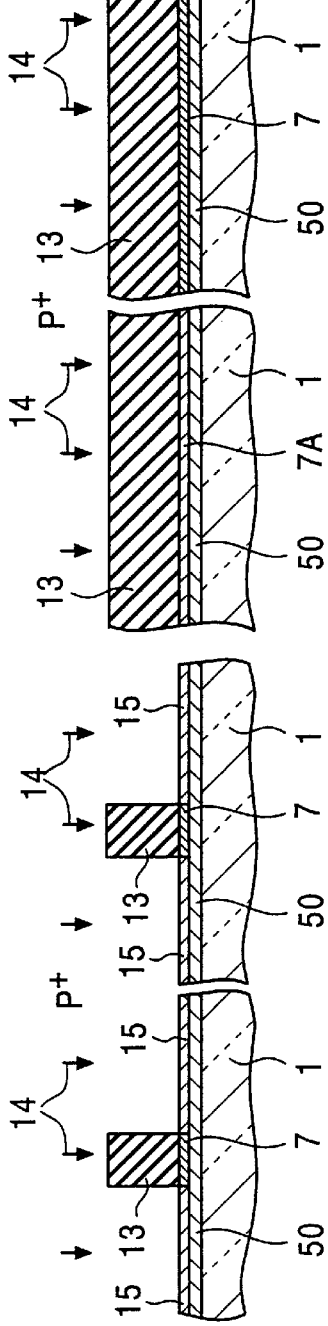
FIG. 58A STEP 3
FIG. 58B STEP 4

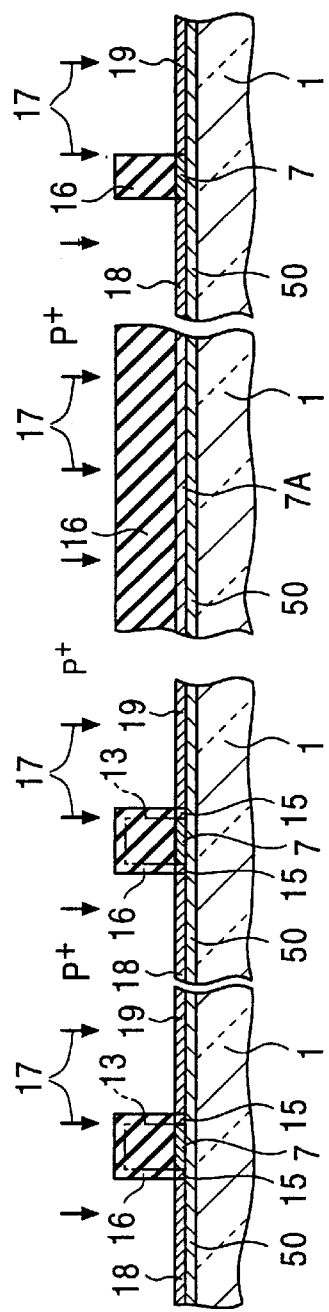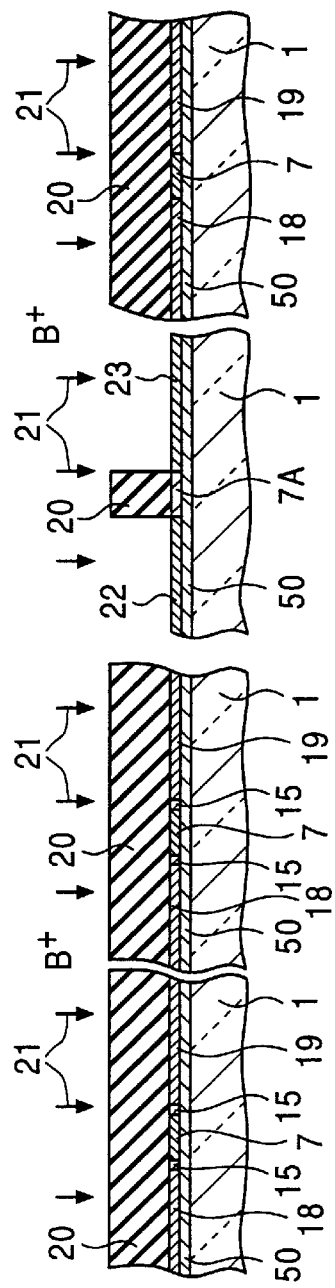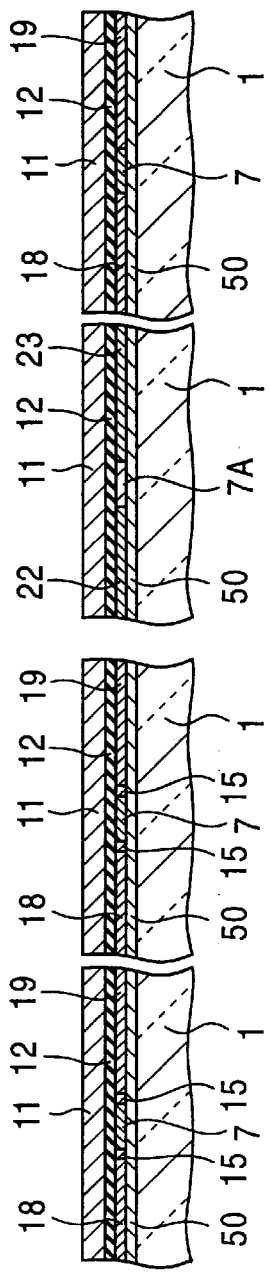
FIG. 59A STEP 5
FIG. 59B STEP 6
FIG. 59C STEP 7

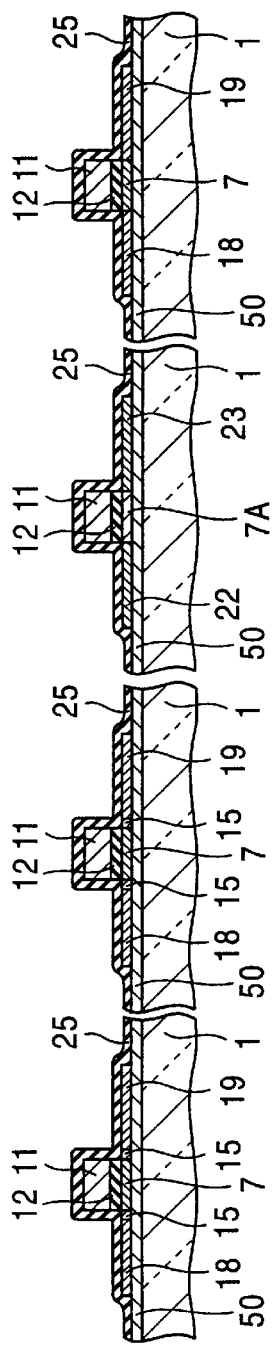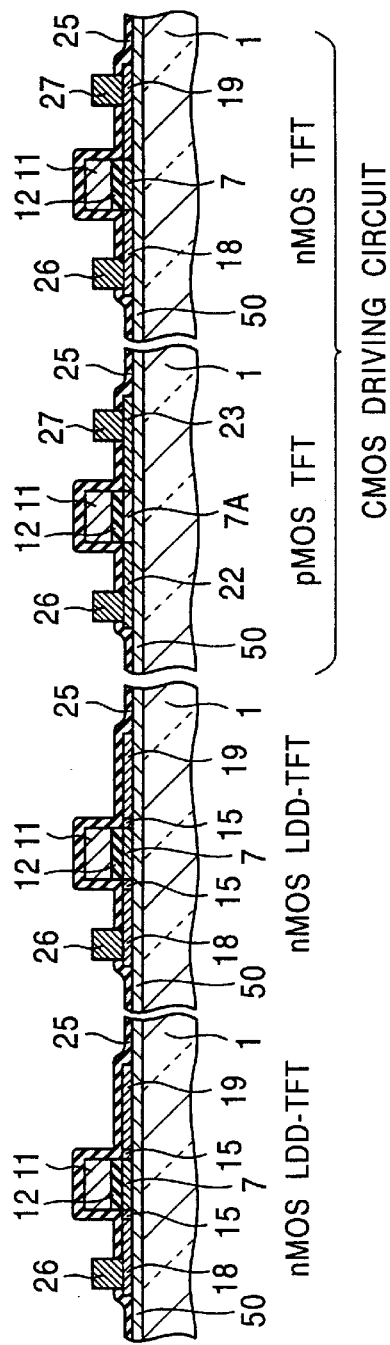
FIG. 60A STEP 8
FIG. 60B STEP 9

FIG. 61
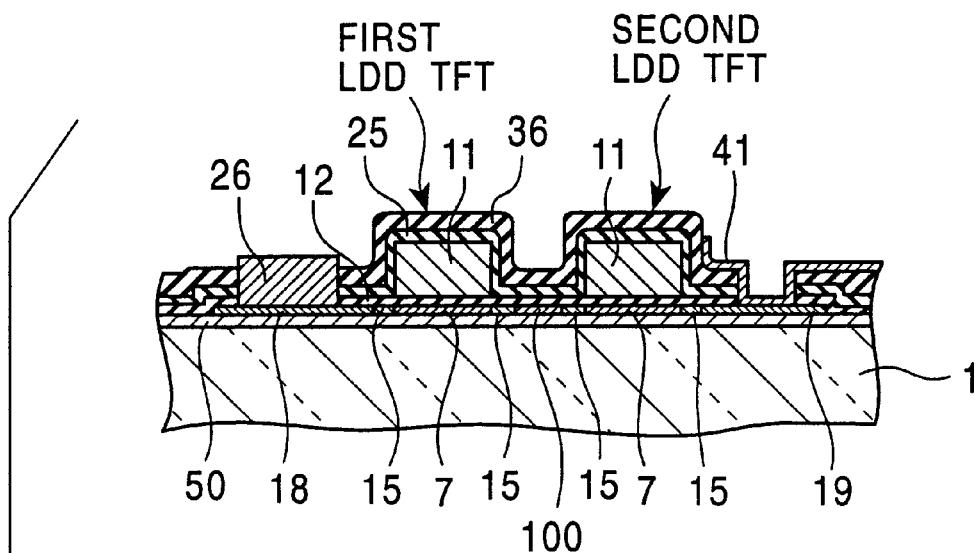
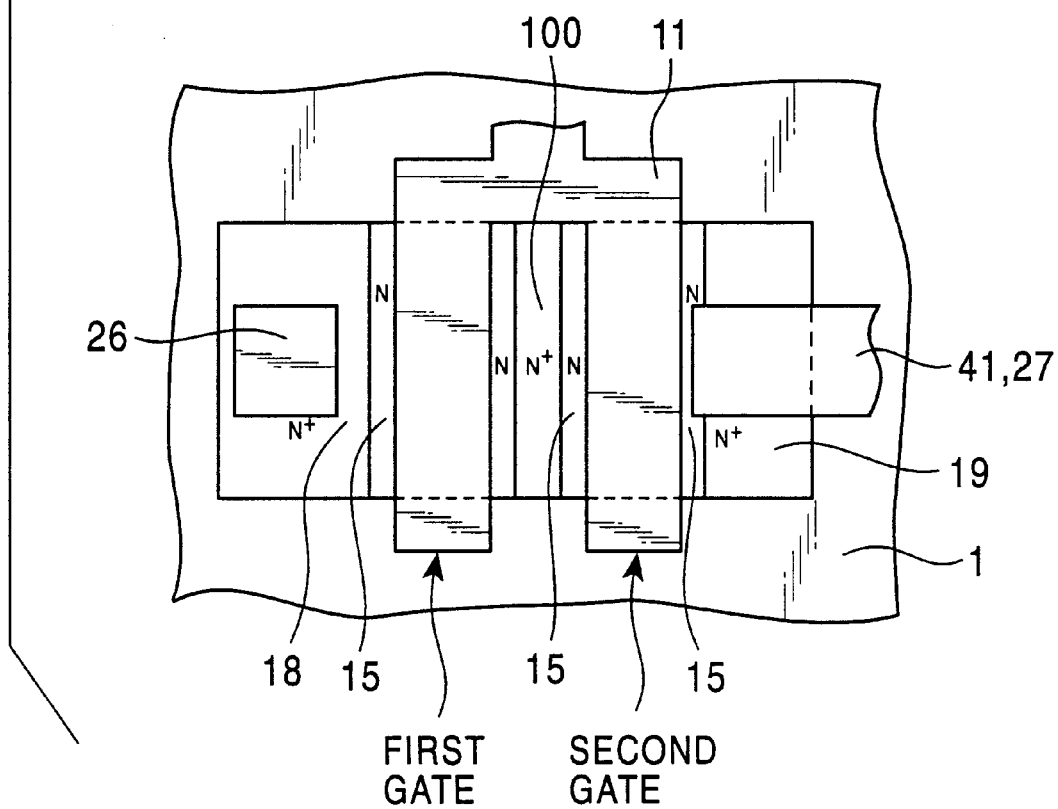

FIG. 63

| No. | PERIPHERAL DRIVING CIRCUIT REGION | DISPLAY REGION |
|---|---|---|
| 1 | TOP GATE TYPE | TOP GATE TYPE |
| 2 | TOP GATE TYPE | BOTTOM GATE TYPE |
| 3 | TOP GATE TYPE | DUAL GATE TYPE |
| 4 | TOP GATE TYPE + BOTTOM GATE TYPE | TOP GATE TYPE |
| 5 | TOP GATE TYPE + BOTTOM GATE TYPE | BOTTOM GATE TYPE |
| 6 | TOP GATE TYPE + BOTTOM GATE TYPE | DUAL GATE TYPE |
| 7 | TOP GATE TYPE + DUAL GATE TYPE | TOP GATE TYPE |
| 8 | TOP GATE TYPE + DUAL GATE TYPE | BOTTOM GATE TYPE |
| 9 | TOP GATE TYPE + DUAL GATE TYPE | DUAL GATE TYPE |
| 10 | TOP GATE TYPE + BOTTOM GATE TYPE + DUAL GATE TYPE | TOP GATE TYPE |
| 11 | TOP GATE TYPE + BOTTOM GATE TYPE + DUAL GATE TYPE | BOTTOM GATE TYPE |
| 12 | TOP GATE TYPE + BOTTOM GATE TYPE + DUAL GATE TYPE | DUAL GATE TYPE |

FIG. 64

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 1 | TOP GATE | p | TOP GATE | p |
| 2 | TOP GATE | p | TOP GATE | n |
| 3 | TOP GATE | n | TOP GATE | n |
| 4 | TOP GATE | n | TOP GATE | p |
| 5 | TOP GATE | c | TOP GATE | p |
| 6 | TOP GATE | c | TOP GATE | n |
| 7 | TOP GATE | c | TOP GATE | c |
| 8 | TOP GATE | p | TOP GATE | c |
| 9 | TOP GATE | n | TOP GATE | c |
| 10 | TOP GATE | p | BOTTOM GATE | p |
| 11 | TOP GATE | p | BOTTOM GATE | n |
| 12 | TOP GATE | n | BOTTOM GATE | n |
| 13 | TOP GATE | n | BOTTOM GATE | p |
| 14 | TOP GATE | c | BOTTOM GATE | p |
| 15 | TOP GATE | c | BOTTOM GATE | n |
| 16 | TOP GATE | c | BOTTOM GATE | c |
| 17 | TOP GATE | p | BOTTOM GATE | c |
| 18 | TOP GATE | n | BOTTOM GATE | c |
| 19 | TOP GATE | p | DUAL GATE | p |
| 20 | TOP GATE | p | DUAL GATE | n |
| 21 | TOP GATE | n | DUAL GATE | n |
| 22 | TOP GATE | n | DUAL GATE | p |
| 23 | TOP GATE | c | DUAL GATE | p |
| 24 | TOP GATE | c | DUAL GATE | n |
| 25 | TOP GATE | c | DUAL GATE | c |
| 26 | TOP GATE | p | DUAL GATE | c |
| 27 | TOP GATE | n | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 65

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 28 | TOP GATE | c + n | TOP GATE | p |
| 29 | TOP GATE | c + n | TOP GATE | n |
| 30 | TOP GATE | c + n | TOP GATE | c |
| 31 | TOP GATE | c + p | TOP GATE | p |
| 32 | TOP GATE | c + p | TOP GATE | n |
| 33 | TOP GATE | c + p | TOP GATE | c |
| 34 | TOP GATE | c + n + p | TOP GATE | p |
| 35 | TOP GATE | c + n + p | TOP GATE | n |
| 36 | TOP GATE | c + n + p | TOP GATE | c |
| 37 | TOP GATE | c + n | BOTTOM GATE | p |
| 38 | TOP GATE | c + n | BOTTOM GATE | n |
| 39 | TOP GATE | c + n | BOTTOM GATE | c |
| 40 | TOP GATE | c + p | BOTTOM GATE | p |
| 41 | TOP GATE | c + p | BOTTOM GATE | n |
| 42 | TOP GATE | c + p | BOTTOM GATE | c |
| 43 | TOP GATE | c + n + p | BOTTOM GATE | p |
| 44 | TOP GATE | c + n + p | BOTTOM GATE | n |
| 45 | TOP GATE | c + n + p | BOTTOM GATE | c |
| 46 | TOP GATE | c + n | DUAL GATE | p |
| 47 | TOP GATE | c + n | DUAL GATE | n |
| 48 | TOP GATE | c + n | DUAL GATE | c |
| 49 | TOP GATE | c + p | DUAL GATE | p |
| 50 | TOP GATE | c + p | DUAL GATE | n |
| 51 | TOP GATE | c + p | DUAL GATE | c |
| 52 | TOP GATE | c + n + p | DUAL GATE | p |
| 53 | TOP GATE | c + n + p | DUAL GATE | n |
| 54 | TOP GATE | c + n + p | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 66

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 55 | TOP GATE | p | TOP GATE | p |
| 56 | TOP GATE | p | TOP GATE | n |
| 57 | TOP GATE | n | TOP GATE | n |
| 58 | TOP GATE | n | TOP GATE | p |
| 59 | TOP GATE | c | TOP GATE | p |
| 60 | TOP GATE | c | TOP GATE | n |
| 61 | TOP GATE | c | TOP GATE | c |
| 62 | TOP GATE | p | TOP GATE | c |
| 63 | TOP GATE | n | TOP GATE | c |
| 64 | TOP GATE | p | BOTTOM GATE | p |
| 65 | TOP GATE | p | BOTTOM GATE | n |
| 66 | TOP GATE | n | BOTTOM GATE | n |
| 67 | TOP GATE | n | BOTTOM GATE | p |
| 68 | TOP GATE | c | BOTTOM GATE | p |
| 69 | TOP GATE | c | BOTTOM GATE | n |
| 70 | TOP GATE | c | BOTTOM GATE | c |
| 71 | TOP GATE | p | BOTTOM GATE | c |
| 72 | TOP GATE | n | BOTTOM GATE | c |
| 73 | TOP GATE | p | DUAL GATE | p |
| 74 | TOP GATE | p | DUAL GATE | n |
| 75 | TOP GATE | n | DUAL GATE | n |
| 76 | TOP GATE | n | DUAL GATE | p |
| 77 | TOP GATE | c | DUAL GATE | p |
| 78 | TOP GATE | c | DUAL GATE | n |
| 79 | TOP GATE | c | DUAL GATE | c |
| 80 | TOP GATE | p | DUAL GATE | c |
| 81 | TOP GATE | n | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 67

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 82 | TOP GATE | c + n | TOP GATE | p |
| 83 | TOP GATE | c + n | TOP GATE | n |
| 84 | TOP GATE | c + n | TOP GATE | c |
| 85 | TOP GATE | c + p | TOP GATE | p |
| 86 | TOP GATE | c + p | TOP GATE | n |
| 87 | TOP GATE | c + p | TOP GATE | c |
| 88 | TOP GATE | c + n + p | TOP GATE | p |
| 89 | TOP GATE | c + n + p | TOP GATE | n |
| 90 | TOP GATE | c + n + p | TOP GATE | c |
| 91 | TOP GATE | c + n | BOTTOM GATE | p |
| 92 | TOP GATE | c + n | BOTTOM GATE | n |
| 93 | TOP GATE | c + n | BOTTOM GATE | c |
| 94 | TOP GATE | c + p | BOTTOM GATE | p |
| 95 | TOP GATE | c + p | BOTTOM GATE | n |
| 96 | TOP GATE | c + p | BOTTOM GATE | c |
| 97 | TOP GATE | c + n + p | BOTTOM GATE | p |
| 98 | TOP GATE | c + n + p | BOTTOM GATE | n |
| 99 | TOP GATE | c + n + p | BOTTOM GATE | c |
| 100 | TOP GATE | c + n | DUAL GATE | p |
| 101 | TOP GATE | c + n | DUAL GATE | n |
| 102 | TOP GATE | c + n | DUAL GATE | c |
| 103 | TOP GATE | c + p | DUAL GATE | p |
| 104 | TOP GATE | c + p | DUAL GATE | n |
| 105 | TOP GATE | c + p | DUAL GATE | c |
| 106 | TOP GATE | c + n + p | DUAL GATE | p |
| 107 | TOP GATE | c + n + p | DUAL GATE | n |
| 108 | TOP GATE | c + n + p | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 68

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 109 | TOP GATE | p | TOP GATE | p |
| 110 | TOP GATE | p | TOP GATE | n |
| 111 | TOP GATE | n | TOP GATE | n |
| 112 | TOP GATE | n | TOP GATE | p |
| 113 | TOP GATE | c | TOP GATE | p |
| 114 | TOP GATE | c | TOP GATE | n |
| 115 | TOP GATE | c | TOP GATE | c |
| 116 | TOP GATE | p | TOP GATE | c |
| 117 | TOP GATE | n | TOP GATE | c |
| 118 | TOP GATE | p | BOTTOM GATE | p |
| 119 | TOP GATE | p | BOTTOM GATE | n |
| 120 | TOP GATE | n | BOTTOM GATE | n |
| 121 | TOP GATE | n | BOTTOM GATE | p |
| 122 | TOP GATE | c | BOTTOM GATE | p |
| 123 | TOP GATE | c | BOTTOM GATE | n |
| 124 | TOP GATE | c | BOTTOM GATE | c |
| 125 | TOP GATE | p | BOTTOM GATE | c |
| 126 | TOP GATE | n | BOTTOM GATE | c |
| 127 | TOP GATE | p | DUAL GATE | p |
| 128 | TOP GATE | p | DUAL GATE | n |
| 129 | TOP GATE | n | DUAL GATE | n |
| 130 | TOP GATE | n | DUAL GATE | p |
| 131 | TOP GATE | c | DUAL GATE | p |
| 132 | TOP GATE | c | DUAL GATE | n |
| 133 | TOP GATE | c | DUAL GATE | c |
| 134 | TOP GATE | p | DUAL GATE | c |
| 135 | TOP GATE | n | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 69

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 136 | TOP GATE | c + n | TOP GATE | p |
| 137 | TOP GATE | c + n | TOP GATE | n |
| 138 | TOP GATE | c + n | TOP GATE | c |
| 139 | TOP GATE | c + p | TOP GATE | p |
| 140 | TOP GATE | c + p | TOP GATE | n |
| 141 | TOP GATE | c + p | TOP GATE | c |
| 142 | TOP GATE | c + n + p | TOP GATE | p |
| 143 | TOP GATE | c + n + p | TOP GATE | n |
| 144 | TOP GATE | c + n + p | TOP GATE | c |
| 145 | TOP GATE | c + n | BOTTOM GATE | p |
| 146 | TOP GATE | c + n | BOTTOM GATE | n |
| 147 | TOP GATE | c + n | BOTTOM GATE | c |
| 148 | TOP GATE | c + p | BOTTOM GATE | p |
| 149 | TOP GATE | c + p | BOTTOM GATE | n |
| 150 | TOP GATE | c + p | BOTTOM GATE | c |
| 151 | TOP GATE | c + n + p | BOTTOM GATE | p |
| 152 | TOP GATE | c + n + p | BOTTOM GATE | n |
| 153 | TOP GATE | c + n + p | BOTTOM GATE | c |
| 154 | TOP GATE | c + n | DUAL GATE | p |
| 155 | TOP GATE | c + n | DUAL GATE | n |
| 156 | TOP GATE | c + n | DUAL GATE | c |
| 157 | TOP GATE | c + p | DUAL GATE | p |
| 158 | TOP GATE | c + p | DUAL GATE | n |
| 159 | TOP GATE | c + p | DUAL GATE | c |
| 160 | TOP GATE | c + n + p | DUAL GATE | p |
| 161 | TOP GATE | c + n + p | DUAL GATE | n |
| 162 | TOP GATE | c + n + p | DUAL GATE | c | p : p-CHANNEL TYPE
n : n-CHANNEL TYPE
c : COMPLEMENTARY TYPE IN WHICH p-CHANNEL AND n-CHANNEL TYPES ARE COMBINED

FIG. 70

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 163 | TOP GATE | p | TOP GATE | p |
| 164 | TOP GATE | p | TOP GATE | n |
| 165 | TOP GATE | n | TOP GATE | n |
| 166 | TOP GATE | n | TOP GATE | p |
| 167 | TOP GATE | c | TOP GATE | p |
| 168 | TOP GATE | c | TOP GATE | n |
| 169 | TOP GATE | c | TOP GATE | c |
| 170 | TOP GATE | p | TOP GATE | c |
| 171 | TOP GATE | n | TOP GATE | c |
| 172 | TOP GATE | p | BOTTOM GATE | p |
| 173 | TOP GATE | p | BOTTOM GATE | n |
| 174 | TOP GATE | n | BOTTOM GATE | n |
| 175 | TOP GATE | n | BOTTOM GATE | p |
| 176 | TOP GATE | c | BOTTOM GATE | p |
| 177 | TOP GATE | c | BOTTOM GATE | n |
| 178 | TOP GATE | c | BOTTOM GATE | c |
| 179 | TOP GATE | p | BOTTOM GATE | c |
| 180 | TOP GATE | n | BOTTOM GATE | c |
| 181 | TOP GATE | p | DUAL GATE | p |
| 182 | TOP GATE | p | DUAL GATE | n |
| 183 | TOP GATE | n | DUAL GATE | n |
| 184 | TOP GATE | n | DUAL GATE | p |
| 185 | TOP GATE | c | DUAL GATE | p |
| 186 | TOP GATE | c | DUAL GATE | n |
| 187 | TOP GATE | c | DUAL GATE | c |
| 188 | TOP GATE | p | DUAL GATE | c |
| 189 | TOP GATE | n | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 71

| No. | TFT'S OF PERIPHERAL DRIVING CIRCUIT REGION | | TFT OF DISPLAY REGION | |
|---|---|---|---|---|
| | GATE STRUCTURE | CHANNEL CONDUCTION TYPE | GATE STRUCTURE | CHANNEL CONDUCTION TYPE |
| 190 | TOP GATE | c + n | TOP GATE | p |
| 191 | TOP GATE | c + n | TOP GATE | n |
| 192 | TOP GATE | c + n | TOP GATE | c |
| 193 | TOP GATE | c + p | TOP GATE | p |
| 194 | TOP GATE | c + p | TOP GATE | n |
| 195 | TOP GATE | c + p | TOP GATE | c |
| 196 | TOP GATE | c + n + p | TOP GATE | p |
| 197 | TOP GATE | c + n + p | TOP GATE | n |
| 198 | TOP GATE | c + n + p | TOP GATE | c |
| 199 | TOP GATE | c + n | BOTTOM GATE | p |
| 200 | TOP GATE | c + n | BOTTOM GATE | n |
| 201 | TOP GATE | c + n | BOTTOM GATE | c |
| 202 | TOP GATE | c + p | BOTTOM GATE | p |
| 203 | TOP GATE | c + p | BOTTOM GATE | n |
| 204 | TOP GATE | c + p | BOTTOM GATE | c |
| 205 | TOP GATE | c + n + p | BOTTOM GATE | p |
| 206 | TOP GATE | c + n + p | BOTTOM GATE | n |
| 207 | TOP GATE | c + n + p | BOTTOM GATE | c |
| 208 | TOP GATE | c + n | DUAL GATE | p |
| 209 | TOP GATE | c + n | DUAL GATE | n |
| 210 | TOP GATE | c + n | DUAL GATE | c |
| 211 | TOP GATE | c + p | DUAL GATE | p |
| 212 | TOP GATE | c + p | DUAL GATE | n |
| 213 | TOP GATE | c + p | DUAL GATE | c |
| 214 | TOP GATE | c + n + p | DUAL GATE | p |
| 215 | TOP GATE | c + n + p | DUAL GATE | n |
| 216 | TOP GATE | c + n + p | DUAL GATE | c | p : p-CHANNEL TYPE n : n-CHANNEL TYPE c : COMPLEMENTARY TYPE IN WHICH p-CHANNEL AND n-CHANNEL TYPES ARE COMBINED

FIG. 73

| CRYSTALLINITY OF MOSTFT | TYPE OF MOSTFT | |
| --- | --- | --- |
| | PERIPHERAL DRIVING CIRCUIT REGION | DISPLAY REGION |
| SINGLE CRYSTAL SILICON | cMOS OR n OR pMOS OR cMOS + pMOS + nMOS | n OR pMOS OR cMOS |
| POLY-CRYSTALLINE SILICON | cMOS OR n OR pMOS OR cMOS + pMOS + nMOS | n OR pMOS OR cMOS |
| AMORPHOUS SILICON | — | n OR pMOS OR cMOS |

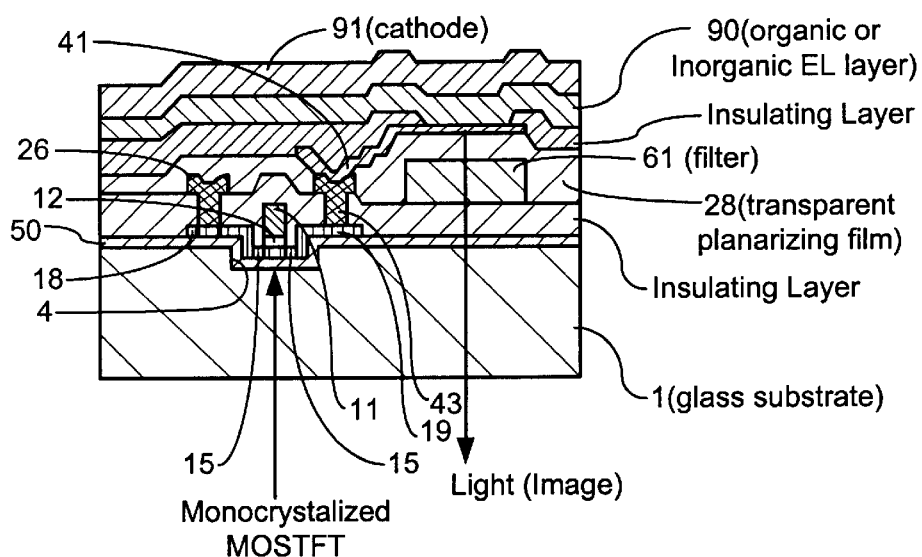
(A) Driving Active Matrix
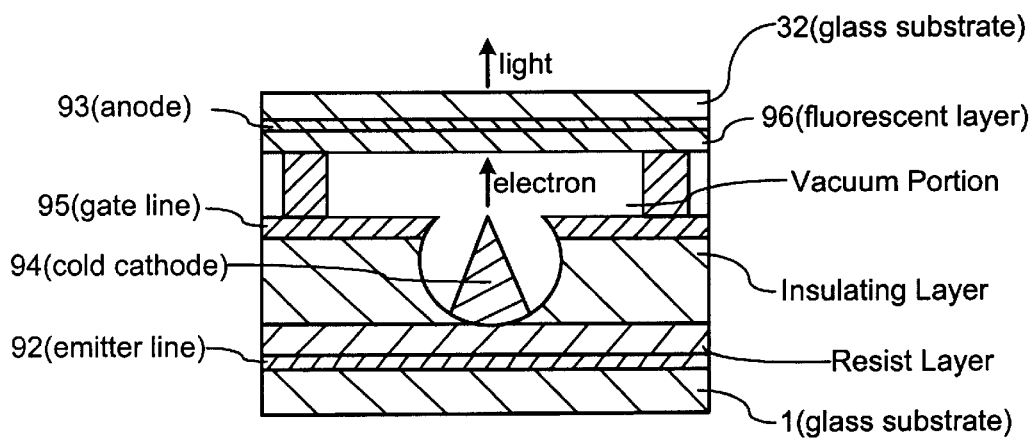
(B) Passive Matrix
FIG. 75

ELECTROOPTIC DEVICE, DRIVING SUBSTRATE FOR ELECTROOPTIC DEVICE, AND METHOD OF MANUFACTURING THE DEVICE AND SUBSTRATE

RELATED APPLICATION DATA

The present application claims priority to Japanese Application No. P10-231855 filed Aug. 18, 1998 and Japanese Application No. P10-255275 filed Sep. 9, 1998 which applications are incorporated herein by reference to the extent permitted by law.

BACKGROUND OF THE INVENTION

1. Field of the Invention

The present invention relates to an electrooptic device a driving substrate for an electrooptic device, and a method of manufacturing the electrooptic device and the substrate. Particularly, the present invention relates to a structure and method suitable for a liquid crystal display device or the like which comprises an active region comprising top gate type thin film insulating gate electric field effect transistors (referred to as "top gate type MOSTET" hereinafter, which includes a stagger type and a coplanar type) formed by using a single crystal silicon layer hetero-epitaxially grown on an insulation substrate, and a passive region.

2. Description of the Related Art

Known examples of active matrix type liquid crystal display devices include a device comprising a display region comprising amorphous silicon TFTs, and external driving circuit IC, a device comprising a display region comprising polycrystalline silicon TFTs, and driving circuits, which are integrated (Japanese Unexamined Patent Publication No. 6-242433), a-device comprising a display region comprising TFTs made of polycrystalline silicon formed by excimer laser annealing, and driving circuits, which are integrated (Japanese Unexamined Patent Publication No. 7-131030), and the like.

Although the above-described conventional amorphous silicon TFT has good productivity, p-channel MOSTFT (referred to as "pMOSTFT" hereinafter) cannot be formed because electron mobility is as low as about 0.5 to 1.0 $cm^2/v \cdot sec$. Therefore, the peripheral driving region using pMOSTFT and the display region cannot be formed on the same glass substrate, and thus driver IC is externally provided and is mounted by a TAB system or the like, causing difficulties in decreasing cost. This also causes a limit to an increase in definition. In addition, a sufficient on-current cannot be obtained because electron mobility is as low as about 0.5 to 1.0 $cm^2/v \cdot sec$, and the use of the amorphous silicon TFT for the display region inevitably increases the transistor size, causing disadvantages for increasing the aperture ratio of pixels.

The above-described conventional polycrystalline silicon TFT has an electron mobility of 70 to 100 $cm^2/v \cdot sec$, and can comply with the need to increase definition.

Therefore, LCD (liquid crystal display) comprising polycrystalline silicon TFTs integrated with driving circuits has recently attracted attention. However, in large LCD of 15 inches or more, the driving ability is insufficient because the electron mobility of polycrystalline silicon is 70 to 100 $cm^2/v \cdot sec$, thereby causing the need for an external driving circuit.

In TFT comprising polycrystalline silicon formed by a solid phase growth method, there is the need for forming gate $SiO_2$ by annealing at 600° C. or more for ten-odd hours, and thermal oxidation at about 1000° C., and thus a semiconductor producing apparatus must be used. Therefore, the wafer size is limited to 8 to 12 inches Ø, and expensive quarts glass having high heat resistance must be used, causing difficulties in decreasing cost. Application of this TFT is thus limited to EVF and data/AV projectors.

The above-described conventional polycrystalline silicon TFT formed by excimer laser annealing has problems of stability of excimer laser output, productivity, an increase in equipment cost due a size increase, deterioration in yield and quality, etc.

Particularly, in a 1-m square large glass substrate, the above problems become significant, and it is more difficult to improve performance and quality, and decrease the cost.

SUMMARY OF THE INVENTION

Accordingly, it is an object of the present invention to permit uniform deposition of a single crystal silicon thin film having high electron/hole mobility at a relatively low temperature to manufacture an active matrix substrate comprising a built-in high-performance driver, and an electrooptic device such as a thin film semiconductor device for display comprising the active matrix substrate, thereby permitting a structure in which a display region comprising n-channel MOSTFTs (referred tb as "nMOSTFTs" hereinafter) or pMOSTFTs having a LDD structure (lightly doped drain structure) having high switching properties and a low leak current, or complementary thin film insulation gate electric field effect transistors (referred to as "cMOSTFTs" hereinafter) having a high driving ability is integrated with peripheral driving circuits comprising cMOSTFT, nMOSTFT, pMOSTFT, or a mixture thereof. This can realize a display panel having high image quality, high definition, a narrow frame, high efficiency and a large screen, and permits the use of a large glass substrate having a relatively low strain point, and a decrease in cost due to high productivity and no need for an expensive manufacturing apparatus, as well as permitting a high-speed operation and a large screen due to the resistance decrease caused by the ease of threshold control The present invention provides an electrooptic device and a driving substrate therefor comprising a display region comprising pixel electrodes (for example, a plurality of pixel electrodes arranged in a matrix), and a peripheral driving circuit region arranged in the periphery of the display region, which are provided on a first substrate (i.e., a driving substrate), and a predetermined optical material such as a liquid crystal held between the first substrate and a second substrate (i.e., a counter substrate), wherein a material layer having good lattice matching with a single crystal semiconductor such as single crystal silicon or the like is formed on one side of the first substrate, a single crystal semiconductor layer such as a single crystal silicon layer is formed on the first substrate including the material layer so as to constitute at least active elements of the active and passive elements. In the present invention, of course, the single crystal semiconductor layer includes a single crystal silicon layer and a single crystal compound semiconductor layer. The active elements include a thin film transistor, and other elements such as a diode and the like, and the passive elements includes a resistor and the like. Thin film transistors as a typical example include a field effect transistor (FET) (including a MOS type and junction type, both of which can be used), and a bipolar transistor. However, the present invention can be applied to both types of transistors. The passive elements include a resistor, an inductor, capacitor, and the like. An example of the passive elements is a capacitor formed by sandwiching a highly dielectric film of silicon nitride (referred to as "SiN" hereinafter) or the like between single crystal silicon layers (electrodes).

The present invention also provides a method of manufacturing the electrooptic device and the driving substrate thereof, comprising the steps of forming a material layer having good lattice matching with a single crystal semiconductor such as single crystal silicon or the like on one side of the first substrate, hetero-epitaxially growing a single crystal silicon layer on the first substrate including the material layer by a catalytic CVD method or high-density plasma CVD method using the material as a seed, and forming at least the active elements of the active and the passive elements by predetermined processing of the single crystal semiconductor layer. For example, after the single crystal silicon layer is deposited, the single crystal silicon layer is subjected to predetermined processing to form channel regions, source regions and drain regions, and gate regions comprising a gate insulation film and a gate electrode are formed on the channel regions, and source and drain electrodes are further formed to form top gate type first thin film transistors (particularly, MOSTFTs) as active elements, which constitute at least a portion of the peripheral driving circuit region, or the passive elements such as a resistor, a capacitor, an inductor, etc. are formed.

In the present invention, a single crystal semiconductor thin film such as a single crystal silicon thin film is formed by hetero epitaxial growth by the catalytic CVD or high-density plasma CVD method using the material layer (e.g., a crystalline sapphire film) having good lattice matching with, particularly, single crystal silicon so that the thus-formed epitaxial growth layer is used for at least the active elements of the active elements such as top gate type MOSTFTs of peripheral driving circuits of a driving substrate such as an active matrix substrate, top gate type MOSTFTs of peripheral driving circuits of an electrooptic device such as display region-peripheral driving circuit region-integrated LCD or the like, and the passive elements such as a resistor, an inductor, a capacitor, and the like. Therefore, the following significant effects (A) to (G) can be obtained.

(A) Since the material layer (for example, a crystalline sapphire film) having good lattice matching with single crystal silicon is formed on the substrate, and used as a seed for hetero epitaxial growth to form a single crystal semiconductor layer such as a single crystal silicon thin film having a high electron mobility of 540 $cm^2/v \cdot sec$, an electrooptic device such as a thin film semiconductor device for display comprising a built-in high-performance driver can be manufactured.

(B) Particularly, the single crystal silicon thin film exhibits high electron and hole mobility equivalent to a single crystal silicon substrate, as compared with conventional amorphous silicon thin film and polycrystalline silicon thin film. Therefore, single crystal silicon top gate type MOSTFT permits a structure in which the display region comprising nMOS, pMOSTFT or cMOSTFT having high switching properties [preferably further having the LDD (lightly doped drain) structure which relieves an electric field to decrease a leak current], and the peripheral driving circuit region comprising cMOS, nMOS or pMOSTFT having high driving ability, or a mixture thereof are integrated, realizing a display panel having high image quality, high definition, a narrow frame, high efficiency, and a large screen. Particularly, polycrystalline silicon is difficult to form pMOSTFT having high hole mobility as TFT for LCD. However, the single crystal silicon thin film of the present invention exhibits sufficiently high mobility of holes, and thus permits the manufacture of a peripheral driving circuit driven by electrons or holes, or combination of electrons and holes. The peripheral driving circuit can be integrated with TFTs of the display region having LDD structure nMOS, pMOS or CMOS to realize a panel. In panels ranging from small to medium size panels, one of a pair of vertical driving circuits in the periphery can be omitted.

(C) Since the single crystal semiconductor layer such as a single crystal silicon layer can be formed on the material layer by a low-temperature deposition technique such as the catalytic CVD (chemical vapor growth using a catalyst: substrate temperature 200 to 800° C., particularly 300 to 400° C.) or the like using the material layer as a seed for hetero epitaxial growth, a single crystal silicon film can be uniformly formed on the substrate at low temperature. Therefore, it is possible to use a substrate easily obtained and having low cost and good physical properties, such as a glass substrate having a relatively low strain point, a heat-resistant organic substrate, or the like. It is also possible to increase the size of the substrate.

(D) Unlike the solid growth method, annealing at medium temperature for a long time (about 600° C., ten-odd hours), and excimer laser annealing are unnecessary, thereby causing high productivity and no need for an expensive manufacturing apparatus. This permits cost reduction.

(E) In the hetero epitaxial growth, a wide range of P-type or N-type conduction single crystal silicon thin films with high mobility can easily be obtained by controlling the crystallinity of the material layer of crystalline sapphire or the like, the gas composition ratio of catalytic CVD, the heating temperature of the substrate, the cooling rate, etc., thereby permitting easy control of Vth (threshold value), and a high-speed operation due to a decrease in resistance.

(F) In deposition of single crystal silicon by catalytic CVD or the like, doping with an appropriate amount of III-group or V-group impurity element (boron, phosphorus, antimony, arsenic, bismuth, aluminum, or the like) can be separately carried out by using a doping gas to appropriately control the type and/or concentration of the impurity of the single crystal silicon thin film formed by hetero epitaxial growth, i.e., the conduction type such as P type or N type, and/or the carrier concentration.

(G) Since the material layer such as a crystalline sapphire thin film or the like functions as a diffusion barrier for various atoms, it is possible to suppress impurity diffusion from the glass substrate.

BRIEF DESCRIPTION OF THE DRAWINGS

FIG. 1 is a sectional view showing the steps of a LCD (liquid crystal display) manufacturing process in accordance with a first embodiment of the present invention;

FIG. 2 is a sectional view showing the steps of the same LCD manufacturing process;

FIG. 3 is a sectional view showing the steps of the same LCD manufacturing process;

FIG. 4 is a sectional view showing the steps of the same LCD manufacturing process;

FIG. 12 is a drawing showing the schematic configuration of the same LCD;

FIG. 19 is a sectional view showing the steps of the LCD manufacturing process;

FIG. 20 is a sectional view showing the steps of the LCD manufacturing process;

FIG. 25 is a sectional view showing the steps of a LCD manufacturing process in accordance with a fourth embodiment of the present invention;

FIG. 26 is a sectional view showing the steps of the LCD manufacturing process;

FIG. 27 is a sectional view showing the steps of the LCD manufacturing process;

FIG. 28 is a sectional view showing the steps of the LCD manufacturing process;

FIG. 29 is a sectional view showing the steps of the LCD manufacturing process;

FIG. 30 is a sectional view showing the steps of the LCD manufacturing process;

FIG. 36 is a sectional view or plan view showing a principal portion of LCD in accordance with a sixth embodiment of the present invention;

FIG. 40 is a sectional view showing the steps of a LCD manufacturing process in accordance with an eighth embodiment of the present invention;

FIG. 41 is a sectional view showing the steps of the same LCD manufacturing process;

FIG. 42 is a sectional view showing the steps of the same LCD manufacturing process;

FIG. 44 is a sectional view showing the steps of the same LCD manufacturing process;

FIG. 49 is a sectional view showing a principal of LCD in accordance with a tenth embodiment of the present invention;

FIG. 55 is a sectional view showing the steps of the same LCD manufacturing process;

FIG. 56 is a sectional view showing the steps of the same LCD manufacturing process;

FIG. 58 is a sectional view showing the steps of a LCD manufacturing process in accordance with an eleventh embodiment of the present invention;

FIG. 59 is a sectional view showing the steps of the same LCD manufacturing process;

FIG. 60 is a sectional view showing the steps of the same LCD manufacturing process;

FIG. 61 is a sectional view or plan view showing a principal portion of LCD in accordance with a twelfth embodiment of the present invention;

FIG. 63 is a table showing combinations of TFTs of LCD in accordance with a thirteenth embodiment of the present invention;

FIG. 64 is a table showing combinations of TFTs of the same LCD;

FIG. 65 is a table showing combinations of TFTs of the same LCD;

FIG. 66 is a table showing combinations of TFTs of the same LCD;

FIG. 67 is a table showing combinations of TFTs of the same LCD;

FIG. 68 is a table showing combinations of TFTs of the same LCD;

FIG. 69 is a table showing combinations of TFTs of the same LCD;

FIG. 70 is a table showing combinations of TFTs of the same LCD;

FIG. 71 is a table showing combinations of TFTs of the same LCD;

FIG. 73 is a table showing combinations of TFTs of the same LCD;

FIG. 75 is a sectional view showing principal portions of EL and FED in accordance with a sixteenth embodiment of the present invention.

DESCRIPTION OF THE PREFERRED EMBODIMENT

Figure 5A:
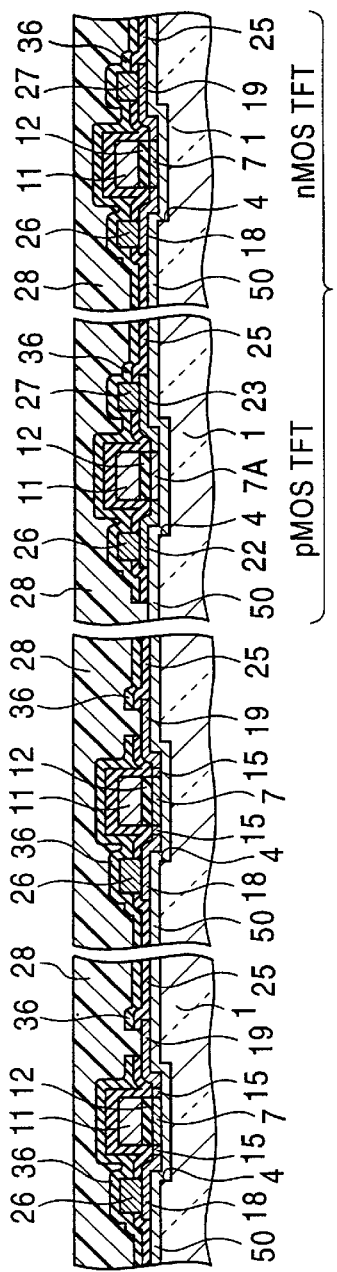
FIG. 5 is a sectional view showing the steps of the same LCD manufacturing process.

In the present invention, a single crystal silicon layer is subjected to predetermined processing to form channel regions, source regions and drain regions, and gate portions are formed on the channel regions to form top gate-type first thin film transistors which constitute at least a portion of the peripheral driving circuit region.

An insulating substrate is preferably used as a first substrate, and a material layer is preferably formed by using a material selected from the group consisting of sapphire ($Al_2O_3$), spinel structures (for example, $MgO \cdot Al_2O_3$), calcium fluoride ($CaF_2$), strontium fluoride ($SrF_2$), barium fluoride ($BaF_2$), boron phosphide (BP), yttrium oxide (($Y_2O_3)_m$), zirconium oxide (($ZrO_2)_{1-m}$), and the like.

The single crystal silicon layer can be formed by the catalytic CVD method (substrate temperature of about 200 to 800° C.) using the material layer as a seed. The substrate can be heated by the method of uniformly heating the entire substrate using an electric furnace, a lamp, or the like, or the method of locally heating only a predetermined portion using a light beam, an electron beam, or the like.

In the formation of the single crystal silicon layer by the catalytic CVD method, a gas containing silicon hydride as a main component is decomposed by contact with a catalyst heated to, for example, 800 to 2000° C. (less than the melting point) to deposit the single crystal silicon layer on the substrate.

In this case, as the silicon hydride, a silane gas such as monosilane, disilane, trisilane, tetrasilane, or the like is used. As the catalyst, at least one material selected from the group consisting of tungsten, tungsten containing thorium oxide, molybdenum, platinum, silicon, alumina, ceramics with a metal adhered thereto, and silicon carbide may be used.

In the present invention, as the substrate, an insulating substrate, particularly, a glass substrate having a low strain point or a heat-resistant organic substrate is used, thereby permitting the formation of the single crystal silicon layer on a large glass substrate (for example, 1 $m^2$ or more). Since the substrate temperature in catalytic CVD is low as described above, glass having a strain point of as low as 470 to 670° C. can be used as the glass substrate. Such a substrate is inexpensive, and can easily be thinned and formed in a long roll-shaped glass plate. Therefore, the single crystal silicon layer can be continuously or discontinuously formed on the long roll-shaped glass plate or heat-resistant organic substrate by the above-described hetero epitaxial growth method.

In the glass substrate, the constituent elements thereof readily diffuse from the inside to the upper layer, land thus a diffusion barrier layer, for example, a film (a thickness of about 50 to 200 nm) of silicon nitride (SiN), is preferably formed for suppressing diffusion.

During catalytic CVD, a doping gas such as $PH_3$ or $B_2H_6$ is mixed with the gas supplied to form the n-type or p-type single crystal silicon layer, thereby forming nMOSTFT or pMOSTFT. Therefore, cMOSTFT can also be formed.

In this way, the single crystal silicon layer formed on the substrate by hetero epitaxial growth can be applied to the channel regions, and the source and drain regions of top gate type MOSTFTs which constitute at least a portion of the peripheral driving circuits so that the type and/or concentration of impurities in each of the regions can be controlled.

The thin film transistors in the peripheral driving circuit region and the display region may be n-channel type, p-channel type or complementary type insulating gate electric field effect transistors; for example, the thin film transistors may comprise a combination of the complementary and n-channel types, a combination of the complementary and p-channel types, or a combination of the complementary, n-channel and p-channel types. In addition, at least some of thin film transistors in the peripheral driving circuit region and/or the display region preferably have the LDD (lightly doped drain) structure. The LDD structure may be provided not only between the gate and drain but also between the gate and source or between the gate and source and between the gate and drain (referred to as "double LDD").

Particularly, in the display region, MOSTFT preferably comprises LDD-type nMOS, PMOS, or cMOSTFT, while in the peripheral driving circuit region, MOSTFT preferably comprises cMOS, nMOS or pMOSTFT, or a mixture thereof.

In the present invention, step portions are preferably provided in the substrate and/or the film formed thereon so that each of the step portions comprises a recessed portion having a section in which the side is at right angles with the bottom, or is inclined toward the lower end side to form a base angle of 90° or less. The step portions are preferably formed in the insulating substrate or the SiN film formed thereon (or both of the substrate and the SiN film) and used as seeds for epitaxial growth of the single crystal silicon layer. Each of the step portions is preferably formed along at least one side of an element region which comprises the channel region, and the source and drain regions of an active element, for example, a thin film transistor. In addition, each of the step portions is preferably formed along at least one side of an element region in which a passive element, for example, a resistor, is formed.

In this case, the material layer can be formed on the insulating substrate including the step portions which are formed in the predetermined shape at the predetermined positions so as to serve as seeds for epitaxial growth.

Alternatively, the step portions can be formed in the same predetermined shape as described above in the material layer, and the single crystal silicon layer can be formed on the material layer including the step portions.

In both cases, not only the material layer but also the step portions are used as the seeds, and thus the single crystal silicon layer having higher crystallinity can be formed.

A first thin film transistor such as MOSTFT may be provided in each of the recessed portions of the substrate, which are formed by the step portions, or outside the recessed portions in the vicinity thereof, or both portions in the substrate. The step portions are formed by dry etching such as reactive ion etching, or the like.

In this case, the step portions are formed on one side of the first substrate, and the single crystal, polycrystalline or amorphous silicon layer is formed on the substrate including the step portions. The second thin film transistor may be a top gate, bottom gate or dual gate type which comprises the channel region, source region and drain region comprising the single crystal, polycrystalline or amorphous silicon layer, and the gate region provided on and/or below the channel region.

In this case, the same step portions as described above are formed to have a section in which the side is at right angles with the bottom, or inclined toward the lower end side to form a base angle of 90° or less, and used as the seed for epitaxial growth of the single crystal silicon layer.

The second thin film transistor may be provided inside and/or outside each of the recessed portions of the substrate, which are formed by the step portions, and like in the first thin film transistor, the source, drain, and channel regions may be formed by graphoepitaxial growth of a single crystal silicon layer.

In the second thin film transistor, the type and/or concentration of III-group or V-group impurities in the single crystal, polycrystalline or amorphous silicon layer may be controlled, and each of the step portions may be formed along at least one side of the element region comprising the channel, source and drain regions of the second thin film transistor in the same manner as described above. The gate electrode below the single crystal, polycrystalline or amorphous silicon layer is preferably has trapezoidal side ends. A diffusion barrier layer may be provided between the first substrate and the single crystal, polycrystalline or amorphous silicon layer.

The source or drain electrode of the first and/or second thin film transistor is preferably formed on a region including the step portion.

The first thin film transistor may be at least the top gate type selected from the top gate type, bottom gate type and dual gate type, which have the gate region formed on and/or below the channel region. A switching element for switching each of pixel electrodes in the display region may comprise the top gate, bottom gate or dual gate type second thin transistor.

In this case, the gate electrode provided below the channel region may be made of a heat resistant material, and the upper gate electrode of the second thin film transistor and the gate electrode of the first thin film transistor may comprise a common material.

In the peripheral driving circuit region, besides the first thin film transistors, top gate, bottom gate or dual gate type thin film transistors in which gate regions are formed above and/or below channel regions comprising a polycrystalline or amorphous silicon layer, or diode, resistor, capacitor and inductor elements, etc. may be provided by using the single crystal silicon, polycrystalline silicon' or amorphous silicon layer.

The thin film transistors of the peripheral driving circuit region and/or the display region may be a single gate or multi-gate type.

Where the n- or p-channel type thin film transistors of the peripheral driving circuit region and/or the display region are the dual type, preferably, the upper or lower gate electrodes are electrically open, or any desired negative (the n-channel type) or positive (the p-channel type) is applied thereto so that the thin film transistors are operated as the bottom gate or top gate type thin film transistors.

Where the thin film transistors of the peripheral driving circuit region are the n-channel, p-channel or complementary type first thin film transistors, the thin film transistors of the display region may be the n-channel, p-channel or complementary type when the channel region comprises the single crystal silicon, polycrystalline silicon or amorphous silicon layer.

In the present invention, after the single crystal silicon layer is grown, the upper gate portion comprising the gate insulating film and the gate electrode is formed on the single crystal silicon layer, and a III-group or V-group impurity element is introduced into the single crystal silicon layer with the upper gate portion used as a mask to form the channel regions, source regions and drain regions.

Where the second thin film transistors are the bottom gate or dual gate type, the lower gate electrodes comprising a heat resistant material are provided below the channel regions, and the gate insulating films are formed on the gate electrodes to form the lower gate portions, followed by the steps common to the first thin film transistors, which include the step of forming the step portions to form the second thin transistors. In this case, the upper gate electrodes of the second thin film transistors and the gate electrodes of the first thin film transistors can be formed by using a common material.

In addition, after the single crystal silicon layer is formed on the lower gate portion, a III-group or V-group impurity element can be introduced into the single crystal silicon layer to form the source and drain regions, followed by activation processing.

The resist mask used for forming the LDD structure is left, and a resist mask which covers this resist mask can be used for ion implantation for forming the source and drain regions.

The substrate may be optically opaque or transparent so that pixels electrodes of reflective or transmissive display region are provided thereon.

Where the display region has a laminated structure comprising the pixel electrodes and a color filter, the color filter is provided on the display array portion to realize improvements in the aperture ratio, luminance, etc. of a display panel, omission of a color filter substrate, and cost reduction due to improvement in productivity.

In this case, when each of the pixel electrodes is a reflecting electrode, preferably, irregularity is formed for obtaining reflection and viewing angle characteristics optimum for a resin film, and the pixel electrodes are provided on the irregularity- When the pixel electrodes are transparent electrodes, the surface is flattened by a transparent planarizing film, and the pixel electrodes are provided on the flattened surface.

The display region is constructed to emit light or modulate light by driving the MOSTFTs. For example, the display region may be constructed as a liquid crystal display device (LCD), an electroluminescence display device (EL), a field emission display device (FED), a light emitting polymer display device (LEPD), a light emitting diode display device (LED), or the like. In this case, a plurality of the pixel electrodes are arranged in a matrix in the display region, and the switching element may be connected to each of the pixel electrodes.

The present invention will be described in further detail below with reference to preferred embodiments.

First Embodiment

FIGS. 1 to 12 show a first embodiment of the present invention.

This embodiment relates to an active matrix reflective liquid crystal display device (LCD) in which a material layer (for example, a crystalline sapphire film) is formed on a surface of a heat resistant substrate including the step portions (the recessed portions) provided therein, and a single crystal silicon layer is deposited by hetero epitaxial growth by the catalytic CVD method using the material layer as a seed, and used for forming to top gate type MOSTFTs. The whole layout of the reflective LCD is described with reference to FIGS. 10 to 12.

Figure 10:
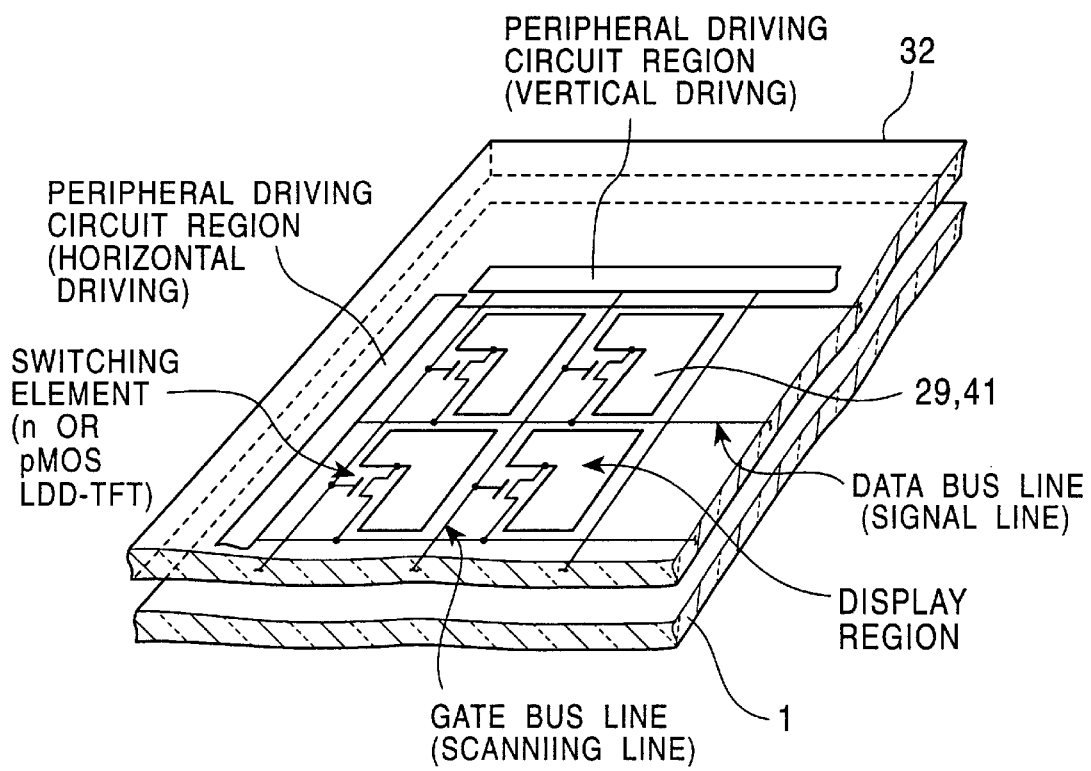
FIG. 10 is a perspective view showing the schematic layout of the whole LCD in accordance with the first embodiment of the present invention.

Referring to FIG. 10, the active matrix reflective LCD comprises a flat panel structure in which a main substrate 1 (which constitutes an active matrix substrate), and a counter substrate 32 are combined together with spacers (not shown) provided therebetween, a liquid crystal (not shown in the drawings) being sealed between both substrates 1 and 32. On the surface of the main substrate 1 are provided a display-region comprising pixel electrodes 29 (or 41) arranged in a matrix, and switching elements for respectively switching the pixel electrodes, and peripheral driving circuit regions connected to the display region.

Each of the switching elements of the display region comprises LDD structure top gate-type MOSTFT comprising nMOS, pMOS or cMOS. In the peripheral driving circuit region, top gate-type MOSTFT comprising cMOS, nMOS or pMOSTFT, or a mixture thereof based on the present invention is also formed as a circuit element. One of the peripheral driving circuit regions comprises a horizontal driving circuit for driving TFT of each of the pixels for each horizontal line by supplying a data signal, and the other peripheral driving circuit region comprises a vertical driving circuit for driving the gate of TFT of each pixel for each scanning line. Both regions are generally respectively provided on both sides of the display regions. These driving circuits can be formed in either a dot sequential analogue system or a line sequential digital system.

Figure 11:
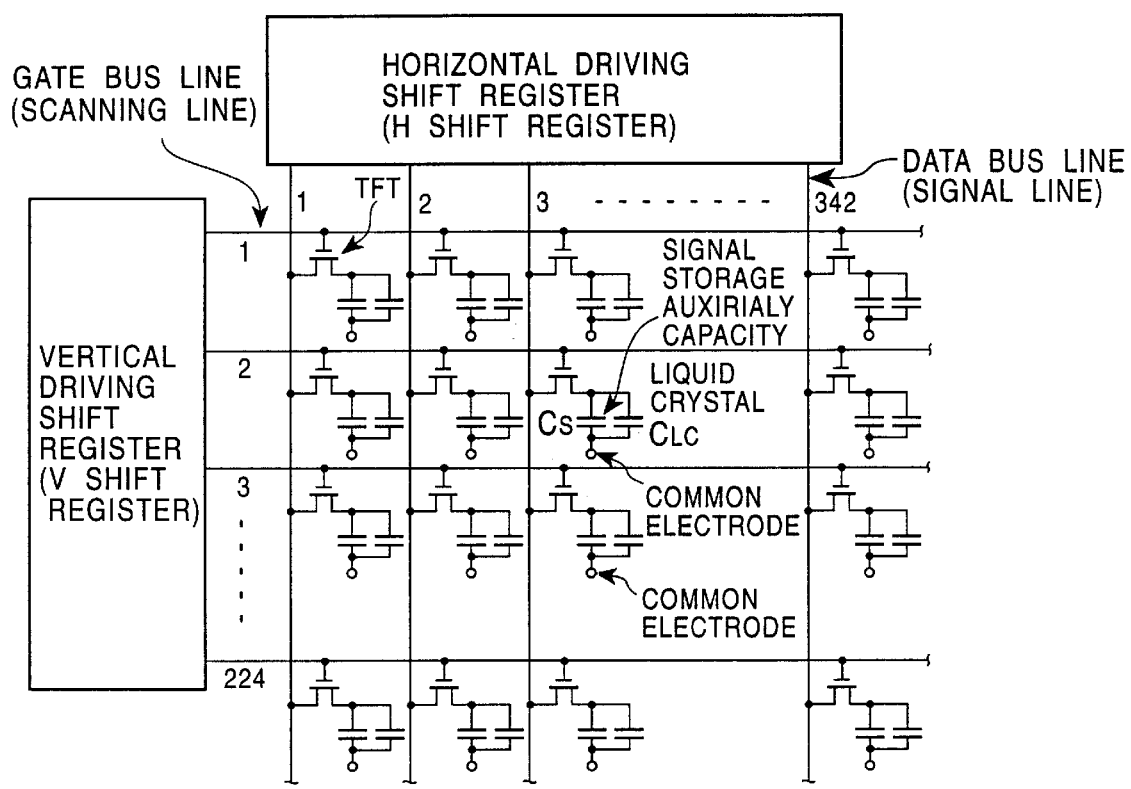
FIG. 11 is a drawing showing equivalent circuits of the same LCD.

As shown in FIG. 11, TFT is arranged at each of the intersections of gate bus lines and data bus lines, which cross at right angles so that image information is written in a liquid capacity ($C_{LC}$) through the TFT, and a charge is held until next information is input. In this case, since only the channel resistance of TFT is insufficient for holding information, a storage capacity (auxiliary capacity) ($C_a$) may be added in parallel with the liquid capacity in order to compensate for the insufficient channel resistance, compensating for a decrease in the liquid crystal voltage due to a leak current. For such TFTs for LCD, required characteristics of TFTs used in the display region differ from those of TFTs used in the peripheral driving circuit regions. Particularly, for TFTs in the pixel region, controlling an off current, and ensuring an on current are important problems. Therefore, in the display region, TFT having the LDD structure described below is provided to form a structure having difficulties in applying an electric field between the gate and drain, thereby decreasing the effective electric field applied to the channel region, decreasing the off current, and decreasing variations in characteristics. However, this causes the problems of complicating the process, increasing the element size, and decreasing the on current. Therefore, an optimum design is required according to the purpose of use.

Examples of usable liquid crystals include liquid crystals for various modes such as TN liquid crystals (nematic liquid crystals used for a TN mode of active matrix driving), STN (super twisted nematic) liquid crystals, FH (guest-host), PC (phase change), FCL (ferroelectric liquid crystal), AFLC (antiferroelectric liquid crystal), PDLC (polymer dispersion liquid crystal), and the like.

Description will now be made of the circuit system of the peripheral driving circuits, and the driving method therefor with reference to FIG. 12. The driving circuits are divided into a gate-side driving circuit and a data-side driving circuit, and shift registers must be provided on both of the gate and data sides. Each of the shift registers generally comprises pMOSTFT and nMOSTFT (so-called a CMOS circuit), or either of pMOSTFT and nMOSTFT. However, cMOSTFT or CMOS circuit is generally used from the viewpoint of the operation speed, reliability, and low power consumption.

The scanning-side driving circuit comprises a shift register and a buffer so that the shift register transmits pulses to each of the lines in synchronism with the horizontal scanning period. On the other hand, driving methods of the data-side driving circuit include two methods including a dot sequential method and a line sequential method. In the dot sequential method shown in the drawing, the configuration of the circuit is relatively simple, and a display signal is written in each of the pixels through the analogue switch under control by the shift register. The signal is written in each of the pixels within the horizontal scanning time (in FIG. 12, R, G and B schematically denote pixels of respective colors).

Next, active matrix reflective LCD in accordance with this embodiment will be described with reference to the nmanufacturing process shown in FIGS. 1 to 9. However, in each of FIGS. 1 to 5, the process for manufacturing the display region is shown on the left side, and the process for manufacturing the peripheral driving circuit region is shown on the right side.

As shown in FIG. 1A (Step 1), a photoresist 2 is formed in a predetermined pattern in at least TFT forming regions on a main surface of an insulating substrate 1 of borosilicate glass, quartz glass, transparent crystalline glass, or the like, and the insulating substrate 1 is then irradiated with $F^+$ ions 3 of $CF_4$ plasma with the photoresist pattern used as a mask, followed by general purpose photolithography and etching (photoetching) such as reactive ion etching (RIE) or the like to form a plurality of step portions 4 having appropriate shape and dimensions.

In this case, as the insulating substrate 1, a highly heat-resistant substrate (8 to 12 inches Ø, 700 to 800 μm thick) of quartz glass, transparent crystalline glass, ceramic, or the like (however, in the transmissive LCD below, an opaque ceramic substrate and low-transparency crystalline glass cannot be used) can be used. The step portions 4 serve as seeds for the epitaxial growth of single crystal silicon, which will be described below, and preferably have a depth d of 0.1 μm, a with w of 5 to 10 μm, a length (in the direction perpendicular to the drawing) of 10 to 20 μm, and an angle (base angle) of 90° formed by the bottom and the side. In order to prevent diffusion of Na ions from the glass substrate, a SiN film (for example, a thickness of 50 to 200 nm) and, if required, a silicon oxide film (referred to as a "SiO₂ film" hereinafter) (for example, a thickness of about 100 nm) may be continuously previously formed on the surface of the substrate 1.

Next, as shown in FIG. 1B (Step 2), after the photoresist 2 is removed, a crystalline sapphire thin film (thickness of 20 to 200 nm) 50 is formed in at least the TFT forming regions including the step portions 4 on the main surface of the insulating substrate 1. The crystalline sapphire thin film 50 is formed by a high-density plasma CVD method, a catalytic CVD method (refer to Japanese Unexemined Patent Publication No. 63-40314) or the like, in which trimethyl aluminum gas is oxidized with an oxidizing gas (oxygen, water, or the like) and crystallized. As the insulating substrate 1, a highly heat-resistant glass substrate (8 to 12 inches Ø, 700 to 800 μm thick) can be used.

Next, as shown in FIG. 1C (Step 3), a single crystal silicon film 7 is hetero-epitaxially grown to a thickness of 0.005 μm to several μm (for example, 0.1 μm) over the entire surface including the step portions 4 by the catalytic CVD method (substrate temperature 200 to 800° C.) disclosed in the Japanese Unexamined Patent Publication No. 63-40314. With the substrate 1 made of borosilicate glass, the substrate temperature is 200 to 600° C., while with the substrate 1 made of quartz glass, crystalline glass or ceramic, the substrate temperature is 600 to 800° C.

Figure 7:
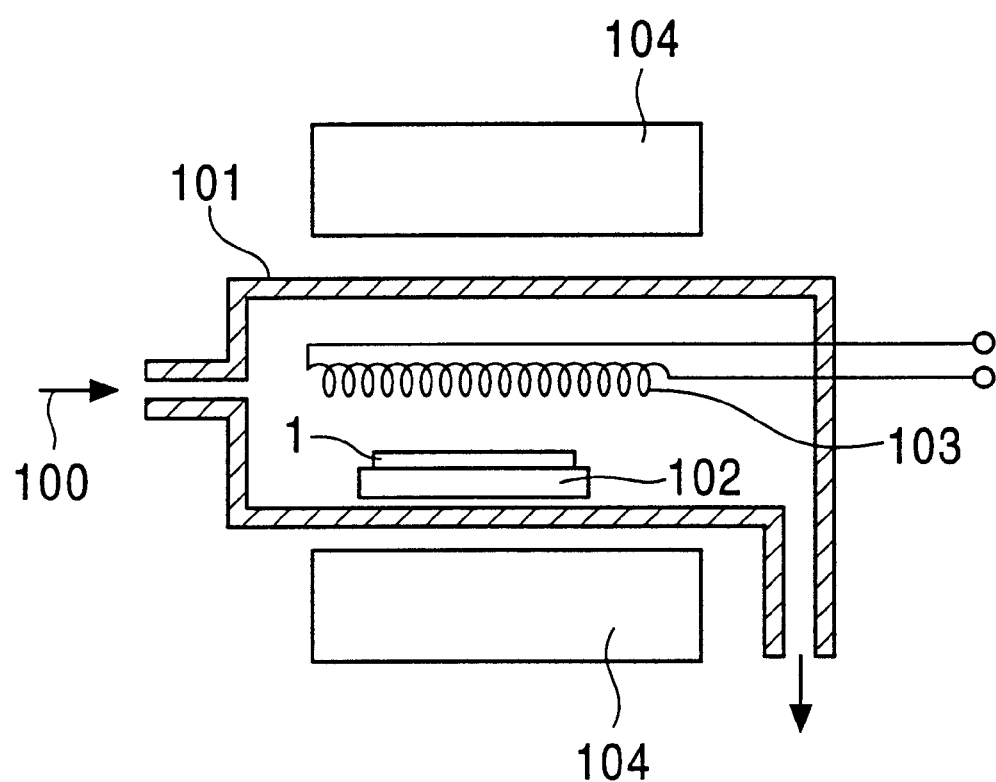
FIG. 7 is a schematic drawing showing a catalytic CVD apparatus used for manufacturing LCD.

In this case, catalytic CVD may be performed by using the apparatus shown in FIG. 7. In the catalytic CVD apparatus, silicon hydride (for example, monosilane or disilane) gas 100 (and, if required, a doping gas such as $B_2H_6$, $PH_6$ or $AsH_3$) is introduced into a deposition chamber 101 through a supply inlet tube. In the deposition chamber 101 are provided a suscepter 102 for supporting the substrate 1, and a coiled catalyst 103 arranged opposite to the suscepter 102. The substrate 1 is heated by external heating means 104 (for example, electric heating means), and the catalyst 103 is activated, for example, as a resistance wire, by heating to a melting point or less (particularly, 800 to 1200° C., and about 1700° C. for tungsten).

In the deposition chamber 101, the nitrogen atmosphere is replaced by hydrogen (about 15 to 20 minutes), and then the temperature is increased to about 200 to 800° C. to catalytically decompose the silane gas by contact with the catalyst 103 and deposit a film on the substrate kept at a low temperature (for example, 300° C.). The deposition time is determined by the thickness of the layer epitaxially grown. After completion of growth, the temperature is decreased, and hydrogen is replaced by nitrogen to remove the substrate 1. In this way, catalytic reaction or thermal decomposition reaction using the catalyst 103 forms silicon atoms or atom clusters having high energy, and deposits a film on the step portions 4 serving as the seeds, thereby depositing the single crystal silicon film in a temperature region significantly lower than temperature which permits deposition by a general heat or plasma CVD method.

The substrate 1 can be heated by not only the method of uniformly heating the whole substrate using an electric furnace or the like, but also the method of locally heating only a predetermined region, for example, the TFT forming regions, using a light beam, an electron beam, or the like.

Figure 8A:
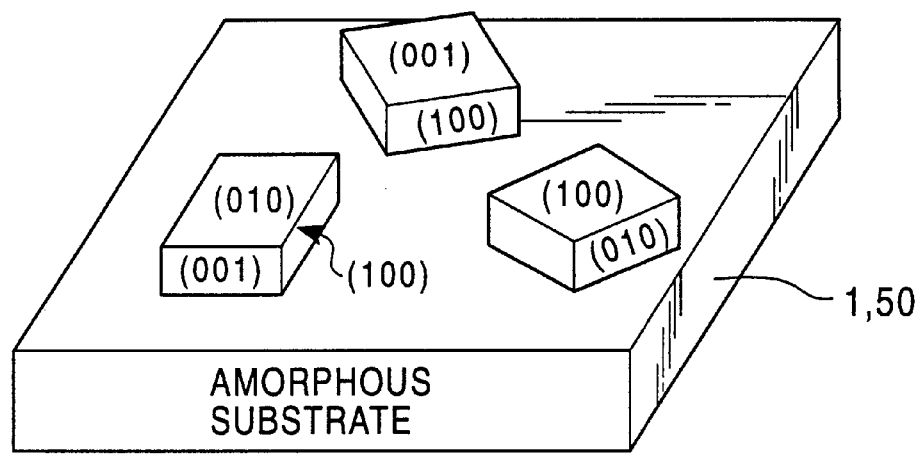
FIG. 8 is a schematic perspective view illustrating the state of silicon crystal growth on an amorphous substrate.
Figure 8B:
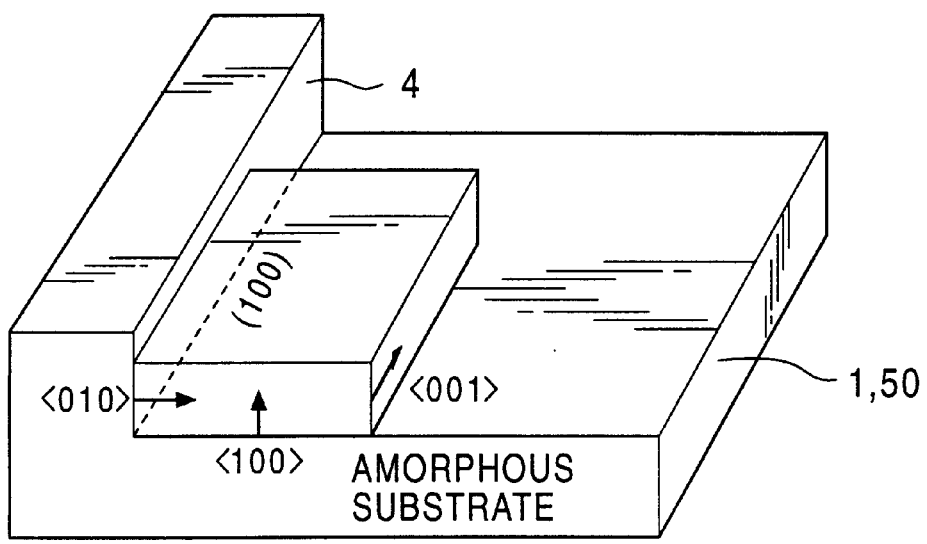
Figure 9A:
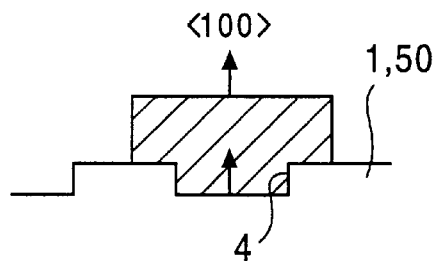
FIG. 9 is a schematic sectional view showing step portions having various shapes and crystal orientation in silicon growth by a graphoepitaxial growth technique.
Figure 9B:
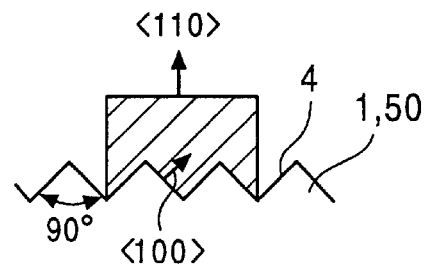
Figure 9C:
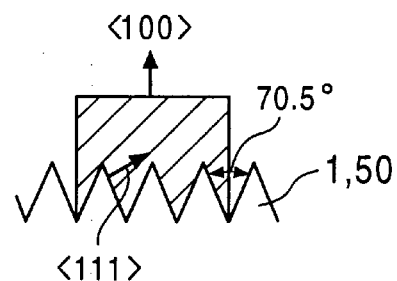
Figure 9D:
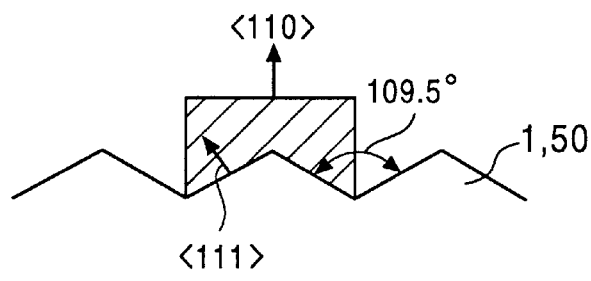
Figure 9E:
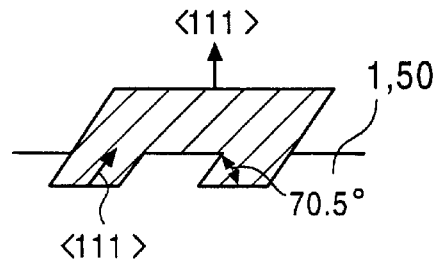
Figure 9F:
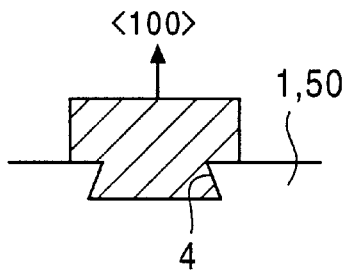

Since the crystalline sapphire film 50 exhibits good lattice matching with single crystal silicon, in the thus-deposited single crystal silicon film 7, for example, (100) plane is hetero-epitaxially grown on the substrate 1. In this case, even in the step portions 4, the single crystal silicon film 7 having higher crystallinity is obtained by hetero epitaxial growth in combination with a known phenomenon referred to as graphoepitaxial growth. This is because when the vertical wall of the step portion 4 is formed on an amorphous substrate (glass) 1, and when an epitaxial layer is formed thereon, as shown in FIG. 8B, the (100) crystal plane is grown along the side of the step portion 4, while FIG. 8A shows random plane orientations. The grain size of the single crystal increases in proportion to the temperature and time. However, where the temperature and time are decreased, the interval of the step portions must be decreased. By changing the shape of the step portions 4 to various shapes, as shown in FIGS. 9A to F, it is possible to control the crystal orientation in layer growth. In forming a MOS transistor, the (100) plane is most frequently used. Namely, each of the step portions 4 has a sectional shape in which the angle (base angle) of the base may be a right angle, and the vertical side may be inclined inward or outward as long as it has a surface in the specified direction in which crystal growth readily takes place. Generally, each of the step portions 4 preferably has a base angle of 90° or less, and a bottom face having corners having a small curvature.

After the single crystal silicon layer 7 is deposited on the substrate 1 by the catalytic CVD method and hetero epitaxial growth, top gate type MOSTFTs comprising channel regions made of the single crystal silicon layer 7 are formed.

Since the single crystal silicon layer 7 deposited by hetero epitaxial growth has variations in the impurity concentration, the single crystal silicon layer 7 is doped with an appropriate amount of p-type carrier impurity, for example, boron ion, over the entire surface thereof to control resistivity. Also only the pMOSTFT forming regions are selectively doped with a n-type carrier impurity to form n-type wells. For example, the pMOSTFT forming regions are doped with p-type impurity ions (e.g., $B^+$) in a dosage of $7 \times 10^{11}$ atoms/cm² at 10 kV with p-channel TFTs masked with photoresist (not shown), to control resistivity. In addition, in order to control the impurity concentration of the pMOSTFT forming regions, the pMOSTFT forming regions are doped with n-type impurity ions (e.g., $P^+$) 65 in a dosage of $1 \times 10^{11}$ atoms/cm² at 10 kV with nMOSTFTs masked with photoresist 60, to form n-type wells 7A, as shown in FIG. 1D (Step 4).

Next, as shown in FIG. 2A (Step 5), SiO₂ (thickness of about 200 nm) and SiN (thickness of about 100 nm) are continuously formed in this order over the entire surface of the single crystal silicon layer 7 by plasma CVD, high-density plasma CVD, catalytic CVD, or the like to form a gate insulating film 8, and a sputtered film 9 (thickness of 500 to 600 nm) of a molybdenum/tantalum (Mo.Ta) alloy is further formed.

Next, as shown in FIG. 2B (Step 6), a photoresist pattern 10 is formed in the step portions (recessed portions) of TFTs in each of the display region and the peripheral diving regions by a general-purpose photolithography technology, followed by continuous etching to form gate electrodes' 11 of a (Mo.Ta) alloy, and gate insulating films (SiN/SiO₂) 12 and expose the single crystal silicon thin film layer 7. The (Mo.Ta) alloy film 9 is etching with an acidic etchant, SiN is etched with CF₄ gas by plasma etching, and SiO₂ is etched with a hydrofluoric acid etchant.

Then, as shown in FIG. 2C (Step 7), the entire portions of nMOSTFTs and pMOSTFTs in the peripheral driving regions, and the gates of nMOSTFTs in the display region are covered with photoresist 13, and the exposed source and drain regions of nMOSTFTs are doped (ion implantation) with phosphorus ions 14, for example, in a dosage of $5 \times 10^{13}$ atoms/cm² at 20 kV to form LDD portions 15 comprising a n⁻-type layer in self alignment.

Next, as shown in FIG. 3A (Step 8), the entire portions of pMOSTFTs in the peripheral driving regions, the gates of nMOSTFTs in the peripheral driving regions, and the gates and LDD portions of nMOSTFTs in the display region are covered with photoresist 16, and the exposed regions are doped (ion implantation) with phosphorus or arsenic ions, for example, in a dosage of $5\times10^{15}$ atoms/cm$^2$ at 20 kV to form source portions, drain portions, and LDD portions of nMOSTFTs comprising a n$^+$-type layer.

Next, as shown in FIG. 3B (Step 9), the entire portions of nMOSTFTs in the peripheral driving region and nMOSTFTs in the display region, and the gates of pMOSTFTs in the display region are covered with photoresist 20, and the exposed regions are doped (ion implantation) with boron ions, for example, in a dosage of $5\times10^{15}$ atoms/cm$^2$ at 20 kV to form source portions and drain portions of pMOSTFTs comprising a p$^+$-type layer. In the case of nMOS peripheral driving circuits, this work is unnecessary because of the absence of pMOSTFTs.

Next, as shown in FIG. 3C (Step 10), in order to island the active elements such as TFTs, diodes, etc., and the passive elements such as resistors, inductors, etc., photoresist 24 is provided, and the single crystal silicon thin film layer is removed by general-purpose photolithography and etching except in all the active elements and the passive elements of the peripheral driving regions and the display region. The etchant used is a hydrofluoric acid type.

Next, as shown in FIG. 4A (Step 11), a SiO$_2$ film (thickness of about 200 nm) and a silicate glass (PSG) film (thickness of about 300 nm) are continuously formed in this order over the entire surface by plasma CVD, high-density plasma CVD, catalytic CVD, or the like to form a protective film 25.

Then, in this state, the single crystal silicon layer is activated. In this activation, annealing conditions of a halogen lamp or the like include a temperature of about 100° C. and a time of about 10 seconds. Although a gate electrode material resistant to these conditions is required, the high-melting-point Mo.Ta alloy is suitable. Therefore, this gate electrode material can be provided for not only the gates but also wiring over a wide range. Although this activation does not use expensive excimer laser annealing, if excimer laser annealing is used, overlap scanning of 90% or more is preferably performed by XeCl (wavelength 308 nm) over the entire surface or selectively only in the active elements and passive elements.

Next, as shown in FIG. 4B (Step 12 ), contact holes are formed in the source/drain regions of all TFTs in the peripheral driving circuits, and the source regions of display TFTs by general-purpose photolithography and etching.

Then, a sputtered film of aluminum or an aluminum alloy, e.g., aluminum containing 1% of Si, or aluminum containing 1 to 2% of copper, copper, or the like is formed to a thickness of 500 to 600 nm over the entire surface, and source electrodes 26 of all TFTs in the peripheral driving circuits and the display region, and drain electrodes 27 of the peripheral driving circuit regions are formed by general-purpose photolithography and etching. At the same time, data lines and gate lines are formed. Then, sintering is carried out in forming gases (N$_2$+H$_2$) at about 400° C. for 1 hour.

Next, as shown in FIG. 4C (Step 13), an insulating film 36 comprising a PSG film (thickness of about 300 nm) and a SiN film (thickness of about 300 nm) is formed over the entire surface by plasma CVD, high-density plasma CVD, catalytic CVD, or the like. Then, contact holes are formed in the drain portions of display TFTs. In the display region, the SiO$_2$, PSG and SiN films need not be removed.

Figure 5B:
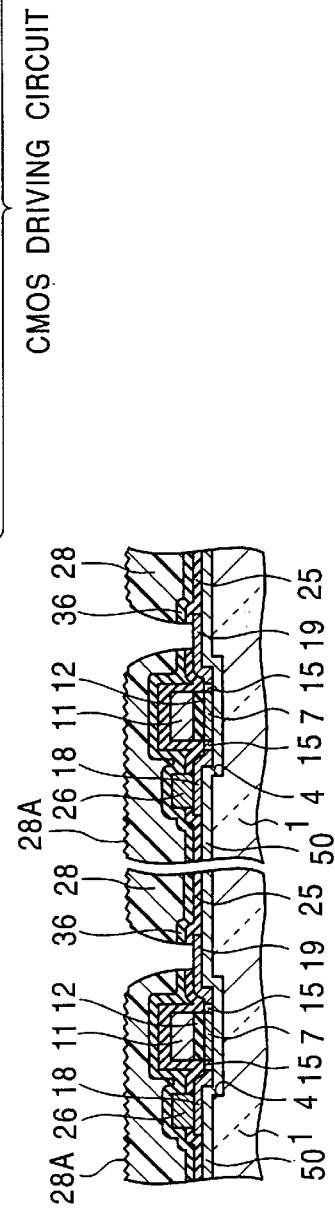

As a basic requirement, the reflective liquid crystal display device must have both the function to reflect incident light to the inside of the liquid crystal panel and the function to scatter incident light. This is because the direction of an observer for the display is substantially determined, but the direction of incident light cannot be determined unconditionally. Therefore, a reflector must be designed on the assumption that a point light source may be present in any direction. Therefore, as shown in FIG. 5A (Step 14), a photosensitive resin film 28 is formed to a thickness of 2 to 3 μm over the entire surface by spin coating or the like. As shown in FIG. 5B (Step 15), in order to obtain reflection characteristics and viewing angle characteristics optimum for at least the pixel regions, an uneven pattern is formed by general-purpose photolithography and etching, followed by reflowing to form the lower reflecting surface comprising an uneven rough surface 28A. At the same time, contact resin holes are formed in the drain portions of display TFTs.

Figure 5C:
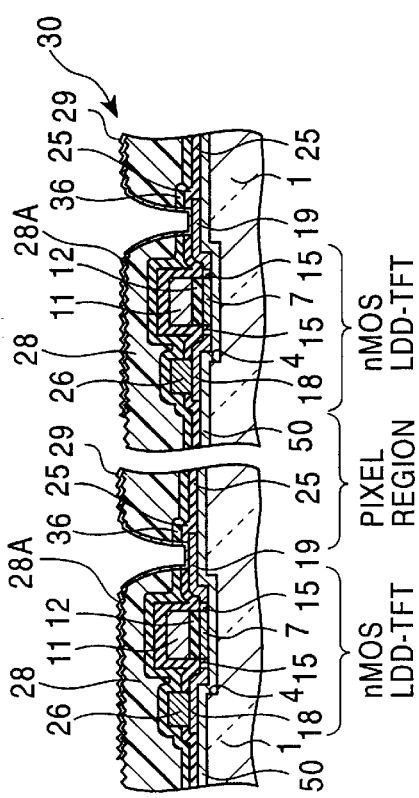

Next, as shown in FIG. 5C (Step 16), a sputtered film of aluminum or aluminum containing 1% of Si is formed to a thickness of 400 to 500 nm over the entire surface, and then removed by general-purpose photolithography and etching except in the pixel region to form an uneven reflecting portion 29 made of aluminum or the like and connected to the drain portions 19 of display TFTs. These portions are used as pixel electrodes for display. Then, sintering is carried out in a forming gas at about 300° C. for 1 hour to achieve sufficient contact. In order to improve reflectance, silver or a silver alloy may be used in place of the aluminum material.

As described above, the single crystal silicon layer 7 is formed by the catalytic CVD method and low-temperature hetero epitaxial growth using as the seed the crystalline sapphire thin film 50 including the step portions 4, and CMOS circuits comprising top gate type nMOSLDD-TFTs, pMOSTFTs and nMOSTFTs are formed in each of the display region and the peripheral driving circuit regions by using the single crystal silicon layer 7 to produce an active matrix substrate 30 comprising the display region and the peripheral driving circuit regions, which are integrated.

The method of manufacturing the reflective liquid crystal display device (LCD) by using the active matrix substrate (driving substrate) 30 will be described below with reference to FIG. 6. Hereafter, the active matrix substrate is referred to as the TFT substrate.

When the liquid crystal cell of LCD is produced by plane-plane assembly (suitable for medium to large liquid crystal panels of a 2-inch size or more), polyimide alignment films 33 and 34 are formed on the TFT substrate 30 and the element forming surface of a counter substrate 32 comprising an ITO (indium tin oxide) electrode 31 provided over the entire surface thereof. Each of the polyimide alignment films is formed to a thickness of 5 to 100 nm by roll coating, spin coating or the like, and then cured at 180° C. for 2 hours.

Next, the TFT substrate 30 and the counter substrate 32 are rubbed or subjected to light alignment processing. Although a rubbing buff made of cotton, rayon, or the like may be used, a cotton buff is stable from the viewpoint of buff dust particles, retardation, etc. Besides rubbing, alignment can be performed by oblique incidence of polarized light or non-polarized light to form a polymeric alignment film. Examples of such polymer compounds include polymethyl methacrylate polymers having azobenzene, and the like.

Next, after washing, a common agent and a sealing agent are coated on the TFT substrate 30 and the counter substrate 32, respectively. In order to remove dust particles of the rubbing buff, washing is carried out with water or IPA (isopropyl alcohol). The common agent may comprise an acryl, epoxyacryl or epoxy adhesive containing a conductive filler, and the sealing agent may comprise an acryl, epoxyacryl or epoxy adhesive. Although any one of heat curing, ultraviolet irradiation curing, and a combination of ultraviolet irradiation curing and heat curing can be used, a combination of ultraviolet irradiation curing and heat curing is preferred from the viewpoint of superposition precision and workability.

Then, in order to obtain a predetermined gap, spacers are scattered on the counter substrate side, and the counter substrate 32 is superposed on the TFT substrate 30 at a predetermined position. After an alignment mark on the counter substrate 32 is precisely matched with an alignment mark on the TFT substrate 30, the sealing agent is temporarily cured by ultraviolet irradiation, followed by batch heat curing.

Next, a single liquid crystal panel comprising the TFT substrate 30 and the counter substrate 32, which are superposed, is produced by a scribe and break method.

Then, a liquid crystal 35 is injected into the gap between both substrates 30 and 32, and then the injection port is sealed with an ultraviolet adhesive, followed by IPA washing. Although any type of liquid crystal may be used, for example, a TN (twisted nematic) mode with high-speed response, which uses a nematic liquid crystal, is generally used.

Next, the liquid crystal 35 is oriented by heating and rapid cooling.

Next, flexible wiring is connected to the panel electrode lead portion of the TFT-substrate 30 by thermocompression bonding of an anisotropic conductive film, and a polarizer is further bonded to the counter substrate 32.

In the case of single-plane assembly of a liquid crystal panel (suitable for small liquid crystal panels of a 2-inch size or less), the polyimide alignment films 33 and 34 are formed on the TFT substrate 30 and the element forming surface of the counter substrate 32, and both substrates are rubbed or subjected to non-contact alignment processing with linearly polarized ultraviolet light by the same method as described above.

Next, each of the TFT substrate 30 and the counter substrate 32 is cut by dicing or scribe and break method, and then cleaned with water or IPA. A common agent and a sealing agent containing spacers are coated on the TFT substrate 30 and the counter substrate 32, respectively, and then both substrates are superposed. The subsequent process may be carried out according to the above-described procedure.

In the reflective LCD, the counter substrate is a CF (color filter) substrate in which a color filter layer 46 is provided below the ITO electrode 31. Incident light from the counter substrate side is efficiently reflected by the reflecting film 29, and then outgoes from the counter substrate side.

Figure 6:
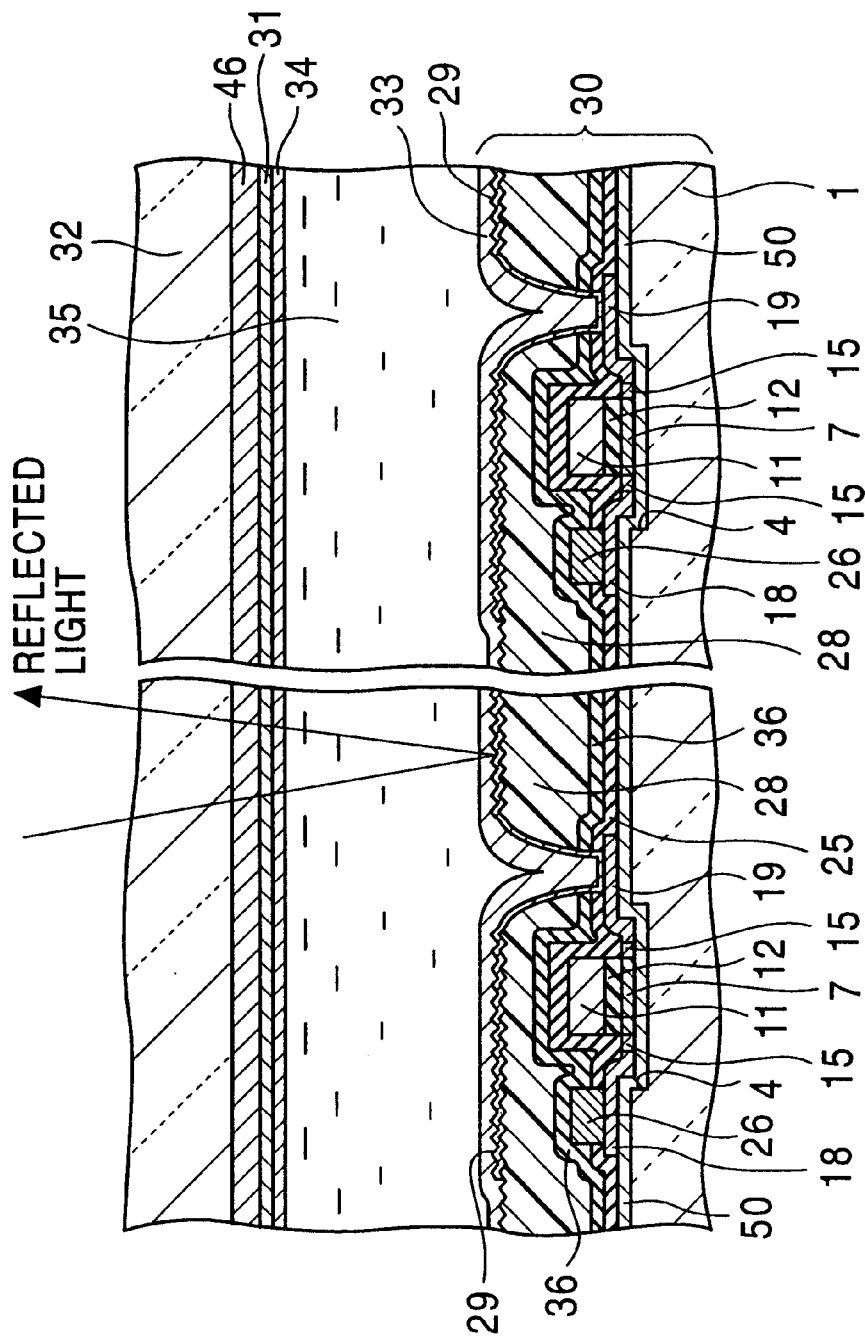
FIG. 6 is a sectional view showing a principal portion of LCD.

On the other hand, when the TFT substrate 30 has an on-chip color filter (OCCF) structure in which a color filter is provided on the TFT substrate 30, other than the substrate structure shown in FIG. 6, the ITO electrode is bonded to the entire surface of the counter substrate 32 (or the ITO electrode with a black mask is bonded to the entire surface).

When an auxiliary capacity $C_S$ shown in FIG. 11 is introduced into each of the pixel portions, a dielectric layer (not shown) provided on the substrate 1 may be connected to the drain regions 19 of single crystal silicon.

As described above, this embodiment exhibits the following significant operations and effects:

(a) The crystalline sapphire thin film 50 is formed on the substrate 1 having the step portions 4 having the predetermined shape and dimensions, and used as the seed for low-temperature hetero epitaxial growth (however, during growth, the heating temperature is relatively low, e.g., 200 to 800° C., preferably 300 to 400° C.) to form the single crystal silicon thin film 7 having a high electron mobility of 540 $cm^2$/v·sec or more, thereby permitting manufacture of LCD comprising a built-in high-performance driver. Since the step portions 4 accelerate epitaxial growth, the single crystal silicon thin film 7 having higher crystallinity can be obtained.

(b) Since the single crystal silicon thin film exhibits high electron and hole mobility equivalent to a single crystal silicon substrate, as compared with conventional amorphous silicon thin film and polycrystalline silicon thin film. Therefore, single crystal silicon top gate type MOSTFT comprising the single crystal silicon thin film permits a structure in which the display region comprising nMOS, pMOS or cMOSTFT having the LDD structure with high switching properties and a low leak current, and the peripheral driving circuit region comprising cMOS, nMOS or pMOSTFT having high-driving ability, or a mixture thereof are integrated, realizing a display panel having high image quality, high definition, a narrow frame, high efficiency, and a large screen. Since the single crystal silicon thin film 7 exhibits sufficiently high mobility of holes, it is possible to manufacture a peripheral driving circuit for driving by electrons or holes, or combination of electrons and holes. This peripheral driving circuit can be integrated with TFTs of the display region having the LDD structure nMOS, pMOS or cMOS to realize a panel. In small to medium size panels, one of a pair of vertical driving circuits in the periphery can be omitted.

(c) Since the heating temperature of epitaxial growth of silicon is 800° C. or less, the single crystal silicon film 7 can be uniformly formed on the insulating substrate at a relatively low temperature (for example, 200 to 600° C.). Therefore, it is possible to select any desired substrate material having low strain point, low cost and good physical properties, such as quartz glass, crystalline glass, ceramic, borosilicate glass (as well as a heat-resistant organic substrate), or the like. It is also possible to increase the size of the substrate.

(d) Unlike in the solid growth method, annealing at medium temperature for a long time, and excimer laser annealing are unnecessary, thereby causing high productivity and no need for an expensive manufacturing apparatus. This permits cost reduction.

(e) In the hetero epitaxial growth, a wide range of P-type or N-type conduction single crystal silicon thin films with high Mobility can easily be obtained by controlling the crystallinity of the crystalline sapphire thin film or the like, the gas composition ratio of catalytic CVD, the shape of the step portions, the heating temperature of the substrate, the concentration of n-type or p-type carrier impurities, etc., thereby permitting easy control of Vth (threshold value), and a high-speed operation due to a decrease in resistance.

(f) By providing a color filter on the display array region, improvements in the aperture ratio and luminance of the display panel, omission of the color filter substrate, and cost reduction by improvement in productivity are realized.

(g) Since the material layer such as the crystalline sapphire thin film or the like functions as a diffusion barrier for various atoms, it is possible to suppress impurity diffusion from the glass substrate.

Second Embodiment

A second embodiment of the present invention will be described below with reference to FIGS. 13 to 15.

Figure 13A:
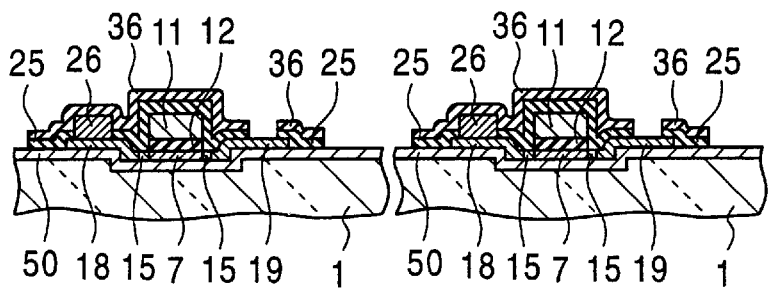
FIG. 13 is a sectional view showing the steps of a LCD manufacturing process in accordance with a second embodiment of the present invention.

Although this embodiment comprises the same top gate type MOSTFTs as the first embodiment, which are provided in the display region and the peripheral driving circuit regions, this embodiment relates to a transmissive LCD unlike the first embodiment. Namely, although the steps shown in FIGS. 1A to 4C are the same as the first embodiment, the subsequent step comprises forming contact holes 19 for the drain portions of display TFTs in the insulating films 25 and 36, and at the same time, removing the unnecessary $SiO_2$, PSG and SiN films in the pixel apertures in order to improve transmittance, as shown in FIG. 13A (Step 14).

Figure 13B:
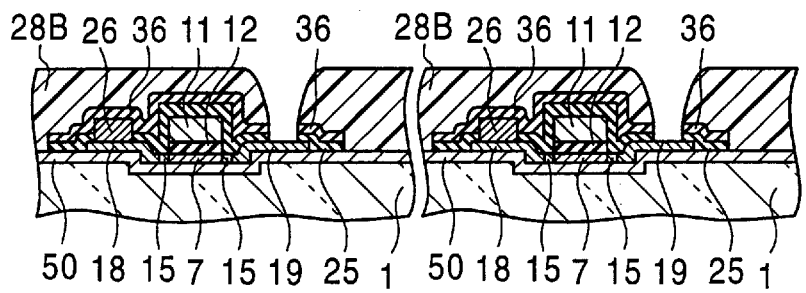

Next, as shown in FIG. 13B (Step 15), a photosensitive acrylic transparent resin planarizing film 28B is formed to a thickness of 2 to 3 μm over the entire surface by spin coating, and holes are formed in the transparent resin 28B on the drain sides of display TFTs by general-purpose photolithography, followed by curing under predetermined conditions.

Figure 13C:
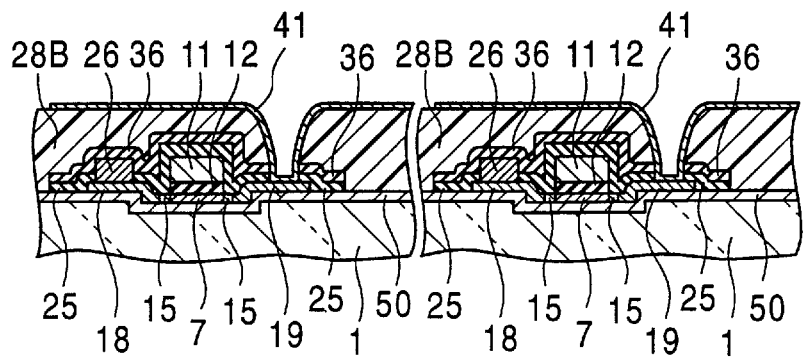

Then, as shown in FIG. 13C (Step 16), an ITO sputtered film is formed to a thickness of 130 to 150 μm over the entire surface, and then ITO transparent electrodes 41 are formed by general-purpose photolithography and etching so as to be brought into contact with the drain portions 19 of display TFTS. Then, heat treatment (in a forming gas at 200 to 250° C. for 1 hour) is performed to decrease contact resistance between the drains of display TFTs and ITO, and improve ITO transparency.

Figure 14:
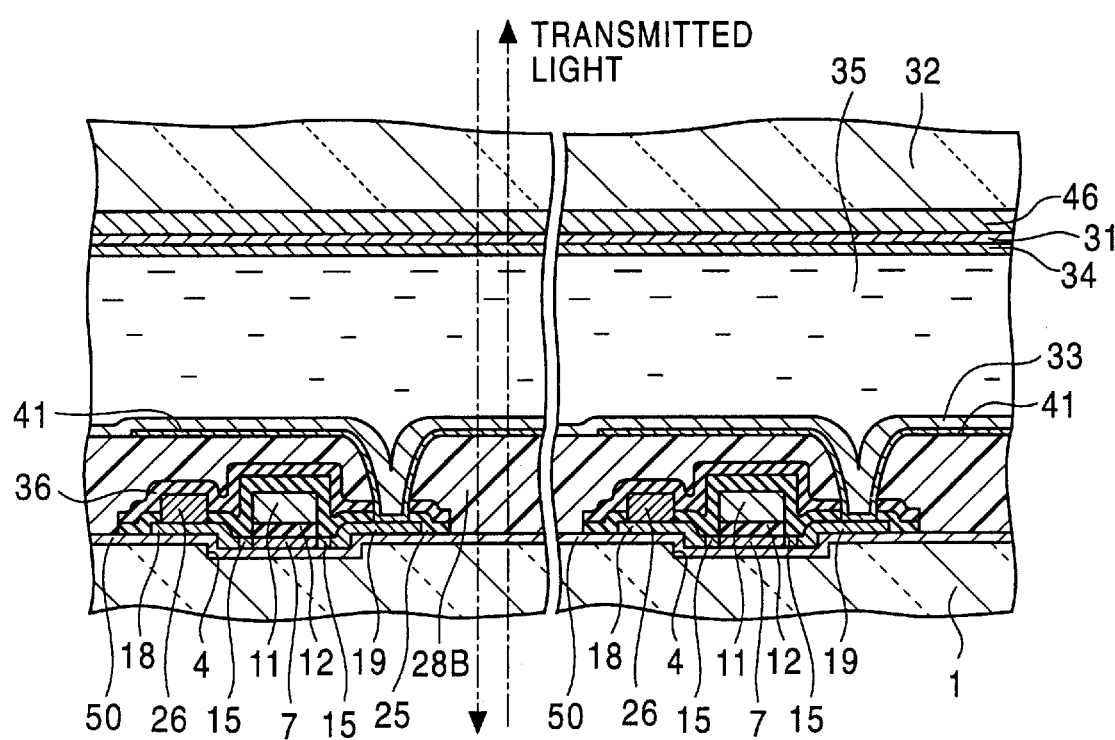
FIG. 14 is a sectional view showing a principal portion of the same LCD.

As shown in FIG. 14, the substrate 30 is combined with the counter substrate 32 to assemble transmissive LCD by the same method as the first embodiment. However, a polarizer is also attached to the TFT substrate side. Although, in this transmissive LCD, transmitted light is obtained, as shown by a solid line, transmitted light can also be obtained from the counter substrate side, as shown by a one-dot chain line.

In this transmissive LCD, an on-chip color (OCCF) filter structure and an on-chip black (OCB) structure can be manufactured as follows.

Figure 15A:
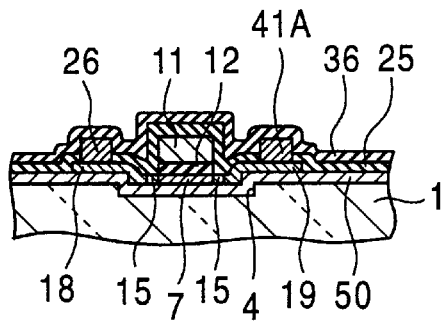
FIG. 15 is a sectional view showing the steps of the same LCD manufacturing process.

After the steps shown in FIG. 1A to 4B are performed according to the above-described steps, holes are also formed in the drain portions of the insulating film 25 of $PSG/SiO_2$, an aluminum embedded layer 41A for drain electrodes is formed, and then the SiN/PSG insulating film 36 is formed, as shown in FIG. 15A (Step 13).

Figure 15B:
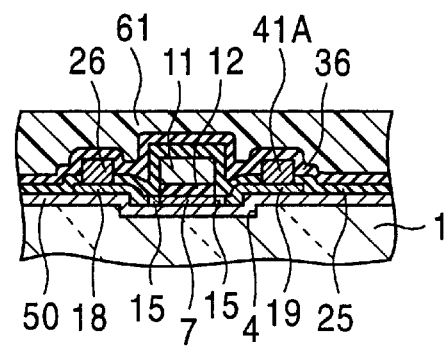
Figure 15C:
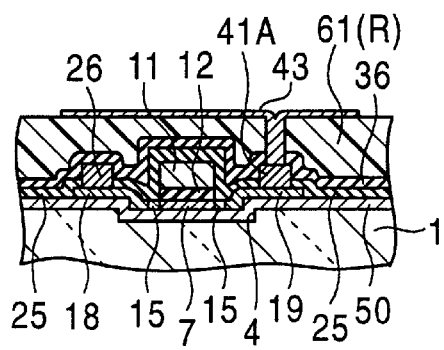

Next, as shown in FIG. 15B (Step 14), photoresist 61 in which dyes of R, G and B colors are dispersed in respective segments is formed to a predetermined thickness (1 to 1.5 μm). Then, as shown in FIG. 15C (Step 15), the photoresist 61 is patterned by general-purpose photolithography to leave predetermined positions (respective pixels), to form color filter layers 61(R), 61(G) and 61(B) (the on-chip color filter structure). In this case, holes are also formed in the drain portions. An opaque ceramic substrate, and low-transmittance glass and heat-resistant resin substrates cannot be used.

Next, as shown in FIG. 15C (Step 15), a light shielding layer 43 as a black mask is formed in the contact holes, which communicate with the drains of display TFTs, and on the color filters by patterning a metal. For example, molybdenum is deposited to a thickness of 200 to 250 nm by sputtering, and then patterned to a predetermined shape which covers the display TFTs to shield light (the on-chip black structure).

Figure 15D:
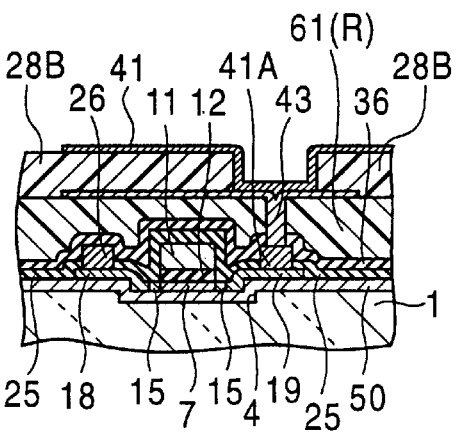

Next, as shown in FIG. 15D (Step 16), a transparent resin planarizing film 28B is formed, and ITO transparent electrodes 41 are further formed in through holes formed in the planarizing film 28B so as to be connected to the light shielding layer 43.

In this way, the color filter 61 and the black mask 43 are formed on the display array region to improve the aperture ratio of the liquid crystal display panel, and realize a reduction in power consumption of a display module including a back light.

Third Embodiment

FIGS. 16 to 24 show a third embodiment of the present invention.

In this embodiment, the peripheral driving circuit region comprises a CMOS driving circuit comprising the same top gate type pMOSTFT and nMOSTFT as the first embodiment. The display region is a reflective type, and comprises various combinations of TFTs with various gate structures.

Figure 16A:
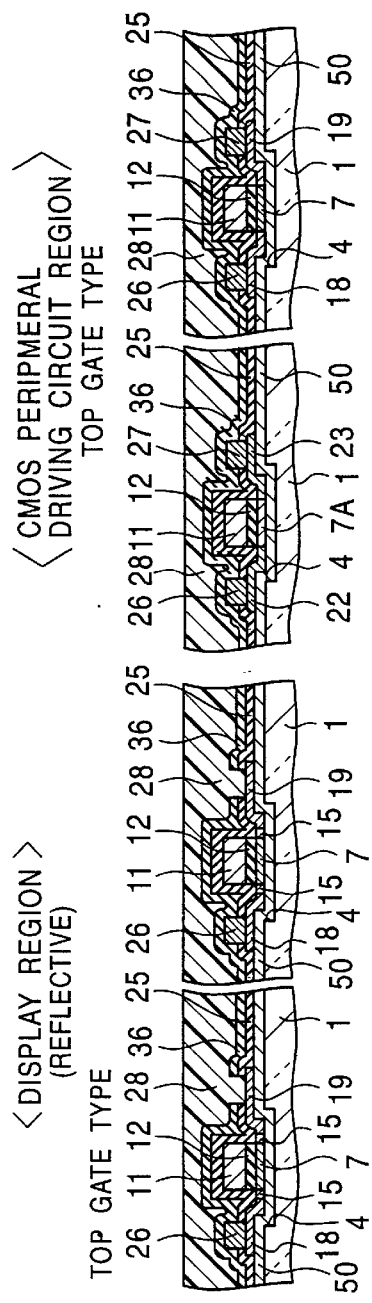
FIG. 16 is a sectional view showing a principal portion of LCD in accordance with a third embodiment of the present invention.
Figure 16B:
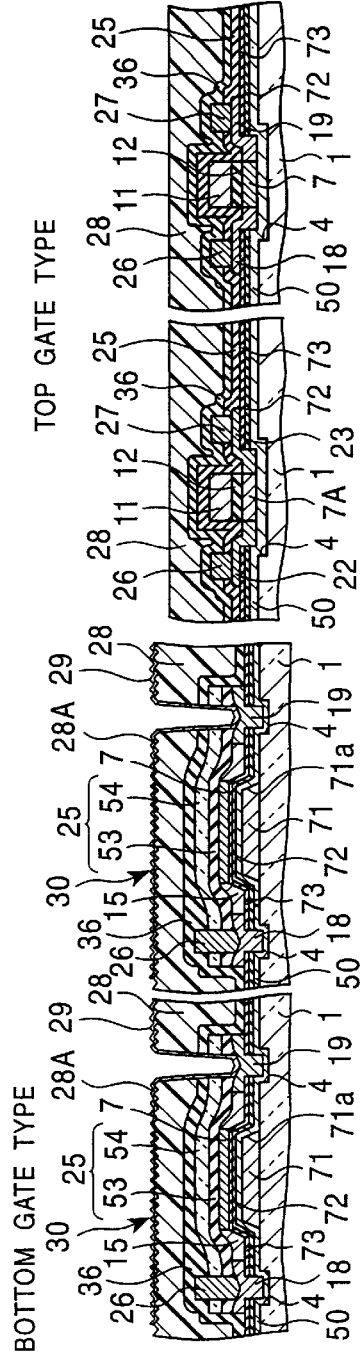
Figure 16C:
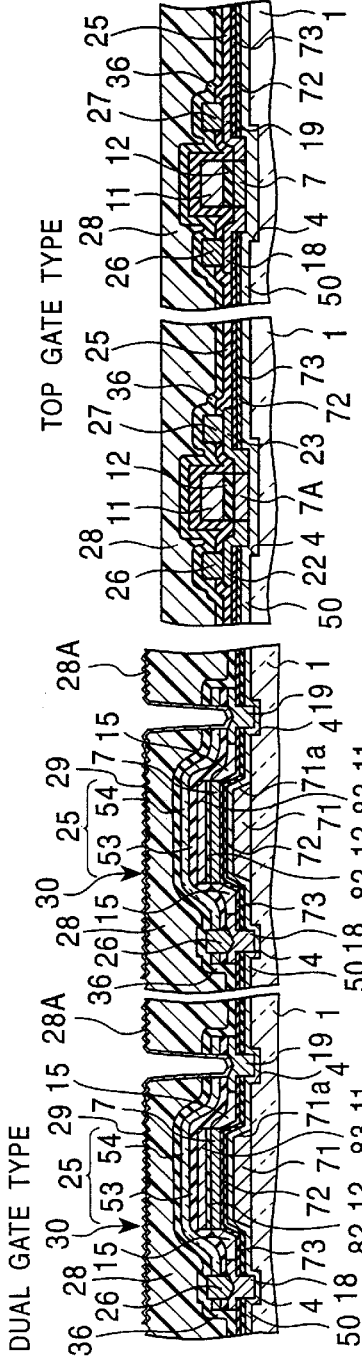

Namely, FIG. 16A shows the display region comprising the same top gate type nMOSLDD-TFTs as the first embodiment, FIG. 16B shows the display region comprising bottom gate type nMOSLDD-TFTs, and FIG. 16C shows the display region comprising dual gate type nMOSLDD-TFTs. These bottom gate type and dual gate type MOSTFTs can be produced by a process common to the top gate type MOSTFTs in the peripheral driving circuit regions, as described below. However, particularly, the dual gate type permits improvement in the driving ability by the upper and lower gate portions, is suitable for high-speed switching, and can be operated as the top gate type or the bottom gate type by selectively using any one of the upper and lower gate portions according to demand.

In FIG. 16B, each bottom gate type MOSTFT comprises a gate electrode 71 made of Mo.Ta or the like, a SiN film 72 and a $SiO_2$ film 73, which constitute a gate insulating film, and a channel region comprising the same single crystal silicon layer as top gate type MOSTFT, etc. In the dual gate type MOSTFT shown in FIG. 16C, the lower gate portion comprises bottom gate type MOSTFT, and the upper gate portion comprises a $SiO_2$ film and a SiN film, which constitute a gate insulating film 73, and an upper gate electrode provided thereon. However, in any type, each of the gate portions is formed outside the step portion serving as the seed for hetero epitaxial growth and having the function to accelerate growth of the single crystal silicon film and increase the crystallinity thereof.

Next, the method of manufacturing the bottom gate type MOSTFTs will be described with reference to FIGS. 17 to 21, and the method of manufacturing the dual gate type MOSTFTs will be described with reference to FIGS. 22 to 24. The method of manufacturing the top gate type MOST-FTs in the peripheral driving circuit regions is the same as described above with reference to FIGS. 1 to 5, and is thus not shown in the drawings.

Figure 17A:
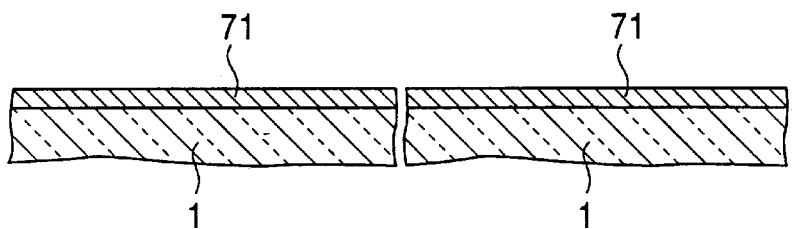
FIG. 17 is a sectional view showing the steps of the LCD manufacturing process.

In order to manufacture the bottom gate type MOSTFTs in the display region, first, as shown in FIG. 17A (Step 1), a sputtered film 71 (thickness 500 to 600 nm) of a molybdenum/tantalum (Mo.Ta) alloy is formed on the substrate.

Figure 17B:
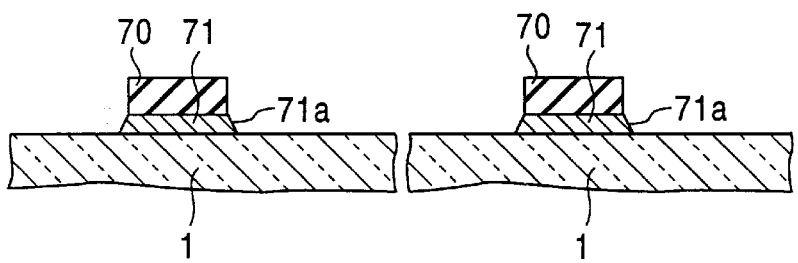

Next, as shown in FIG. 17B (Step 2), photoresist 70 is formed in a predetermined pattern, and then used as a mask for taper-etching the Mo.Ta film 71 to form gate electrodes 71 having side ends 71a which are gently inclined at 20 to 45 degrees to form a trapezoidal shape.

Figure 17C:
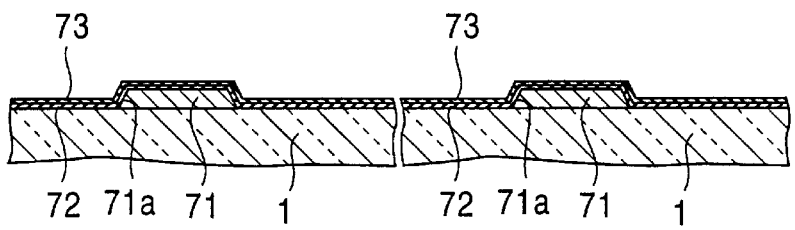

Next, as shown in FIG. 17C (Step 3), after the photoresist 71 is removed, a SiN film (thickness about 100 nm) 72, and a SiO₂ film (thickness about 200 nm) 73 are deposited in this order on the substrate 1 including the molybdenum/tantalum alloy film 71 by the plasma CVD method or the like to form a gate insulating film.

Figure 18A:
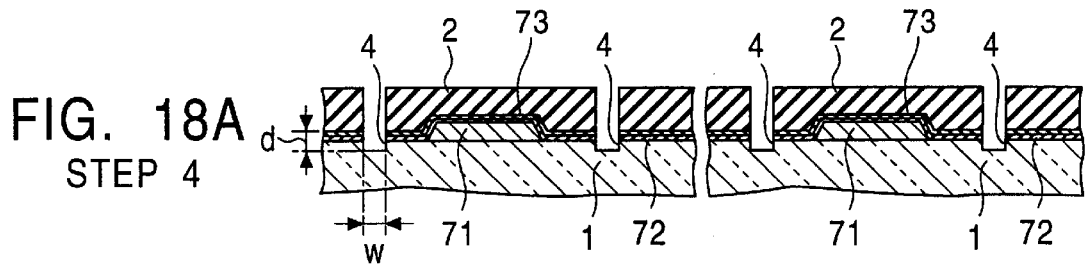
FIG. 18 is a sectional view showing the steps of the LCD manufacturing process.

Next, as shown in FIG. 18A (Step 4), photoresist 2 is formed in a predetermined pattern in at least the TFT forming regions in the same step as shown,in FIG. 1A, and then used as mask for forming a plurality of step portions having appropriate shape and dimensions in the gate insulating film (also in the substrate 1) on the substrate 1 by the same method as described above. The step portions 4 serve as seeds for hetero epitaxial growth of single crystal silicon described below, and have the function to accelerate the growth of the single crystal silicon film and increase the crystallinity thereof. The step portions 4 have a depth d of 0.3 to 0.4 μm, a width w of 2 to 3 μm, a length (in the direction perpendicular to the drawing) of 10 to 20 μm, and an angle (base angle) of 90° formed by the bottom and the side.

Figure 18B:
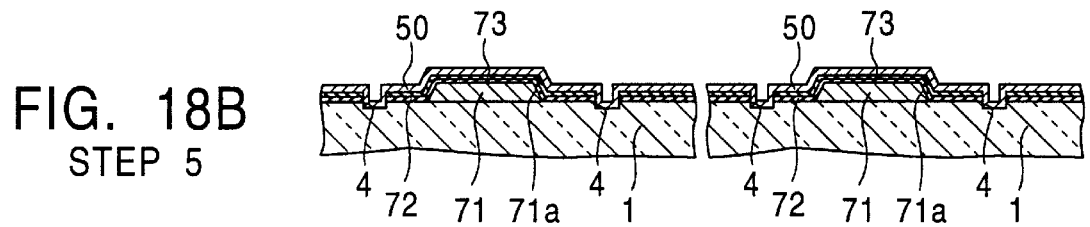

Next, as shown in FIG. 18B (Step 5), after the photoresist 2 is removed, a crystalline sapphire thin film (thickness 20 to 100 nm) 50 is formed in at least the TFT forming regions including the step portions 4 on a main surface of the insulating substrate 1 by the same method as described above in the same step as shown in FIG. 1B

Figure 18C:
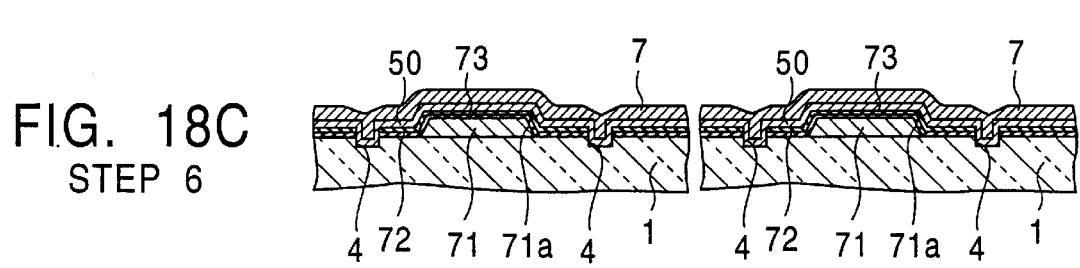

Next, as shown in FIG. 18C (Step 6), single crystal silicon is hetero-epitaxially grown by the same catalytic CVD method as described above in the same step as shown in FIG. 1C to deposit a single crystal silicon layer 7 having a thickness of, for example, about 0.1 μm. In this step, since the side ends 71 of the gate electrodes 71 formed in the under coat are gently inclined, the single crystal silicon layer 7 is continuously grown on the side ends 71a without inhibition to epitaxial growth using the step portions.

Figure 18D:
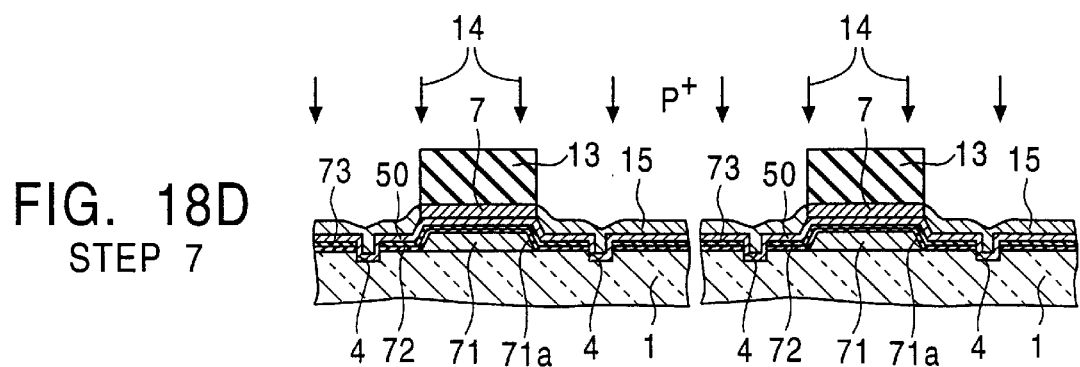

Next, as shown in FIG. 18D (Step 7), the gate portions of nMOSTFTs in the display region are covered with photoresist 13, and the exposed source and drain regions of nMOSTFTs are doped (ion implantation) with phosphorus ions 14 to form LDD portions 15 comprising a N⁺ type layer in self alignment in the same step as shown in FIG. 2C after the steps shown in FIG. 1D to 2B. At this time, differences in surface height (or the pattern) are readily recognized due to the presence of the bottom gate electrodes 71, causing ease in alignment of the photoresist 13 (alignment of the mask), and less deviation in alignment.

Next, as shown in FIG. 19A (Step 8), the gate portions and LDD portions of nMOSTFTs are covered with photoresist 16, and the exposed regions are doped (ion implantation) with phosphorus or arsenic ions 17 to form source portions 18 and drain portions 19 of nMOSTFTs, which comprise a N⁺ type layer, in the same step as shown in FIG. 3A.

Then, as shown in FIG. 19B (Step 9), the entire portions of nMOSTFTs are covered with photoresist 20, followed by doping (ion implantation) with boron ions 21 to form source and drain portions of pMOSTFTs in the peripheral driving circuit regions, which comprise a p⁺ layer, in the same step as shown in FIG. 3B.

Next, as shown in FIG. 19C (Step 10), in order to island the active elements and passive elements, photoresist 24 is provided, and the single crystal silicon thin film is selectively removed by general-purpose photolithography and etching in the same step as shown in FIG. 3C.

Next, as shown in FIG. 19D (Step 11), a SiO₂ film 53 (thickness about 300 nm) and a phosphosilicate glass (PSG) film 54 (thickness about 300 nm) are formed in this order over the entire surface by the plasma CVD, high-density plasma CVD, catalytic CVD, or the like in the same step as shown in FIG. 4A. The SiO₂ film 53 and the PSG film 54 correspond to the above-described protective film 25. In this state, the single crystal silicon film is activated by the same method as described above.

Next, as shown in FIG. 20A (Step 12 ), contact holes are formed in the source portions by general-purpose photolithography and etching in the same step as shown in FIG. 4B. Then, a sputtered film of aluminum is formed to a thickness of 400 to 500 nm over the entire surface, and source electrodes 26 of TFTs, data lines and gate lines are formed by general-purpose photolithography and etching. Then, sintering is carried out in a forming gas at about 400° C. for 1 hour.

Next, as shown in FIG. 20B (Step 13), an insulating film comprising a PSG film (thickness about 300 nm) and SiN film (thickness about 300 nm) is formed over the entire surface by high-density plasma CVD, catalytic CVD, or the like, and contact holes are formed in the drain portions of display TFTs in the same step as shown in FIG. 4C.

Next, as shown in FIG. 20C (Step 14), a photosensitive resin film 28 is formed to a thickness of 2 to 3 μm by spin coating or the like in the same step as shown in FIG. 5A. Then, as shown in FIG. 20D (Step 15), an uneven pattern is formed by general-purpose photolithography and etching to obtain reflection characteristics and viewing angle characteristics optimum for at least the display region, followed by reflowing to form a reflecting lower surface comprising an uneven rough surface 28A. At the same time, contact holes are formed in the drain portions of display TFTS.

Next, as shown in FIG. 20D (Step 15), a sputtered film of aluminum is formed to a thickness of 400 to 500 nm over the entire surface, and uneven aluminum reflecting portions 29 are formed by general-purpose photolithography and etching so as to be connected to the drain portions 19 of display TFTs in the same step as shown in FIG. 5B.

As described above, the active matrix substrate 30 of the type in which the display region and the peripheral driving circuit regions are integrated can be manufactured. In the active matrix substrate 30, the bottom gate type nMOSLDD-TFTs (in the periphery, CMOS driving circuits comprising pMOSTFT and nMOSTFT) are formed in the display region comprising the single crystal silicon layer 7 formed by using the crystalline sapphire thin film 50 and the step portions 4 as seeds for low-temperature hetero epitaxial growth by the catalytic CVD method.

FIG. 21 shows an example in which the gate insulating films of the bottom gate type MOSTFTs in the display region are formed by anodic oxidation of MO.Ta.

Figure 21A:
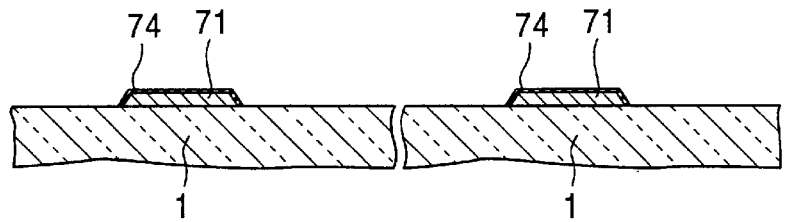
FIG. 21 is a sectional view showing the steps of the LCD manufacturing process.

After the step shown in FIG. 17B (Step 2), as shown in FIG. 21A (Step 3), the molybdenum/tantalum alloy films 71 are subjected to-known anodic oxidation to form gate insulating films 74 comprising Ta₂O₅ to a thickness of 100 to 200 nm on the surfaces thereof.

Figure 21B:
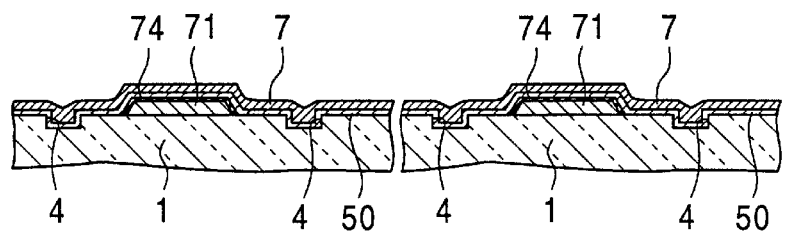
Figure 21C:
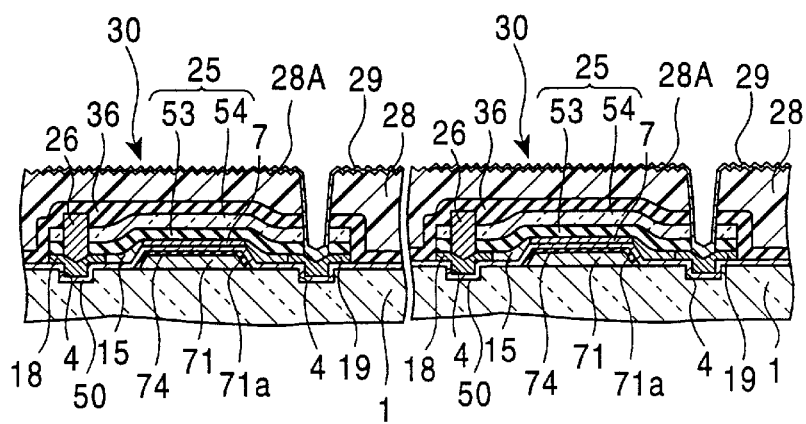

Then, as shown in FIG. 21B (Step 4), the step portions 4 and the crystalline sapphire thin film 50 are formed in the same manner as shown in FIGS. 18A to C, and the single crystal silicon layer 7 is hetero-epitaxially grown by the catalytic CVD method. Then, as shown in FIG. 21C (Step 5), the active matrix substrate 30 is manufactured by the same steps as shown in FIG. 18D to 20D.

Next, in order to produce dual gate type MOSTFTs in the display region, the steps shown in FIG. 17A to 18C are repeated by the same method as described above.

Figure 22A:
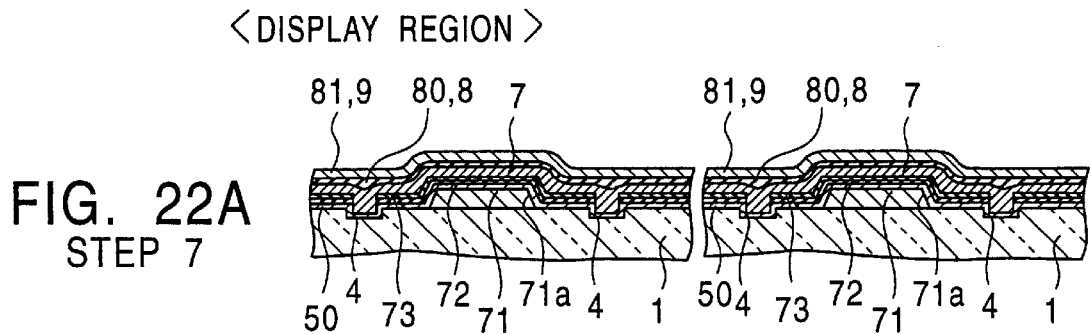
FIG. 22 is a sectional view showing the steps of the LCD manufacturing process.

Namely, as shown in FIG. 22A (Step 7), the step portions 4 are formed in the insulating films 72 and 73, and the substrate 1, and the single crystal silicon layer 7 is hetero-epitaxially grown by using the crystalline sapphire thin film 50 and the step portions 4 as seeds. Then, a SiO$_2$ film (thickness of about 200 nm) and a SiN film (thickness of about 100 nm) are continuously formed in this order over the entire region on the single crystal silicon thin film 7 by plasma CVD, catalytic CVD, or the like to form an insulating film 80 (corresponding to the above insulating film 8), and a sputtered film 81 (thickness of about 500 to 600 nm) (corresponding to the above sputtered film 9) of a Mo.Ta alloy is further formed, in the same step as shown in FIG. 2A.

Figure 22B:
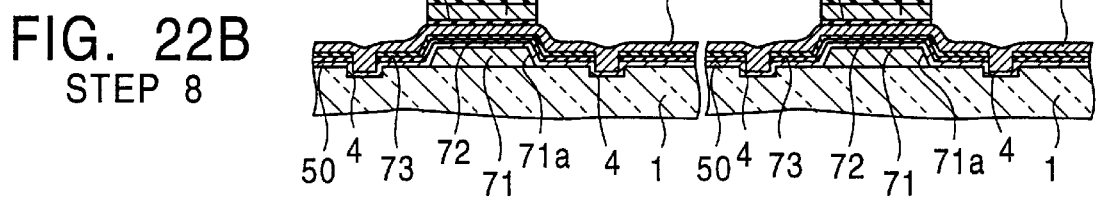

Next, as shown in FIG. 22B (Step 8), a photoresist pattern 10 is formed, and then top gate electrodes 82 (corresponding to the above gate electrodes 12 ) of a Mo.Ta alloy and gate insulating films 83 (corresponding to the above gate insulating films 11) are formed by continuous etching to expose the single crystal silicon thin film 7 in the same step as shown in FIG. 2B.

Figure 22C:
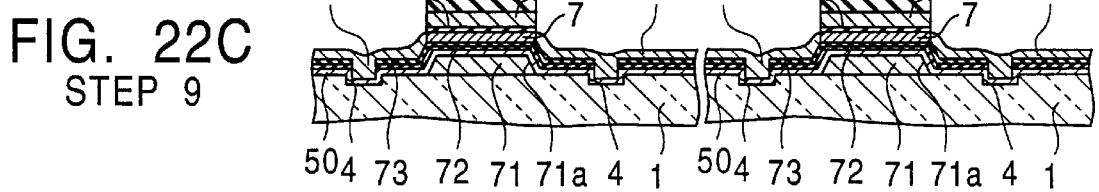

Next, as shown in FIG. 22C (Step 9), the top gate portions of nMOSTFTs are covered with photoresist 13, and the exposed source and drain regions of display nMOSTFTs are doped (ion implantation) with phosphorus ions 14 to form LDD portions 15 comprising a N$^-$ type layer in the same step as shown in 2C.

Figure 22D:
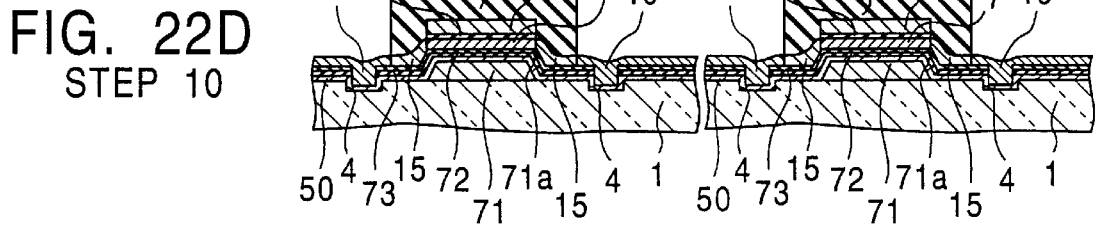

Next, as shown in FIG. 22D (Step 10), the gate portions and LDD portions of nMOSTFTs are covered with photoresist 16, and the exposed regions are doped (ion implantation) with phosphorus or arsenic ions 17 to form the source portions 18 and drain portions 19 of nMOSTFTs, which comprise a N$^+$ type layer, in the same step as shown in FIG. 3A.

Figure 23A:
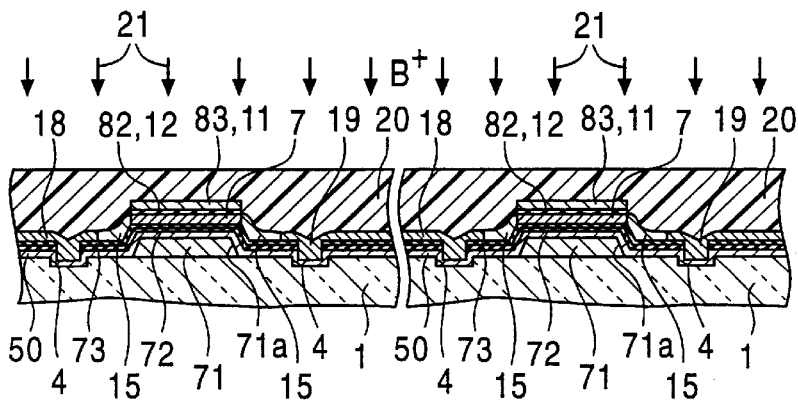
FIG. 23 is a sectional view showing the steps of the LCD manufacturing process.

Then, as shown in FIG. 23A (Step 11), the gate portions of pMOSTFTs are covered with photoresist 20, and the exposed regions are doped (ion implantation) with boron ions 21 to form the P$^+$ layer source and drain portions of pMOSTFTs in the peripheral driving circuit regions in the same step as shown in FIG. 3B.

Figure 23B:
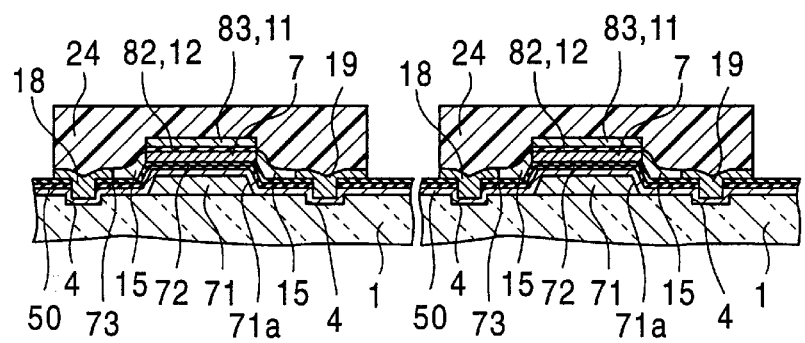

Next, as shown in FIG. 23B (Step 12 ), in order to island the active elements and the passive elements, photoresist 24 is provided, and the single crystal silicon thin film layer is selectively removed by general-purpose photolithography and etching in the same step as shown in FIG. 3C except in the active elements and the passive elements.

Figure 23C:
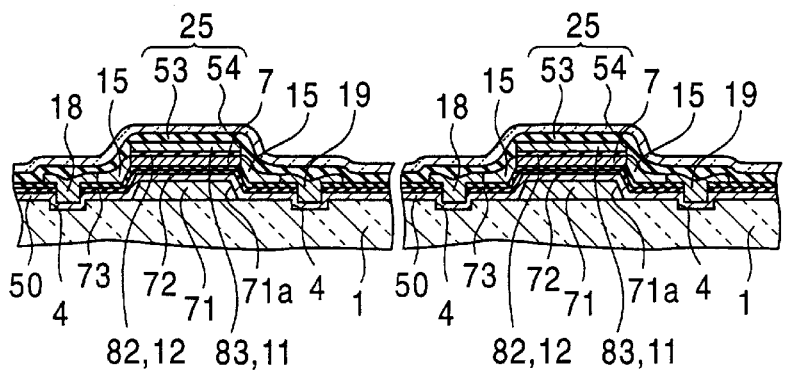

Next, as shown in FIG. 23C (Step 13), a SiO$_2$ film 53 (thickness of about 200 nm) and a phosphosilicate glass (PSG) film 54 (thickness of about 300 nm) are formed over the entire surface by plasma CVD, high-density plasma CVD, catalytic CVD, or the like in the same step as shown in FIG. 4A. These films 53 and 54 correspond to the protective film 25. Then, the single crystal silicon layer is activated.

Figure 23D:
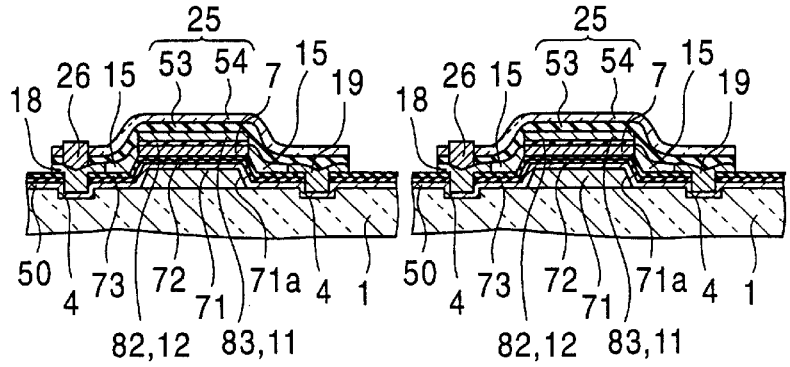

Next, as shown in FIG. 23D (Step 14), contact holes are formed in the source portions in the same step as shown in FIG. 4B. Then, an aluminum sputtered film is formed to a thickness of 400 to 500 nm over the entire surface, and source electrodes 26, data lines and gate lines are formed by general-purpose photolithography and etching.

Figure 24A:
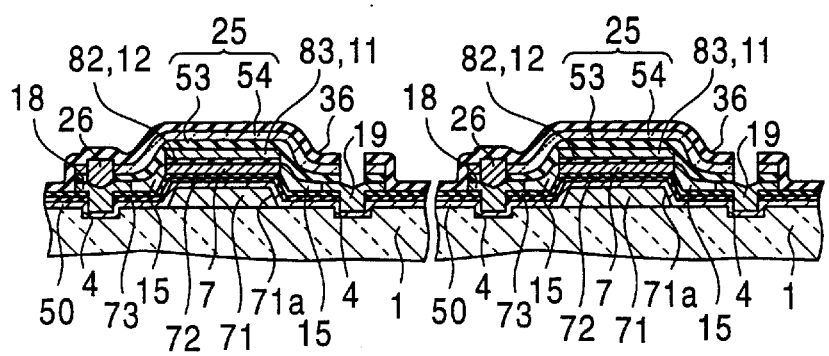
FIG. 24 is a sectional view showing the steps of the LCD manufacturing process.

Next, as shown in FIG. 24A (Step 15), an insulating film 26 comprising a PSG film (thickness of about 300 nm) and a SiN film (thickness of about 300 nm) is formed over the entire surface, and contact holes are formed in the drain portions of display TFTs in the same step as shown in FIG. 4C.

Figure 24B:
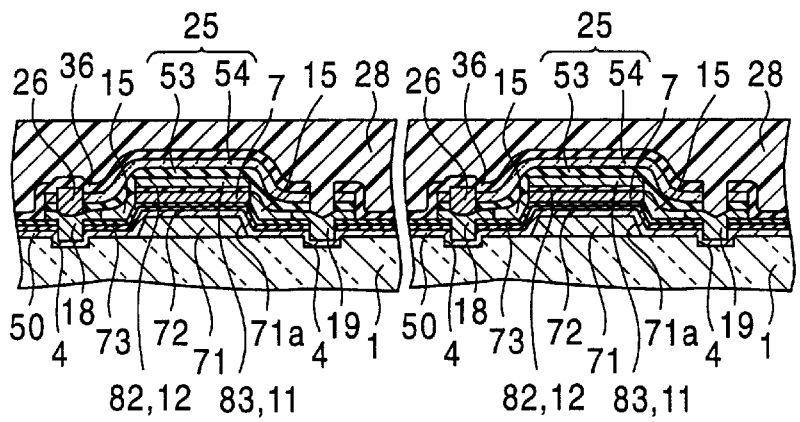
Figure 24C:
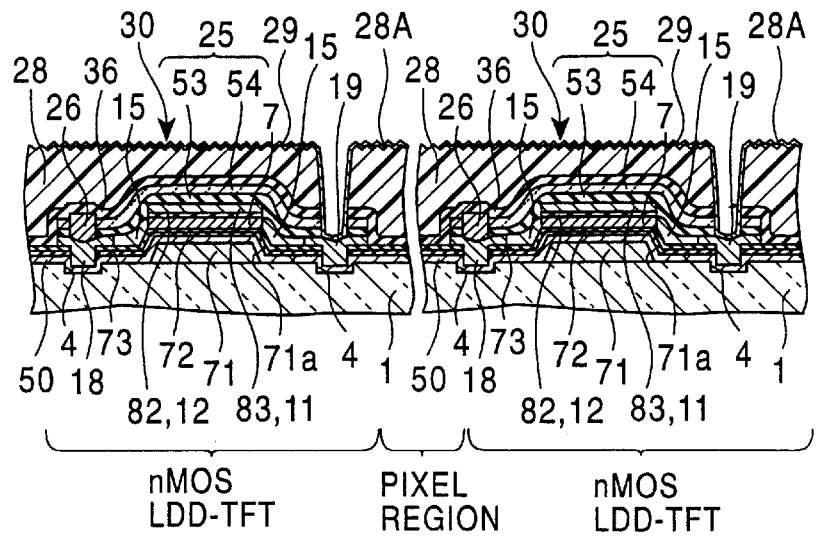

Next, as shown in FIG. 24B (Step 16), a photosensitive resin film 28 is formed to a thickness of 2 to 3 µm over the entire surface by spin coating or the like. Then, as shown in FIG. 24C (Step 17), a reflecting lower surface comprising an uneven rough surface 28A is formed at least in the display region, and at the same time, contact holes are formed in the drain portions of display TFTs in the same steps as shown in FIGS. 5B and 5C. Furthermore, in order to obtain optimum reflection characteristics and viewing angle characteristics, uneven aluminum reflecting portions 29 are formed to be connected to the drain portions 19 of display TFTsAs.

As described above, the active matrix substrate 30 of the type in which the display region and the peripheral driving circuit regions are integrated can be manufactured. In the substrate 30, the single crystal silicon layer 7 formed by the catalytic CVD method using the crystalline sapphire thin film 50 and the step portions as seeds for hetero epitaxial growth is used for forming the dual gate type nMOSLDD-TFTs in the display regions, and the CMOS driving circuits comprising pMOSTFTs and nMOSTFTs in the peripheral driving circuit regions.

Fourth Embodiment

FIGS. 25 to 30 show a fourth embodiment of the present invention.

Unlike the above-described embodiments, in this embodiment, gate electrodes of the top pate portions are formed by using a material with relatively low heat resistance, such as aluminum or the like.

First, when top gate type MOSTFTs are provided in both the display region and the peripheral driving circuit regions, the steps shown in FIGS. 1A to 1D in the first embodiment are repeated, and as shown in FIG. 25A (Step 4), N-type wells 7A are formed in pMOSTFTs of the peripheral driving circuit regions.

Next, as shown in FIG. 25B (Step 5), the entire portions of NMOS and pMOSTFTs in the peripheral driving regions, and the gate portions of nMOSTFTs in the display region are covered with photoresist 13, and the exposed source and drain regions in nMOSTFTs are doped (ion implantation) with phosphorus ions 14, for example, at 20 kV in a dosage of $5 \times 10^{13}$ atoms/cm$^2$ to form LDD portions 15 comprising a N$^-$ type layer in self alignment.

Next, as shown in FIG. 26A (Step 6), the entire portions of pMOSTFTs in the peripheral driving circuit regions, and the gate portions of nMOSTFTs in the peripheral driving circuit regions, and the gate and LDD portions of nMOSTFTs in the display region are covered with photoresist 16, and the exposed regions are doped (ion implantation) with phosphorus or arsenic ions 17, for example, at 20 kV in a dosage of $5 \times 10^{15}$ atoms/cm$^2$ to form source portions 18 and drain portions 19 of nMOSTFTs, which comprise a N$^+$ type layer. In this case, the resist 13 is left as shown by a phantom line, and the resist 16 is provided to cover the remaining resist 13 so that the mask for forming the resist 16 can be aligned by using the resist 13 as a measure, thereby facilitating mask alignment and causing less deviation in alignment.

Next, as shown in FIG. 26B (Step 7), the entire portions of nMOSTFTs in the peripheral driving circuit regions, and the entire portions of nMOSTFTs and the gate portions of pMOSTFTs in the display region are covered with photoresist 20, and the exposed regions are doped (ion implantation) with boron ions 12, for example, at 10 kV in a dosage of $5 \times 10^{15}$ atoms/cm$^2$ to form source portions 22 and drain portions 23 of pMOSTFTs, which comprise a P$^+$ type layer.

Next, as shown in FIG. 26C (Step 8), after the resist 20 is removed, the single crystal silicon layer 7 (7A) is activated by the same method as described above, and a gate insulating film 12 and a gate electrode material (aluminum or aluminum containing 1% Si) 11 are further formed on the surface. The gate electrode material layer 11 can be formed by vacuum deposition or sputtering.

Next, the gate portions are formed by pattering, and then the active elements and the passive elements are islanded by the same method as described above. Then, as shown in FIG. 27A (Step 9), a SiO$_2$ film (thickness of about 200 nm) and a phosphosilicate glass (PSG) film (thickness of about 300 nm) are continuously formed in this order to form a protective film 25.

Next, as shown in FIG. 27B (Step 10), contact holes are formed in the source and drain portions of all TFTs in the peripheral driving circuit regions, and the source portions of display TFTs by general-purpose photolithography and etching.

Then, a sputtered film of aluminum or aluminum containing 1% Si is formed to a thickness of 500 to 600 nm over the entire surface, and source electrodes 26 of all TFTs in the peripheral driving circuit regions and the display region, and drain electrode 27 in the peripheral driving circuit regions are formed by general-purpose photolithography and etching, and at the same time, data lines and gate lines are formed. Then, sintering is performed in a forming gas (N$_2$+H$_2$) at about 400° C. for 1 hour.

Next, the steps shown in FIGS. 4C to 5B are repeated to manufacture an active matrix substrate 30 of the type in which the display and the peripheral driving circuit regions are integrated. In the active matrix substrate 30, top gate type nMOSLDD-TFTs and the CMOS driving circuits comprising pMOSTFT and nMOSTFT are formed by using aluminum or aluminum containing 1% of Si in each of the display region and the peripheral driving circuit regions comprising the single crystal silicon layer 7.

In this embodiment, since the gate electrodes 11 made of aluminum or aluminum containing 1% of Si are formed after the single crystal silicon layer 7 is activated, the effect of activation heat is irrelevant to the heat resistance of the gate electrode material. Therefore, relatively low-heat-resistant and low-cost aluminum or aluminum containing 1% of Si can be used as the top gate electrode material, thereby widening the selection range of electrode materials. This applies to bottom gate type nMOSTFTs in the display region.

Where dual gate type MOSTFTs are provided in the display region, and top gate type MOSTFTs are provided in the peripheral driving circuit regions, the steps shown in FIGS. 17A to 18C of the third embodiment are repeated, and then N-type wells 7A are formed in pMOSTFTs in the peripheral driving circuit regions, as shown in FIG. 28A (Step 5).

Next, as shown in FIG. 28B (Step 6), TFTs in the display region are doped with phosphorus ions 14 to form LDD portions 15 by the same method as shown in FIG. 25B.

Next, as shown in FIG. 29A (Step 8), nMOSTFTs in the display region and the peripheral driving circuit region are doped with phosphorus ions 17 to form N$^+$ type source regions 18 and drain regions 19 by the same method as shown in FIG. 26A.

Next, as shown in FIG. 29B (Step 9), pMOSTFTs in the peripheral driving circuit region are doped with boron ions 21 to form P$^+$ type source regions 22 and drain regions 23 by the same method as shown in FIG. 26B.

Next, as shown in FIG. 29C (Step 10), after the resist 20 is removed, the single crystal silicon layer 7 is patterned to island the active elements and the passive elements. Then, as shown in FIG. 30A (Step 11), the single crystal silicon layer 7 (7A) is activated by the same method as described above, and gate insulating films 80 and 12 are further formed on the surface of the display region and the peripheral driving circuit region, respectively.

Next, as shown in FIG. 30B (Step 12), an aluminum film formed over the entire surface by sputtering is patterned to form upper gate electrodes 83 in the display region and gate electrodes 11 in the peripheral driving circuit region.

Next, as shown in FIG. 30C (Step 13), a SiO$_2$ film (thickness of about 200 nm) and a phosphosilicate glass (PSG) film (thickness of about 300 nm) are continuously formed in this order over the entire surface to form a protecting film 25.

Next, source electrodes 26 of all TFTs in the peripheral driving circuit region and the display region, and drain electrodes 27 in the peripheral driving circuit region are formed to manufacture an active matrix substrate 30 of the type in which the display region and the peripheral driving circuit regions are integrated. In the active matrix substrate 30, the dual gate type nMOSLDD-TFTs, and the CMOS driving circuits comprising pMOSTFT and nMOSTFT are formed by using aluminum or the like for the gate electrodes in the display region and the peripheral driving circuit region, respectively, which comprise the single crystal silicon layer 7.

In this embodiment, since the gate electrodes 11 and 83 made of aluminum or the like are formed after the single crystal silicon layer 7 is activated, the effect of activation heat is irrelevant to the heat resistance of the gate electrode material, and thus low-cost aluminum or the like having relatively low heat resistance can also be used as material for the top gate electrodes, thereby widening the selection range. In the step shown in FIG. 30A (Step 11), the source electrodes 26 (further the drain electrodes) can be simultaneously formed. This has an advantage for manufacturing.

Figure 31A:
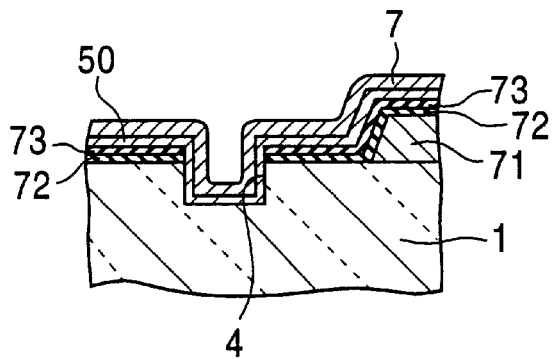
FIG. 31 is a sectional view showing a principal portion in the manufacture the same LCD.
Figure 31B:
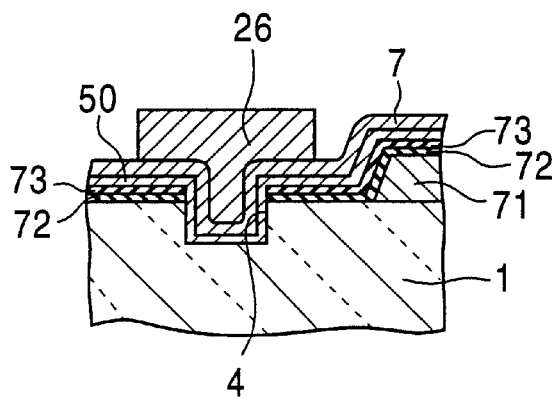
Figure 31C:
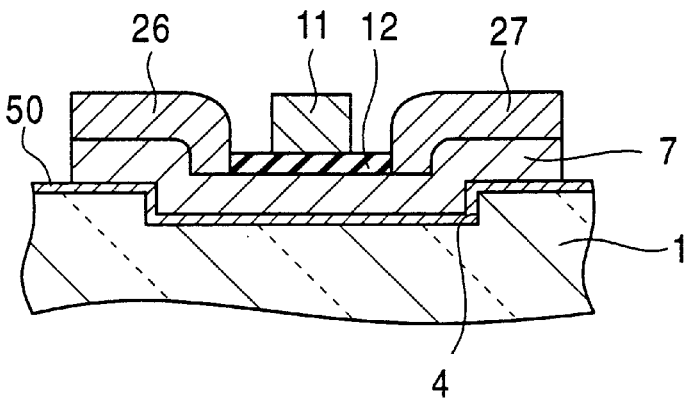

In each of the above embodiments, for example, in manufacturing bottom gate type or top gate type MOSTFTs, when the step portions 4 are provided as schematically shown in FIG. 31A, discontinuity (connection defect) or thinning (increase in resistance) occurs due to the small thickness of the single crystal silicon film 7 grown on the step portions. Therefore, in order to securely achieve connection to the source electrodes 26 (or the drain electrodes), the electrodes are preferably formed above regions including the step portions, as shown in FIGS. 31B and 31C.

In the step shown in FIG. 25B or 28B, ion implantation and activation are carried out after the top gate insulating film is formed on the single crystal silicon layer 7, and then the top age electrodes and source and drain electrodes 27 may be simultaneously formed by using aluminum.

Figure 32A:
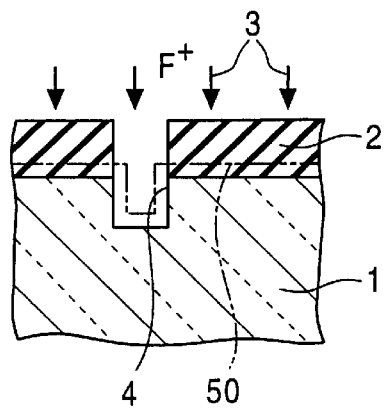
FIG. 32 is a sectional view showing a principal portion in the manufacture of the same LCD.
Figure 32B:
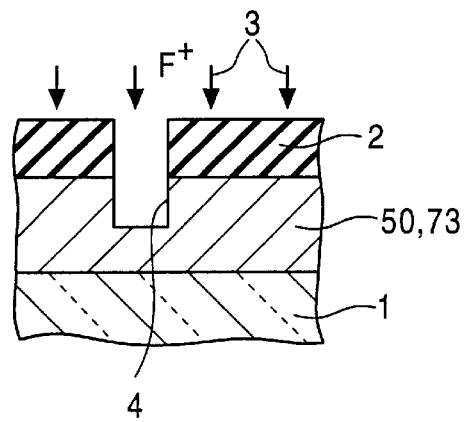
Figure 32C:
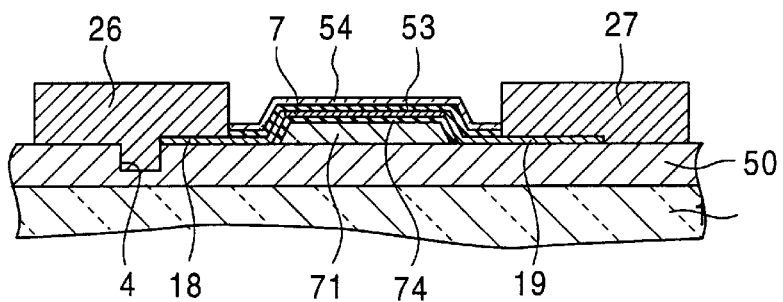
Figure 32D:
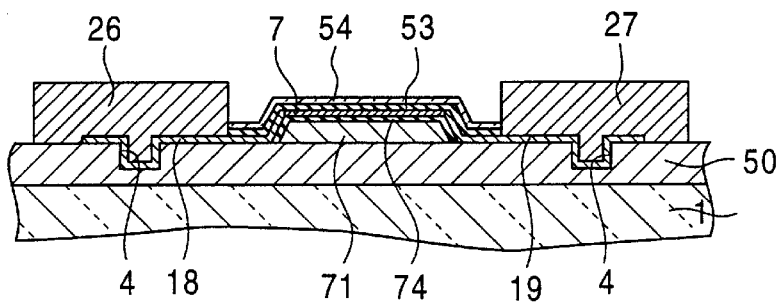
Figure 32E:
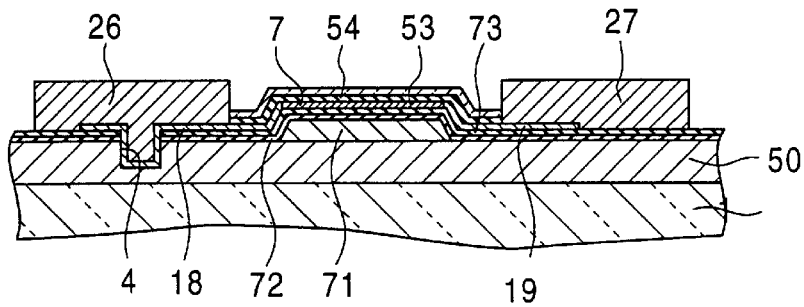

Although, in the above embodiments, the step portions 4 are formed in the substrate 1 (further in the SiN film formed thereon), as shown in FIG. 32A, the step portions can be formed in the crystalline sapphire thin film 50 formed on the substrate 1, as shown in FIG. 32B, because the crystalline sapphire thin film 50 has the function to stop ion diffusion from the glass substrate 1. The step portions 4 may be formed in the gate insulating films 72 and 73 which are provided in place of the crystalline sapphire thin film 50 or below it. FIGS. 32C, 32D and 32E show examples in which the step portions 4 are provided in the crystalline sapphire thin film 50.

Fifth Embodiment

Figure 35A:
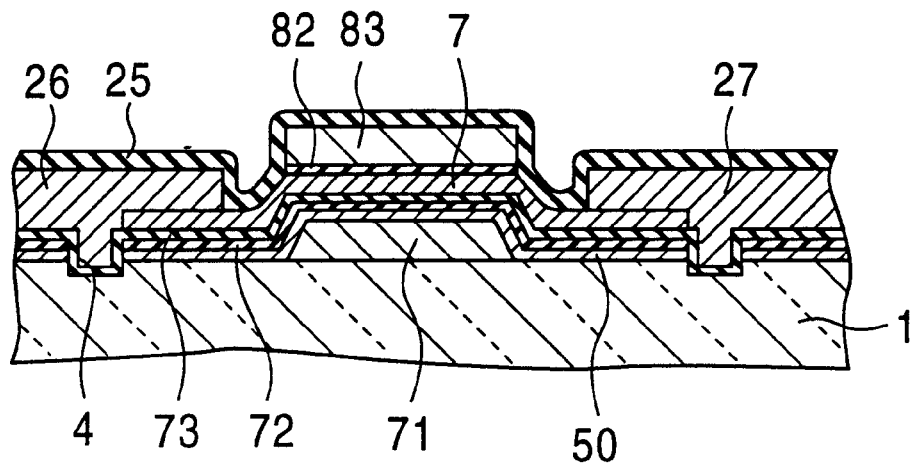
FIG. 35 is a sectional view showing a principal portion the same LCD.
Figure 35B:
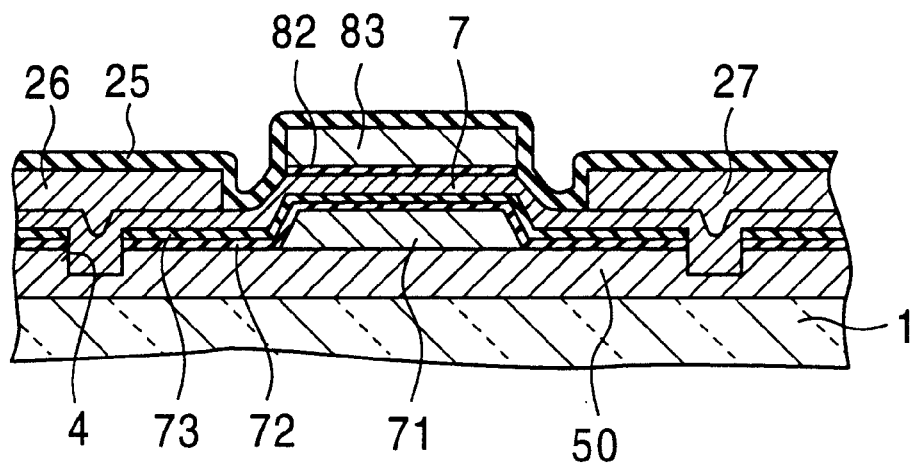

FIGS. 33 to 35 show a fifth embodiment of the present invention.

This embodiment shows various examples in which TFT is formed outside of each of the step portions 4 (i.e., on the substrate 1 excluding the step portions 4). The single crystal silicon layer 7 and gate/source/drain electrodes 26 and 27 are briefly shown in the drawings.

FIG. 33 shows top gate type TFT. FIG. 33A shows an example in which the recess 4 formed by the step portion is formed on the source side along the source region, and the gate insulating film 12 and the gate electrode 11 are formed on the single crystal silicon layer 7 on the flat surface of the substrate excluding the recess. Similarly, FIG. 33B shows an example in which the recess 4 due to the step portion is formed in a L-shaped pattern up to the end of the drain region along not only the source region but also the length direction of the channel, i.e., along two sides. FIG. 33C shows an example in which the recess 4 is formed in a rectangular shape along four sides to surround the TFT active region. FIG. 33D is an example in which the recess 4 is formed along three sides, and FIG. 33E shows an example in which the recess 4 is formed in a L-shaped pattern along two sides. In all examples, the adjacent recesses 4 are discontinuous.

In this way, the recesses 4 can be formed in various patterns, and TFT is provided on the flat surface excluding the recesses 4, thereby facilitating manufacture of TFT.

FIG. 34 shows bottom gate type MOSTFT. In this case, the step portions (or the recesses) 4 can also be formed in the various patterns shown in FIG. 33. Namely, FIG. 34A shows an example corresponding to FIG. 33A, in which bottom gate type MOSTFT is formed on the flat surface excluding the recesses 4 formed by the step portions. Similarly, FIGS. 34B and 34C show examples corresponding to FIG. 33B and FIGS. 33C and D, respectively. FIG. 34D shows an example in which the step portions 4 are provided in the crystalline sapphire thin film 50.

Figure 33A:
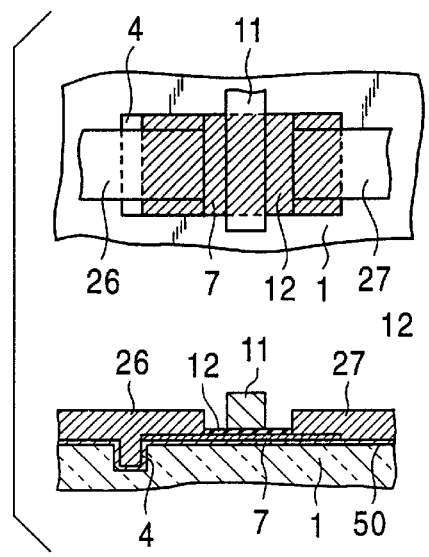
FIG. 33 is a plan view or sectional view showing various TFTs of LCD in accordance with a fifth embodiment of the present invention.
Figure 33B:
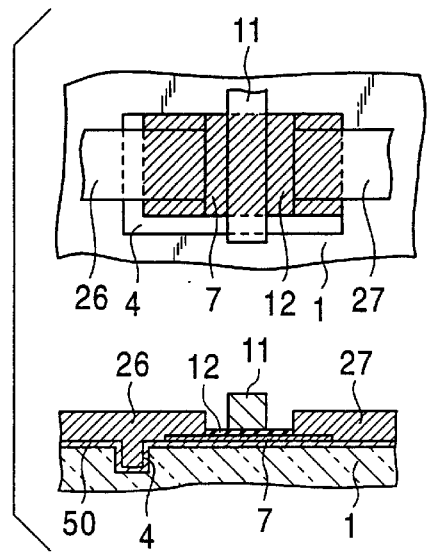
Figure 33C:
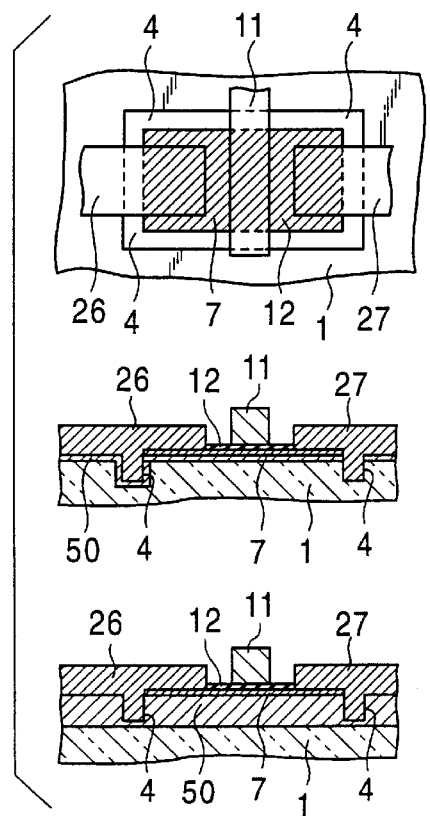
Figure 33D:
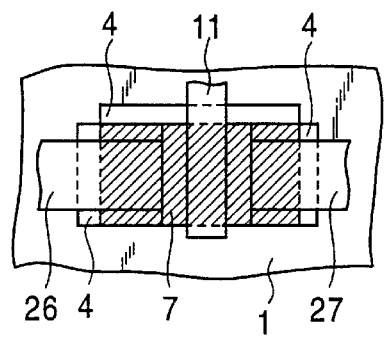
Figure 33E:
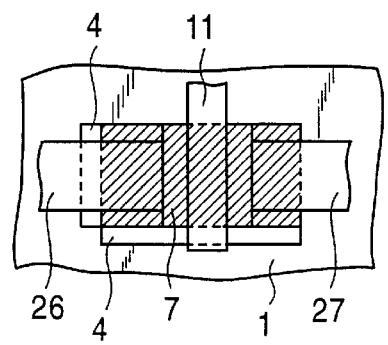
Figure 34A:
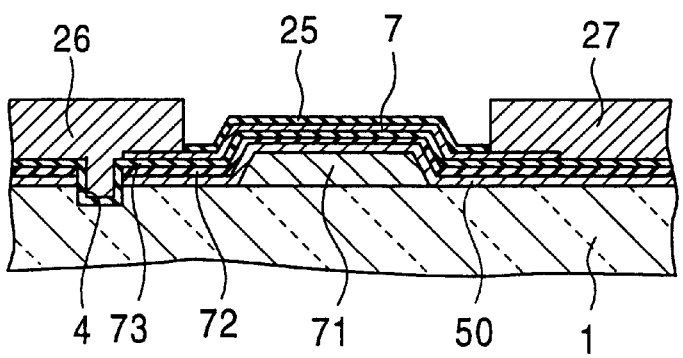
FIG. 34 is a sectional view showing various TFTs in the manufacture of the same LCD.
Figure 34B:
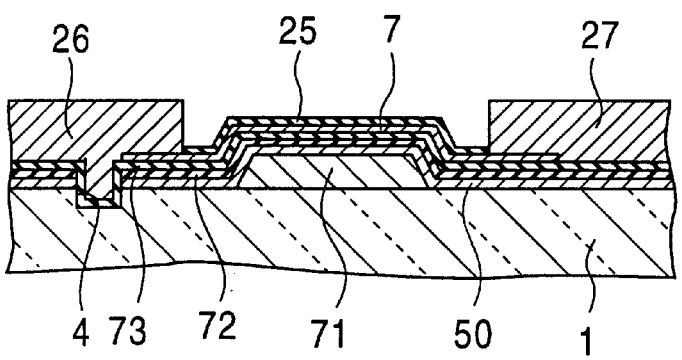
Figure 34C:
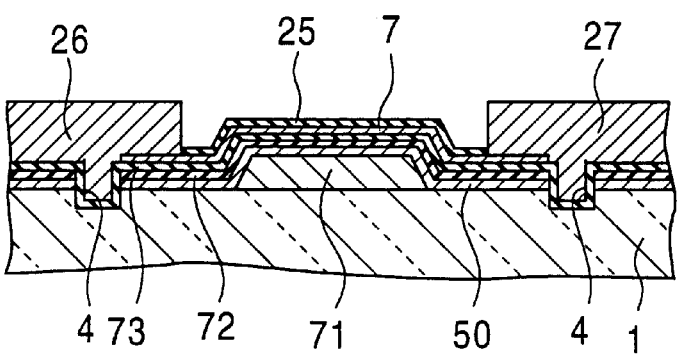
Figure 34D:
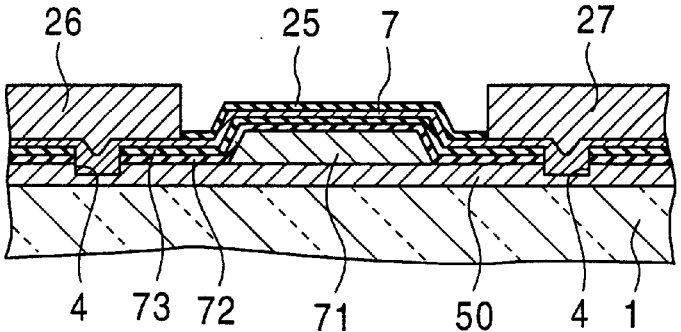

FIG. 35 shows the case of dual gate type MOSTFT. In this case, the step portions (or the recesses) 4 can also be formed in the various patterns shown in FIG. 33. For example, as shown in FIG. 33C, dual gate MOSTFT can be manufactured on the flat surface of the region surrounded by the step portion 4.

Sixth Embodiment

Figure 37A:
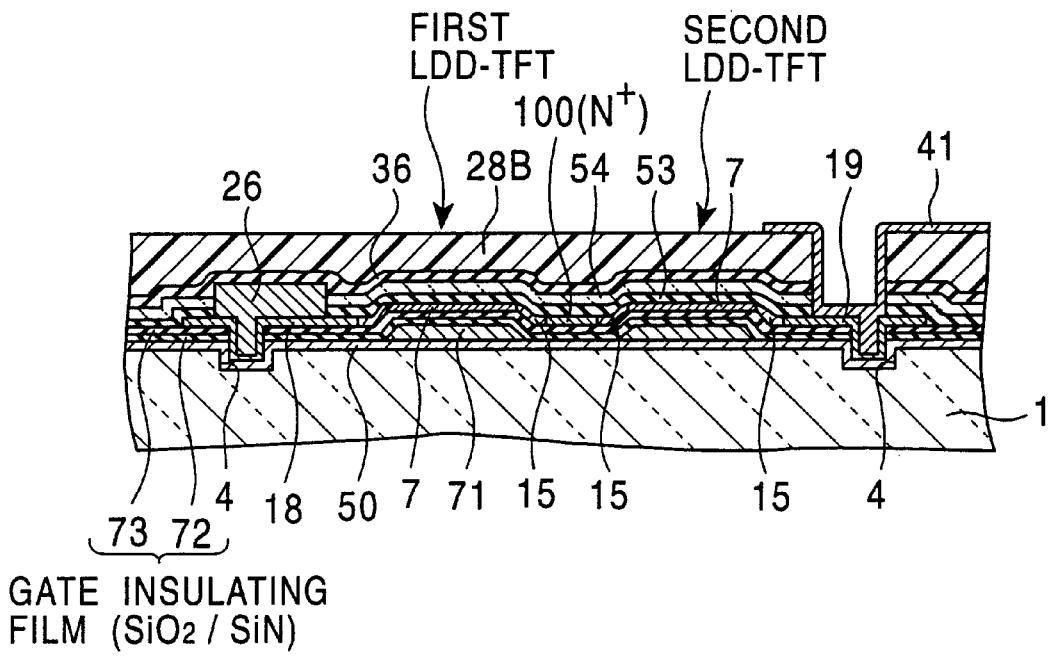
FIG. 37 is a sectional view showing principal portions of various TFTs of the same LCD.
Figure 37B:
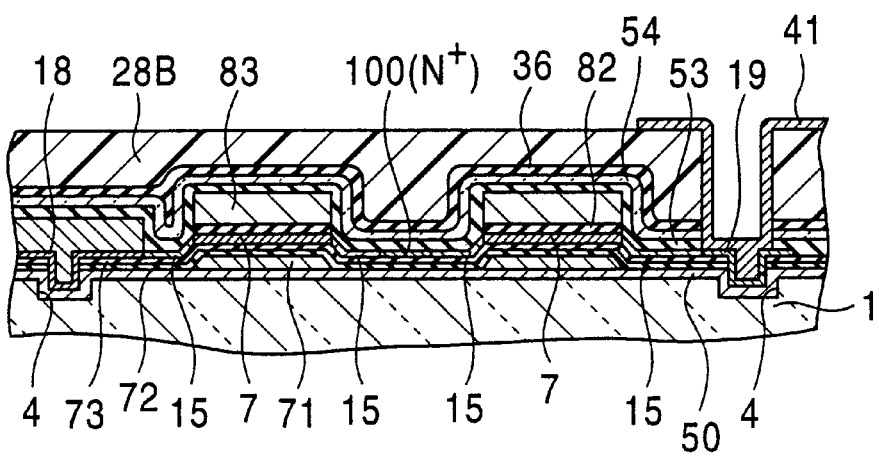
Figure 38A:
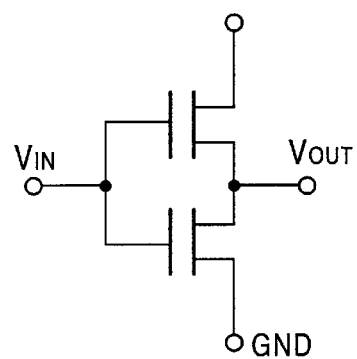
FIG. 38 is a drawing showing equivalent circuits of TFTs of the same LCD.
Figure 38B:
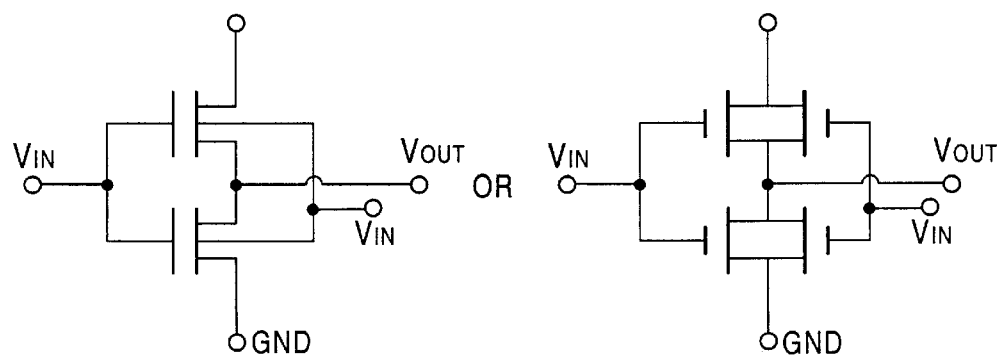

FIGS. 36 to 38 show a sixth embodiment of the present invention.

FIG. 36 shows an example of double gate type MOSTFT in which a plurality of self alignment LDD structure TFTS, for example, top gate type LDD-TFTs, are connected.

In this example, a gate electrode 11 is branched into two portions one of which is used as a first gate for first LDD-TFT, the other being used as a second gate for second LDD-TFT (however, a N+ type region 100 is provided between gate electrodes in the central portion of the single crystal silicon layer to decrease resistance). In this case, different voltages may be applied to the gates, and even if one of the gates becomes inoperable due to any cause, the other gate can be used for moving carriers between the source and drain, providing a device with high reliability. Since the first LDD-TFT and second LDD-TFT are connected in series to form a thin film transistor for driving each of the pixels, in an off state, the voltage applied between the source and drain of each thin film transistor can be significantly decreased. Therefore, it is possible to decrease a leak current flowing in an off state, and improve contrast and image quality of a liquid crystal display. In addition, since the two LDD transistors are connected by using only the same semiconductor layer as the low-concentration drain region of the above-described LDD transistor, the connection distance between the respective transistors can be decreased, and the required area is not increased even if two LDD transistors are connected. The first and second gate can also be completely separated and independently operated.

FIG. 37 shows examples including an example in which bottom gate type MOSTFT has a double gate structure (FIG. 37A), and an example in which dual gate type MOSTFT has a double gate structure (FIG. 37B).

Although these double gate type MOSTFTs have the same advantages as the top gate type, the dual gate type further has the advantage that even if one of the upper and lower gate portions becomes inoperable, the other gate portion can be used.

FIG. 38 shows an equivalent circuit of each of the above-described double gate type MOSTFTs. Although, in the above examples, the gate is branched into two portions, the gate may be divided into at least three portions. In such a double gate or multi-gate structure, at least three branched gate electrodes at the same potential may be provided in the channel region, or divided gate electrode at different potentials or the same potential may be provided.

Seventh Embodiment

FIG. 39 shows a seventh embodiment of the present invention in which in dual gate structure MOSTFT, one of the upper and lower gate portions is operated as a transistor, and the other is operated as described below.

Figure 39A:
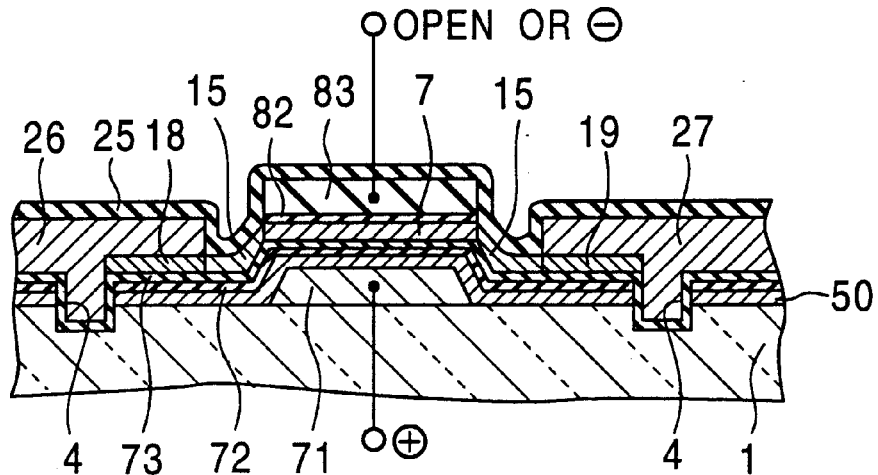
FIG. 39 is a sectional view showing a principal portion of TFT of LCD in accordance with a seventh embodiment of the present invention.
Figure 39B:
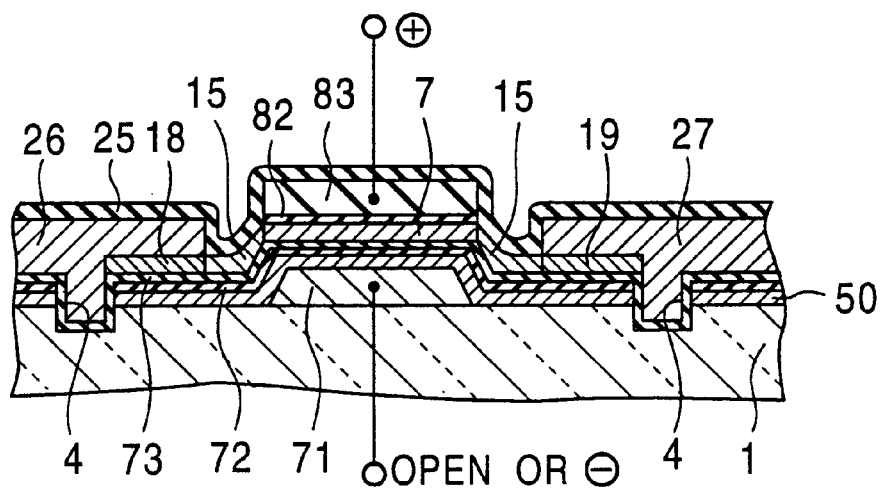

Namely, FIG. 39A shows a case in which in nMOSTFT, any desired negative voltage is applied to the gate electrode of the top gate side to decrease a leak current of the back channel. When the top gate electrode is open, nMOSTFT is used as the bottom gate type. FIG. 39B shows a case in which any desired negative voltage is applied to the gate electrode of the bottom gate side to decrease a leak current of the back channel. In this case, when the bottom gate electrode is open, nMOSTFT is used as the top gate type. In the case of pMOSTFT, any desired positive voltage is applied to the gate electrode to decrease a leak current of the back channel.

In any case, although the interface between the single crystal silicon layer 7 and the insulating film has low crystallinity, and a leak current readily flows, the leak current can be cut off by applying a negative voltage to the electrode, as described above. This is advantageous in combination with the effect of the LDD structure. Although a leak current also flows due to incident light from the glass substrate side, the bottom gate electrode can cut off light to decrease the leak current.

Eighth Embodiment

FIGS. 40 to 45 show an eighth embodiment of the present invention.

This embodiment relates to an active matrix reflective liquid crystal display device (LCD) in which the step portions (recesses) are not provided in the substrate, and the material layer (for example, a crystalline sapphire film) is formed on the flat surface of the substrate, and used as a seed for hetero epitaxial growth of a single crystal silicon layer by the catalytic CVD method so that top gate type MOSTFTs are formed by using the single crystal silicon layer.

The process for manufacturing the active matrix reflective LCD in accordance with this embodiment will be described below with reference to FIGS. 40 to 45. However, in each of FIGS. 40 to 44, the process for manufacturing the display region is shown on the left side, and the process for manufacturing the peripheral driving circuit region is shown on the right side.

First, as shown in FIG. 40A (Step 1), a crystalline sapphire thin film (thickness of 20 to 200 nm) 50 is formed in at least the TFT forming regions on a main surface of an insulating substrate 1 made of borosilicate glass, quartz glass, transparent crystalline glass, or the like. The crystalline sapphire thin film 50 is formed by oxidizing trimethylaluminum gas with an oxidizing gas (oxygen or water) by the high-density plasma CVD method, catalytic CVD method (refer to Japanese Unexamined Patent Publication No. 63-40314), or the like, and crystallizing it. As the insulating-substrate 1, a highly heat-resistant glass substrate (8 to 12 inches Ø, 700 to 800 μm thick) can be used.

Next, as shown in FIG. 40B (Step 2), a single crystal silicon layer 7 is hetero-epitaxially grown to a thickness of 0.005 μm to several μm for example, 0.1 μm) by the catalytic CVD method (the substrate temperature 200 to 800° C.) in the same manner as shown in FIG. 1C. With the insulating substrate 1 made of borosilicate glass, the substrate temperature is 200 to 600° C., while with the insulating substrate 1 made of quartz glass, crystalline glass or ceramic, the substrate temperature is 600 to 800° C.

Since the crystalline sapphire film 50 exhibits good lattice matching with single crystal silicon, in the single crystal silicon layer 7 deposited as described above, (100) plane is hetero-epitaxially grown on the substrate.

After the single crystal silicon layer 7 is deposited on the substrate 1 by the catalytic CVD method and hetero epitaxial growth, top gate type MOSTFTs are manufactured by using the single crystal silicon layer 7 for the channel regions.

The whole surface of the single crystal silicon thin film 7, which is formed by epitaxial growth, is doped with an appropriate amount of P-type carrier impurity, for example, boron ions, to control resistivity. Only the pMOSTFT forming regions are selectively doped with a N-type carrier impurity to form N-type wells. For example, the p-channel TFT portions are masked with photoresist (not shown), followed by doping with P-type impurity ions (for example, $B^+$) at 10 kV in a dosage of $2.7 \times 10^{11}$ atoms/cm$^2$ to control resistivity. As shown in FIG. 40C, in order to control the impurity concentration of the pMOSTFT forming regions, the nMOSTFT portions are masked with photoresist 60, followed by doping with N-type impurity ions (for example, $P^{30}$) 65 at 10 kV in a dosage of $1 \times 10^{11}$ atoms/cm$^2$ to form N-type wells 7A.

Next, as shown in FIG. 41A (Step 4), SiO$_2$ (thickness of about 200 nm) and SiN (thickness of about 100 nm) are continuously formed in this order over the entire surface of the single crystal silicon thin film layer 7 by plasma CVD, high-density plasma CVD, catalytic CVD, or the like to form a gate insulating film 8. Furthermore, a sputtered film 9 (thickness of 500 to 600 nm) of a molybdenum/tantalum (Mo.Ta) alloy is formed.

Next, as shown in FIG. 41B (Step 5), a photoresist pattern 10 is formed in each of the step regions (in the recesses) of TFTs in the display region and the peripheral driving region by general-purpose photolithography, and gate electrode 11 and gate insulating films (SiN/SiO$_2$) 12 of (Mo.Ta) alloy are formed by continuous etching to expose the single crystal silicon thin film layer 7. The (Mo.Ta) alloy film 9, SiN and SiO$_2$ are treated with an acidic etchant, CF$_4$ by plasma etching, and a hydrofluoric acid etchant, respectively.

Next, as shown in FIG. 41C (Step 6), the entire portions of nMOS and pMOSTFTs in the peripheral driving region, and the gate portions of nMOSTFTs in the display region are covered with photoresist 13, and the exposed source and drain regions of nMOSTFTs are doped (ion implantation) with phosphorus ions 14, for example, at 20 kV in a dosage of $5 \times 10^{13}$ atoms/cm$^2$ to form LDD portions 15 comprising a N$^-$ type layer in self alignment.

Next, as shown in FIG. 42A (Step 7), the entire portions of pMOSTFTs in the peripheral driving region, the gate portions of nMOSTFTs in the peripheral driving region, and the gate portions and LDD portions of nMOSTFTs in the display region are covered with photoresist 16, and the exposed regions are doped (ion implantation) with phosphorus or arsenic ions 17, for example, at 20 kV in a dosage of $5 \times 10^{15}$ atoms/cm$^2$ to form source portions 18, drain portions 19 and LDD portions 15 of nMOSTFTS, which comprise a N$^+$ type layer.

Then, as shown in FIG. 42B (Step 8), the entire portions of nMOSTFTs in the peripheral driving region, and the entire portions of nMOSTFTs and the gate portions of pMOSTFTs in the display region are covered with photoresist 20, and the exposed regions are doped (ion implantation) with boron ions 21, for example, at 10 kV in a dosage of $5 \times 10^{15}$ atoms/cm$^2$ to form P$^+$ layer source portions 22 and drain portions 23 of pMOSTFTs. In the case of the nMOS peripheral driving circuits, this work is unnecessary because of the absence of pMOSTFTs.

Next, as shown in FIG. 42C (Step 9), in order to island the active elements such as TFT, diode, and the like, and the passive elements such as resistors, inductors, and the like, photoresist 24 is provided, and the single crystal silicon thin film layer is removed by general-purpose photolithography and etching except in all the active elements and passive elements of the peripheral driving region and the display region. As the etchant, a hydrofluoric acid type is used.

Figure 43A:
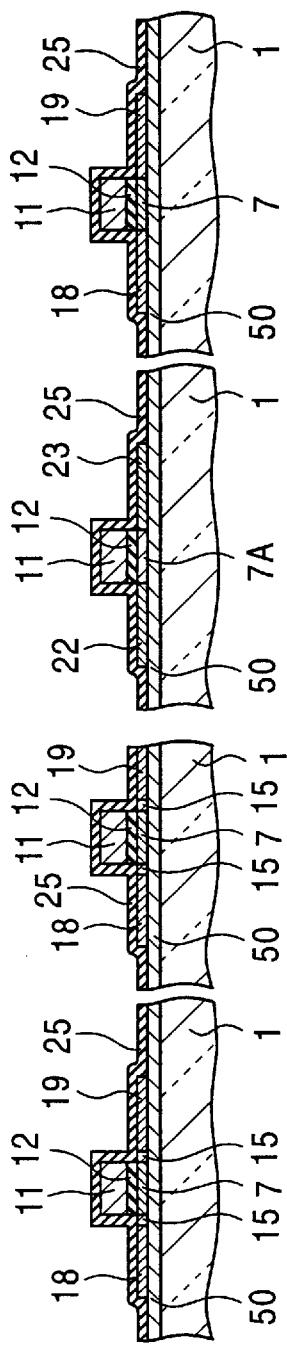
FIG. 43 is a sectional view showing the steps of the same LCD manufacturing process.

Next, as shown in FIG. 43A (Step 10), a SiO$_2$ film (thickness of about 200 nm) and a phosphosilicate glass (PSG) film (thickness of about 300 nm) are continuously formed in this order over the entire surface to form a protecting film 25 by plasma CVD, high-density plasma CVD, catalytic CD, or the like.

Then, in this state, the single crystal silicon layer is activated. In this activation, annealing conditions of a halogen lamp or the like include about 1000° C. and about 10 seconds, and a gate electrode material resistant to these conditions is required. However, a high-melting-point Mo.Ta alloy is suitable. Therefore, this gate electrode material can be provided not only in the gate portions but also as wiring over a wide range. Although this embodiment does not use, expensive excimer laser annealing, if excimer laser annealing is used, overlap scanning of 90% or more is preferably performed over the entire region or selectively only in the active elements and the passive elements by XeCl (wavelength of about 308 nm).

Figure 43B:
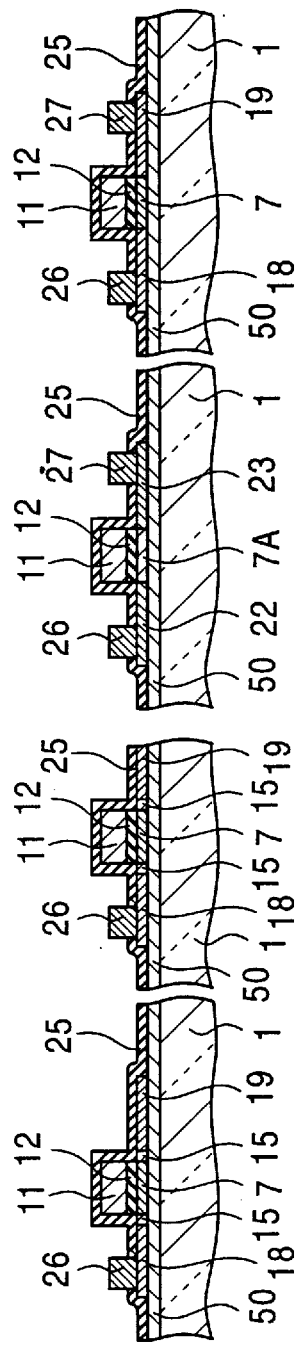

Next, as shown in FIG. 43B (Step 11), contact holes are formed in the source and drain portions of all TFTs in the peripheral driving circuits and the source portions of display TFTs by general-purpose photolithography and etching.

Then, a sputtered film of aluminum or aluminum containing 1% of Si is formed to a thickness of 500 to 600 nm over the entire surface, and source electrodes 26 of all TFTs in the peripheral driving circuits and the display region, and drain electrodes 27 in the peripheral driving circuit region are formed by general-purpose photolithography and etching. At the same time, data lines and gate lines are formed. Then, sintering is carried out in a forming gas (N$_2$+H$_2$) at about 400° C. for 1 hour.

Figure 43C:
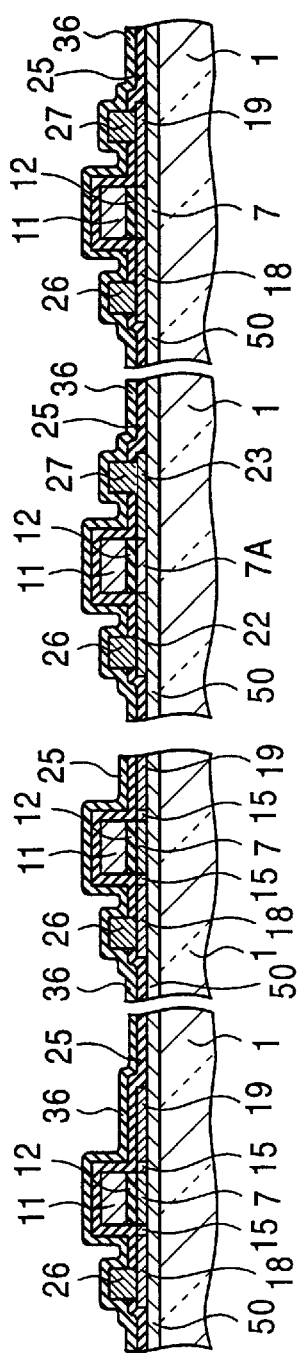
Figure 45:
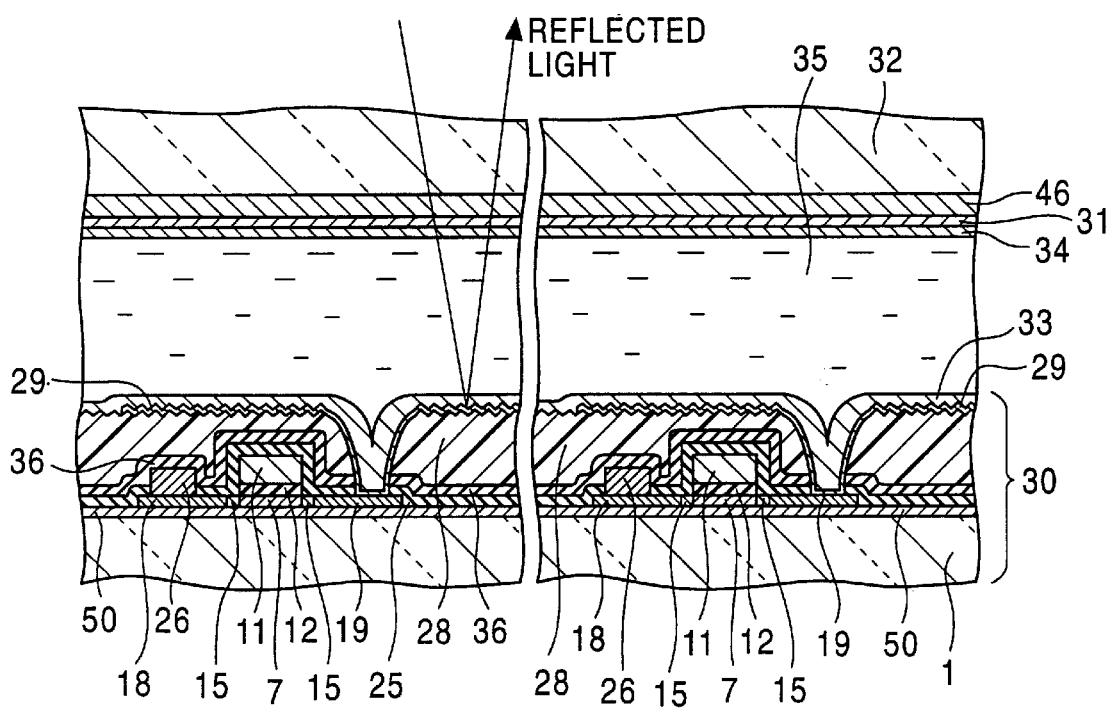
FIG. 45 is a sectional view showing a principal portion of the LCD.

Next, as shown in FIG. 43C (Step 12), an insulating film 36 comprising a PSG film (thickness of about 300 nm) and a SiN film (thickness of about 300 nm) is formed over the entire surface by plasma CVD, high-density plasma CVD, catalytic CVD, or the like. Then, contact holes are formed in the drain portions of display TFTs. In the display region, the SiC$_2$, PSG and SiN films need not be removed.

For the same purpose as described above with reference to FIG. 5A, as shown in FIG. 44A (Step 13), a photosensitive resin film 28 is then formed to a thickness of 2 to 3 μm over the entire surface by spin coating or the like. As shown in FIG. 44B (Step 14), in order to obtain reflection characteristics and viewing angle characteristics optimum for at least the pixel region, an uneven pattern is formed by general-purpose photolithography and etching, followed by reflowing to form a lower reflecting surface comprising an uneven rough surface 28A. At the same time, contact resin holes are formed in the drain portions of display TFTs.

Next, as shown in FIG. 44C (Step 15), a sputtered film of aluminum or aluminum containing 1% of Si is formed to a thickness of 400 to 500 nm over the entire surface, and then removed by general-purpose photolithography and etching except in the pixel region to form an uneven reflecting portion 29 made of aluminum or the like and connected to the drain portions 19 of display TFTs. These portions are used as pixel electrodes for display. Then, sintering is carried out in a forming gas at about 300° C. for 1 hour to achieve sufficient contact. In order to improve reflectance, silver may be used in place of aluminum.

As described above, the single crystal silicon layer 7 is formed by the catalytic CVD method and low-temperature hetero epitaxial growth using as the seed the crystalline sapphire thin film 50 to manufacture an active matrix substrate 30 of the type in which the display region and the peripheral driving circuit regions are integrated. In the active matrix substrate 30, top gate type nMOSLDD-TFTs and CMOS circuits comprising pMOSTFTs and nMOSTFTs are formed in the display region and the peripheral driving circuit region, respectively, by using the single crystal silicon layer 7.

The reflective liquid crystal display device (LCD) is manufactured by the same method as described above with reference to FIG. 6 using the active matrix substrate (driving substrate) 30.

In this embodiment, the excellent effects described above in the first embodiment can apparently be obtained. In addition, since the single crystal silicon layer 7 is hetero-epitaxially grown by using only the crystalline sapphire thin film 50 with no step portion provided in the substrate 1, it is possible to omit the step of forming the step portions, simplifying the manufacturing process, and solve the problem of discontinuity of the single crystal silicon layer grown, etc.

Ninth Embodiment

Figure 46A:
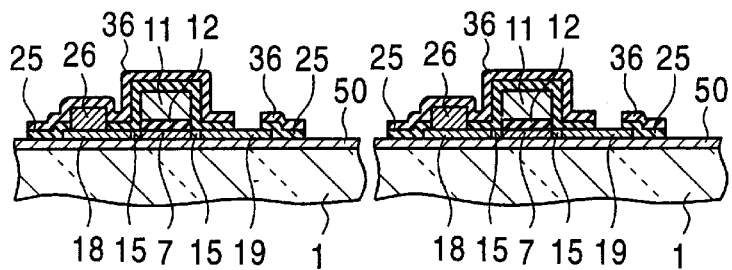
FIG. 46 is a sectional view showing the steps of a LCD manufacturing process in accordance with a ninth embodiment of the present invention.
Figure 46B:
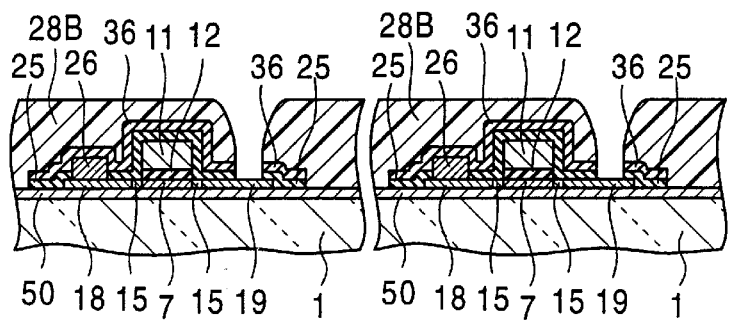
Figure 46C:
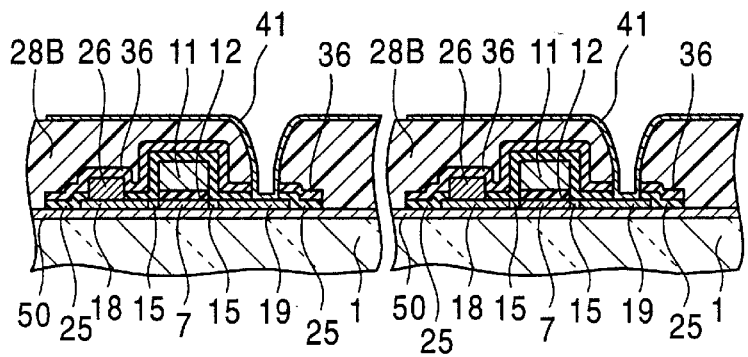
Figure 47:
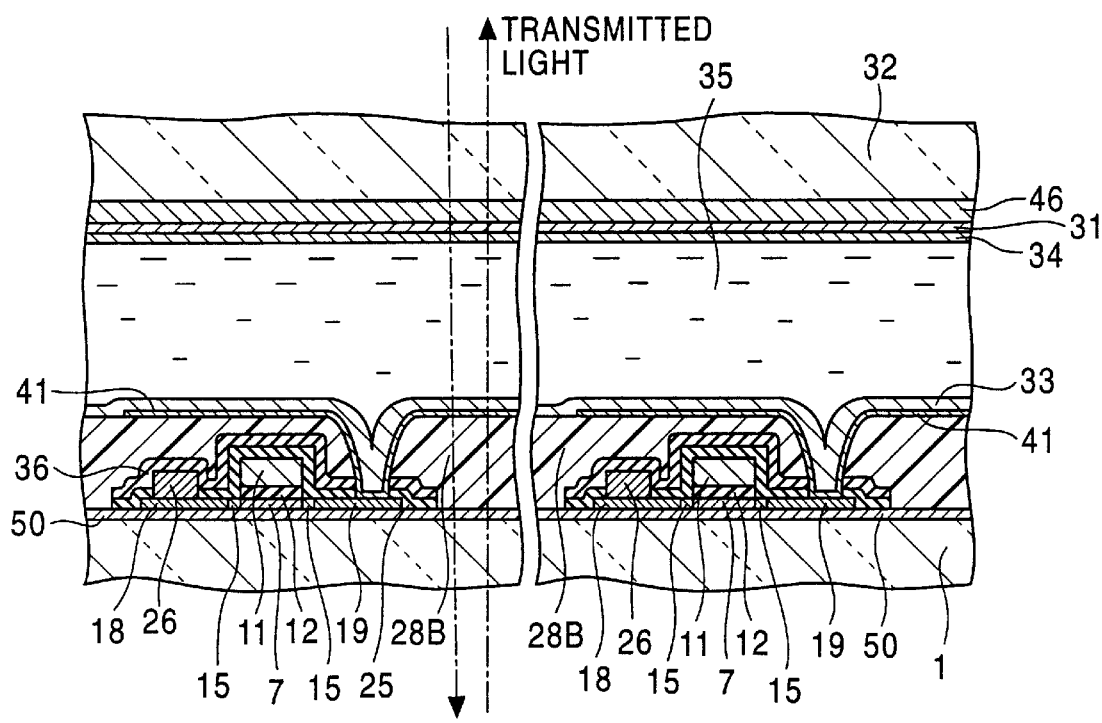
FIG. 47 is a sectional view showing a principal portion of the LCD.

FIGS. 46 to 48 show a ninth embodiment of the present invention.

In this embodiment, the same top gate type MOSTFTs as the eighth embodiment are provided in the display region and the peripheral driving circuit region. However, this embodiment is different from the eighth embodiment in that it relates to transmissive LCD. Namely, although the steps shown in FIGS. 40A to 43C of the eighth embodiment are repeated, the subsequent step comprises forming contact holes 19 for the drain portions of display TFTs in the insulating films 25 and 36, and at the same time, removing the unnecessary $SiO_2$, PSG and SiN films in the pixel apertures in order to improve transmittance, as shown in FIG. 46A (Step 13).

Next, as shown in FIG. 46B (Step 14), a photosensitive acrylic transparent resin planarizing film 28B is formed to a thickness of 2 to 3 $\mu$m over the entire surface by spin coating, and holes are formed in the transparent resin 28B on the drain sides of display TFTs by general-purpose photolithography, followed by curing under predetermined conditions.

Then, as shown in FIG. 46C (Step 15), an ITO sputtered film is formed to a thickness of 130 to 150 $\mu$m over the entire surface, and then ITO transparent electrodes 41 are formed by general-purpose photolithography and etching so as to be brought into contact with the drain portions 19 of display TFTs. Then, heat treatment (in a forming gas at 200 to 250° C. for 1 hour) is performed to decrease contact resistance between the drains of display TFTs and ITO, and improve ITO transparency.

As shown in FIG. 47, the substrate 30 is combined with the counter substrate 32 to assemble transmissive LCD by the same method as the eighth embodiment. However, a polarizer is also attached to the TFT substrate side. Although, in this transmissive LCD, transmitted light is obtained, as shown by a solid line, transmitted light can also be obtained from the counter substrate side, as shown by a one-dot chain line.

In this transmissive LCD, an on-chip color (OCCF) filter structure and an on-chip black (OCB) structure can be manufactured as follows.

Figure 48A:
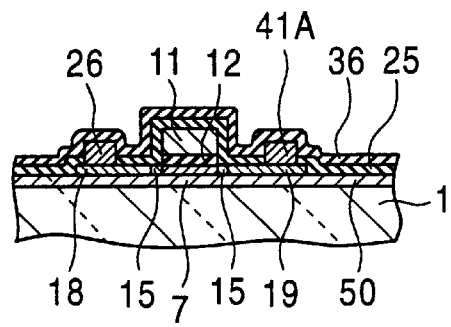
FIG. 48 is a sectional view showing the steps of the same LCD manufacturing process.

After the steps shown in FIG. 40A to 43B are performed according to the above-described steps, holes are also formed in the drain portions of the insulating film 25 of $PSG/SiO_2$ to form aluminum embedded layers 41A for drain electrodes, and then the SiN/PSG insulating film 36 is formed, as shown in FIG. 48A (Step 12).

Figure 48B:
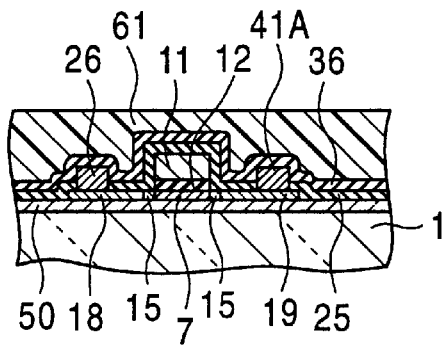
Figure 48C:
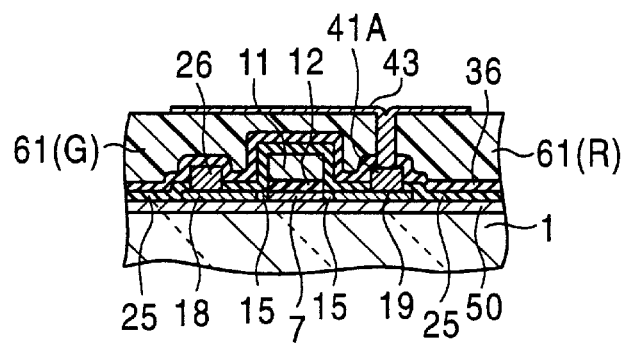

Next, as shown in FIG. 48B (Step 13), photoresist 61 in which dyes of R, G and B colors are dispersed in respective segments is formed to a predetermined thickness (1 to 1.5 $\mu$m). Then, as shown in FIG. 48C (Step 14), the photoresist 61 is patterned by general-purpose photolithography to leave predetermined positions (respective pixels), to form color filter layers 61(R), 61(G) and 61(B) (the on-chip color filter structure). In this case, holes are also formed in the drain portions. An opaque ceramic substrate cannot be used.

Next, as shown in FIG. 48C (Step 14), a light shielding layer 43 as a black mask layer is formed in the contact holes, which communicate with the drains of display TFTs, and on the color filters by patterning a metal. For example, molybdenum is deposited to a thickness of 200 to 250 nm by sputtering, and then patterned to a predetermined shape which covers the display TFTs to shield light (the on-chip black structure).

Figure 48D:
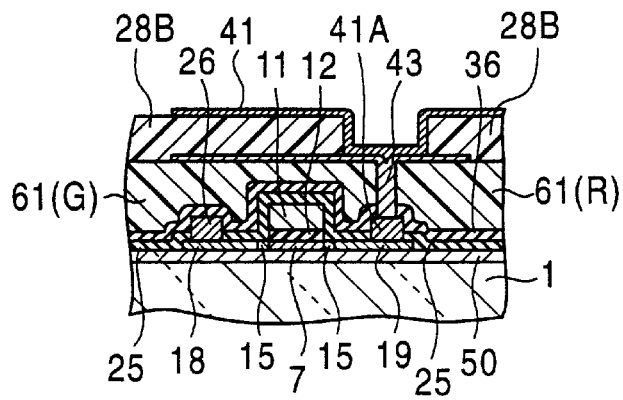

Next, as shown in FIG. 48D (Step 15), a transparent resin planarizing film 28B is formed, and ITO transparent electrodes 41 are further formed in through holes formed in the planarizing film 28B so as to be connected to the light shielding layer 43.

In this way, the color filter 61 and the black mask 43 are formed on the display array region to improve the aperture ratio of the liquid crystal display panel, and realize a reduction in power consumption of a display module including a back light.

Tenth Embodiment

FIGS. 49 to 57 show a tenth embodiment of the present invention.

In this embodiment, the peripheral driving circuit region comprises CMOS driving circuits comprising the same top gate type pMOSTFT and nMOSTFT as the eighth embodiment. The display region is a reflective type, and comprises various combinations of TFTs with various gate structures.

Namely, FIG. 49A shows the display region comprising the same top gate type nMOSLDD-TFTs as the eighth embodiment, FIG. 49B shows the display region comprising bottom gate type nMOSLDD-TFTs, and FIG. 49C shows the display region comprising dual gate type nMOSLDD-TFTs. These bottom gate type and dual gate type MOSTFTs can be produced by a process common to the top gate type MOSTFTs in the peripheral driving circuit regions, as described below. However, particularly, the dual gate type permits improvement in the driving ability by the upper and lower gate portions, is suitable for high-speed switching, and can be operated as the top gate type or the bottom gate type by selectively using any one of the upper and lower gate portions according to demand.

In FIG. 49B, each bottom gate type MOSTFT comprises a gate electrode 71 made of Mo.Ta or the like, a SiN film 72 and a $SiO_2$ film 73, which constitute a gate insulating film, and a channel region formed on the gate insulating film and comprising the same single crystal silicon layer as top gate type MOSTFT, etc. In the dual gate type MOSTFT shown in FIG. 49C, the lower gate portion is the same as bottom gate type MOSTFT, while the upper gate portion comprises a $SiO_2$ film and a SiN film, which constitute a gate insulating film 73, and an upper gate electrode 74 provided thereon.

Next, the method of manufacturing the bottom gate type MOSTFTs will be described with reference to FIGS. 50 to 54, and the method of manufacturing the dual gate type MOSTFTs will be described with reference to FIGS. 55 to 57. The method of manufacturing the top gate type MOSTFTs in the peripheral driving circuit regions is the same as described above with reference to FIGS. 40 to 44, and is thus not shown in the drawings.

Figure 50A:
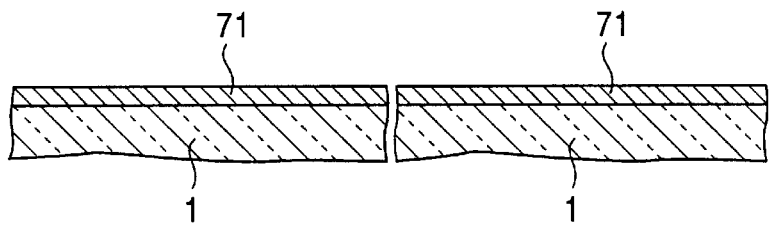
FIG. 50 and FIG. 51 are sectional view showing the steps of the same LCD manufacturing process.

In order to manufacture the bottom gate type MOSTFTs in the display region, first, as shown in FIG. 50A (Step 1), a sputtered film 71 (thickness 500 to 600 nm) of a molybdenum/tantalum (Mo.Ta) alloy is formed on the substrate 1.

Figure 50B:
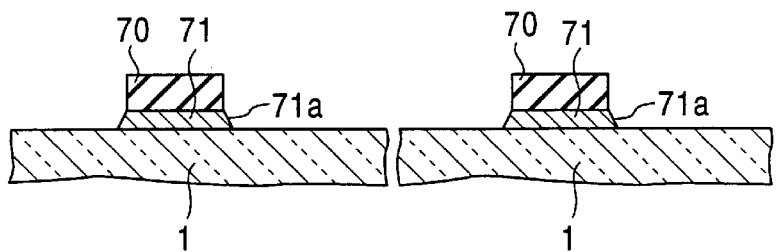

Next, as shown in FIG. 50B (Step 2), photoresist 70 is formed in a predetermined pattern, and then used as a mask for taper etching the Mo.Ta film 9 to form gate electrodes 71 having side ends 71a which are gently inclined at 20 to 45 degrees to form a trapezoidal shape.

Figure 50C:
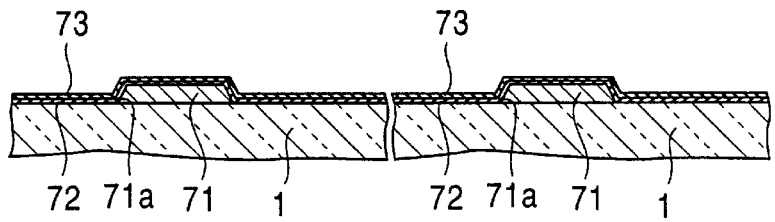

Next, as shown in FIG. 50C (Step 3), after the photoresist 71 is removed, a SiN film (thickness about 100 nm) 72, and a $SiO_2$ film (thickness about 200 nm) 73 are deposited in this order on the substrate 1 including the molybdenum/tantalum alloy film 71 by the plasma CVD method or the like to form a gate insulating film.

Figure 51A:
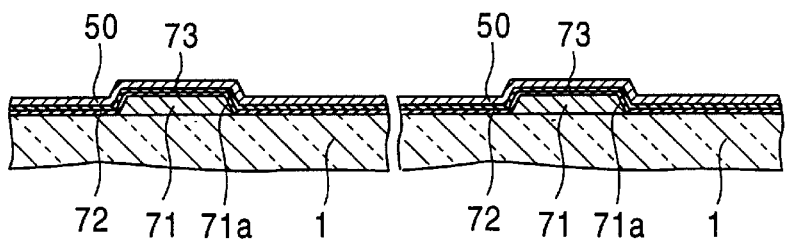

Next, as shown in FIG. 51A (Step 4), a crystalline sapphire thin film (thickness 20 to 200 nm) 50 is formed in at least the TFT forming regions on a main surface of the insulating substrate 1 by the same method as described above in the same step as shown in FIG. 40A.

Figure 51B:
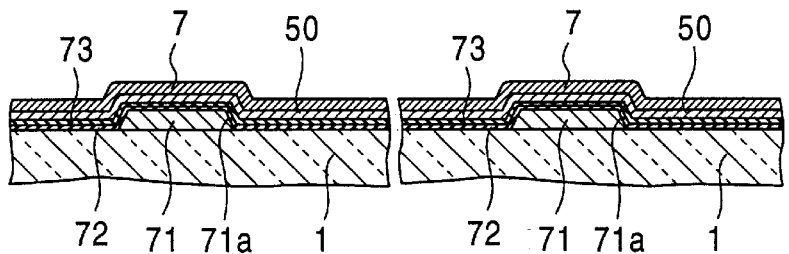

Next, as shown in FIG. 51B (Step 5), single crystal silicon is hetero-epitaxially grown by the same catalytic CVD method as described above in the same step as shown in FIG. 40B to deposit a single crystal silicon layer 7 having a thickness of, for example, about 0.1 $\mu$m. In this step, since the side ends 71a of the gate electrodes 71 formed in the under coat are gently inclined, the single crystal silicon layer 7 is continuously grown on the side ends 71a without inhibition to epitaxial growth using the step portions.

Figure 51C:
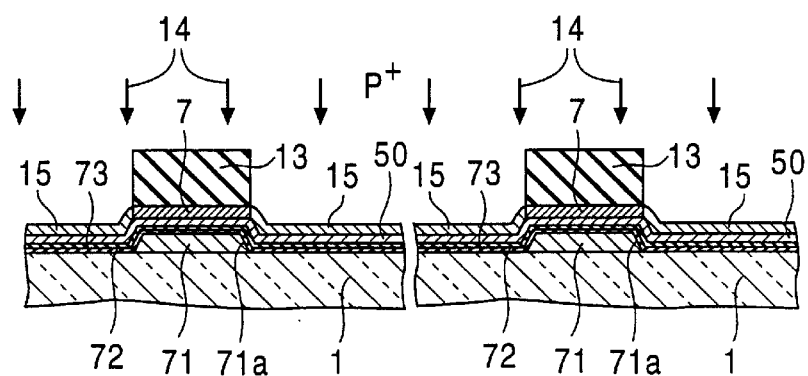

Next, as shown in FIG. 51C (Step 6), the gate portions of nMOSTFTs in the display- region are covered with photoresist 13, and the exposed source and drain regions of nMOSTFTs are doped (ion implantation) with phosphorus ions 14 to form LDD portions 15 comprising a $N^+$ type layer in self alignment in the same step as shown in FIG. 41C after the steps shown in FIGS. 40C to 41B. At this time, differences in surface height (or the pattern) are readily recognized due to the presence of the bottom gate electrodes 71, causing the ease in alignment of the photoresist 13 (alignment of the mask), and less deviation in alignment.

Figure 52A:
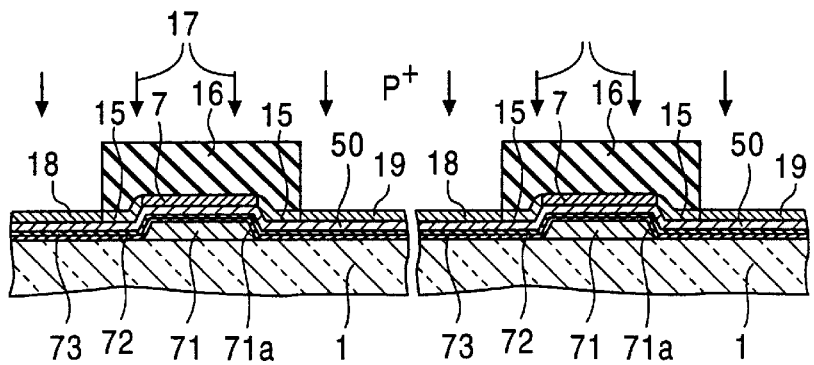
FIG. 52 is a sectional view showing the steps of the same LCD manufacturing process.

Next, as shown in FIG. 52A (Step 7), the gate portions and LDD portions of nMOSTFTs are covered with photoresist 16, and the exposed regions are doped (ion implantation) with phosphorus or arsenic ions 17 to form source portions 18 and drain portions 19 of nMOSTFTs, which comprise a $N^+$ type layer, in the same step as shown in FIG. 42G.

Figure 52B:
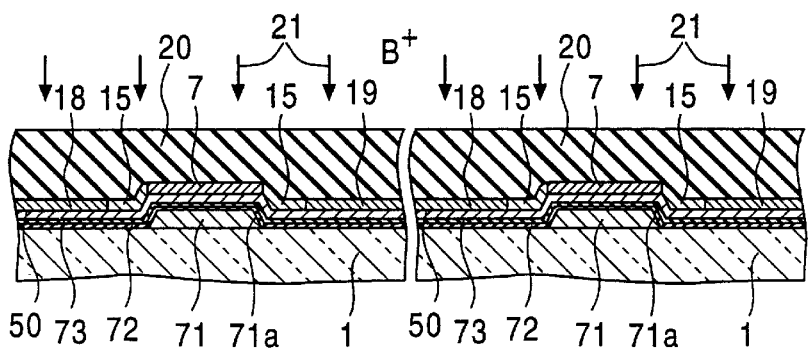

Then, as shown in FIG. 52B (Step 8), the entire portions of nMOSTFTs are covered with photoresist 20, followed by doping (ion implantation) with boron ions 21 to form source and drain portions of pMOSTFTs in the peripheral driving circuit regions, which comprise a $p^+$ layer, in the same step as shown in FIG. 42B.

Figure 52C:
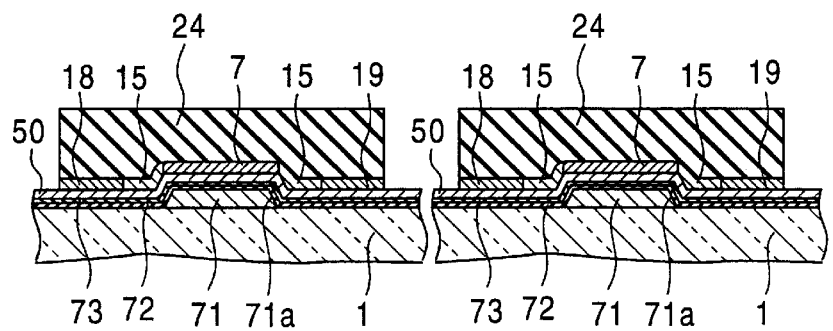

Next, as shown in FIG. 52C (Step 9), in order to island the active elements and passive elements, photoresist 24 is provided, and the single crystal silicon thin film is selectively removed by general-purpose photolithography and etching in the same step as shown in FIG. 42C.

Figure 52D:
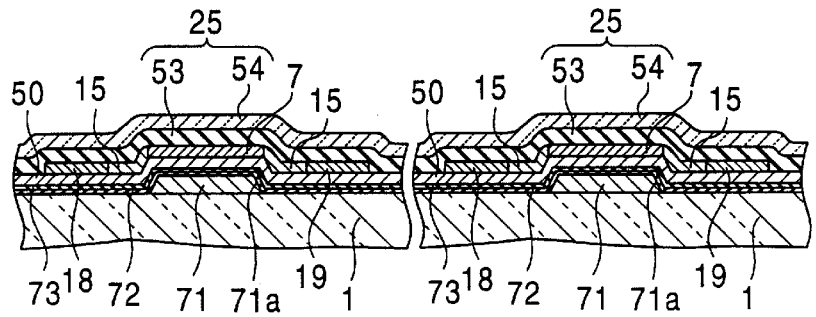

Next, as shown in FIG. 52D (Step 10), a $SiO_2$ film 53 (thickness of about 300 nm) and a phosphorsilicate glass (PSG) film 54 (thickness of about 300 nm) are formed in this order over the entire surface by the plasma CVD, high-density plasma CVD, catalytic CVD, or the like in the same step as shown in FIG. 43A. The $SiO_2$ film 53 and the PSG film 54-correspond to the above-described protective film 25. In this state, the single crystal silicon film is activated by the same method as described above.

Figure 53A:
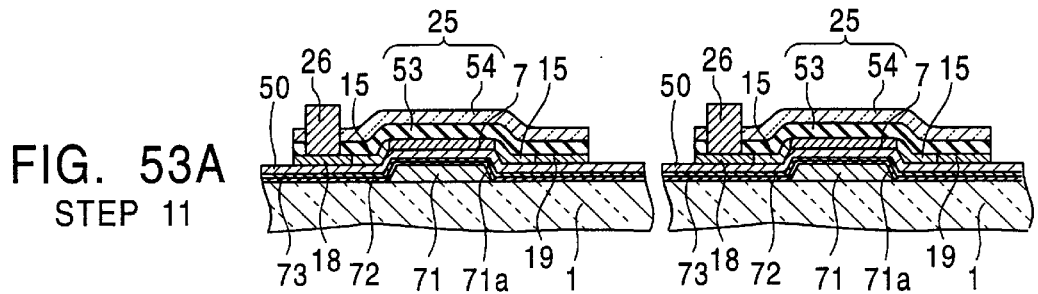
FIG. 53 is a sectional view showing the steps of the same LCD manufacturing process.

Next, as shown in FIG. 53A (Step 11), contact holes are formed in the source portions by general-purpose photolithography and etching in the same step as shown in FIG. 43B. Then, a sputtered film of aluminum is formed to a thickness of 400 to 500 nm over the entire surface, and source electrodes 26 of TFTs, data lines and gate lines are formed by general-purpose photolithography and etching. Then, sintering is carried out in a forming gas at about 400° C. for 1 hour.

Figure 53B:
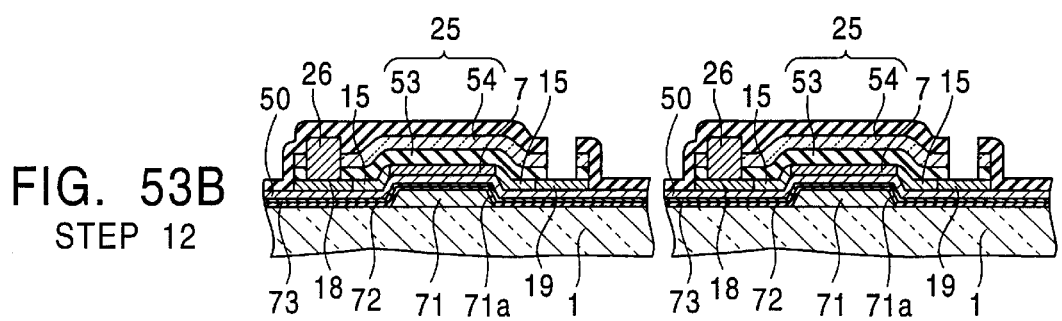

Next, as shown in FIG. 53B (Step 12), an insulating film 36 comprising a PSG film (thickness of about 300 nm) and SiN film (thickness of about 300 nm) is formed over the entire surface by high-density plasma CVD, catalytic CVD, or the like, and contact holes are formed in the drain portions of display TFTs in the same step as shown in FIG. 43C.

Figure 53C:
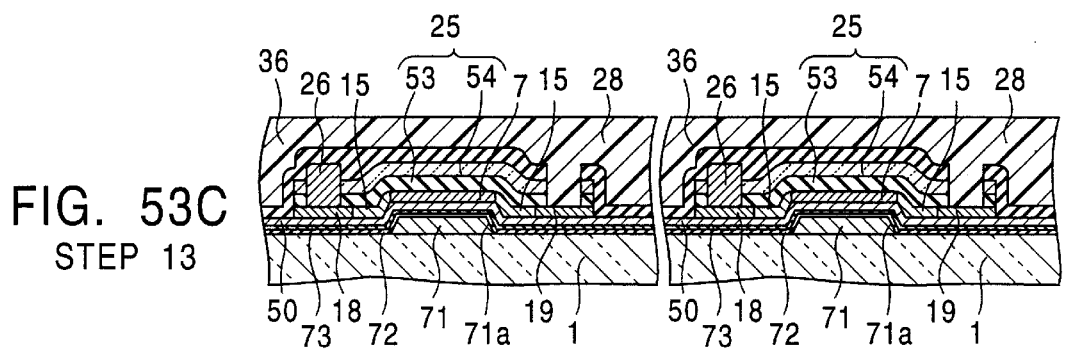
Figure 53D:
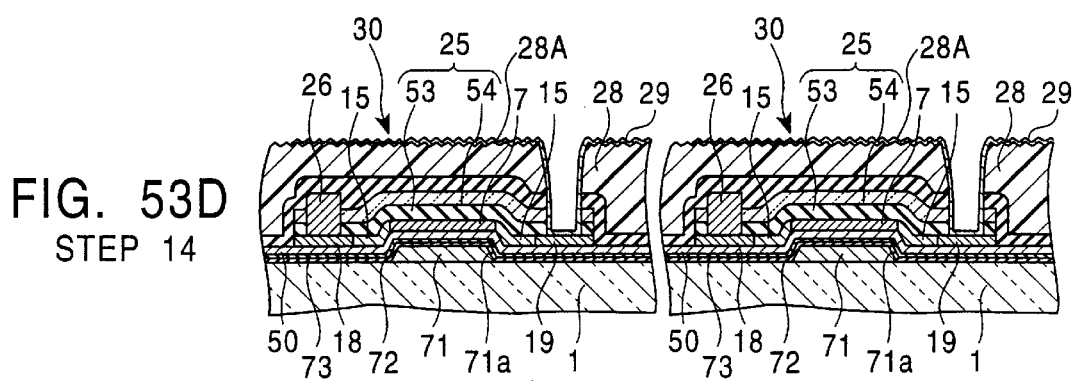

Next, as shown in FIG. 53C (Step 13), a photosensitive resin film 28 is formed to a thickness of 2 to 3 $\mu$m by spin coating or the like in the same step as shown in FIG. 44A. Then, as shown in FIG. 53D (Step 14), an uneven pattern is formed by general-purpose photolithography and etching to obtain reflection characteristics and viewing angle characteristics optimum for at least the display region, followed by reflowing to form a reflecting lower surface comprising an uneven rough surface 28A. At the same time, contact holes are formed in the drain portions of display TFTs.

Next, as shown in FIG. 53D (Step 14), a sputtered film of aluminum or aluminum containing 1% of Si is formed to a thickness of 400 to 500 nm over the entire surface, and uneven aluminum reflecting portions 29 are formed by general-purpose photolithography and etching so as to be connected to the drain portions 19 of display TFTs in the same step as shown in FIG. 44C.

As described above, an active matrix substrate 30 of the type in which the display region and the peripheral driving circuit regions are integrated can be manufactured. In the active matrix substrate 30, the bottom gate type nMOSLDD-TFTs (in the periphery, CMOS driving circuits comprising pMOSTFT and nMOSTFT) are formed in the display region comprising the single crystal silicon layer 7 formed by using the crystalline sapphire thin film 50 as seeds for low-temperature hetero epitaxial growth by the catalytic CVD method.

FIG. 54 shows an example in which the gate insulating films of the bottom gate type MOSTFTs in the display region are formed by anodic oxidation of Mo.Ta.

Figure 54A:
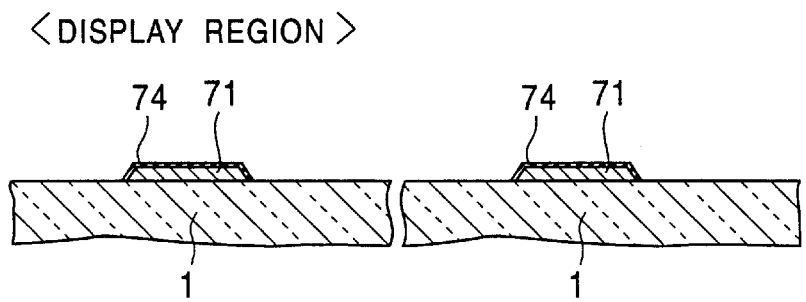
FIG. 54 is a sectional view showing the steps of the same LCD manufacturing process.

After the step shown in FIG. 50B, as shown in FIG. 54A (Step 3), the molybdenum/tantalum alloy films 71 are subjected to known anodic oxidation to form gate insulating films 74 comprising $Ta_2O_5$ to a thickness of 100 to 200 nm on the surfaces thereof.

Figure 54B:
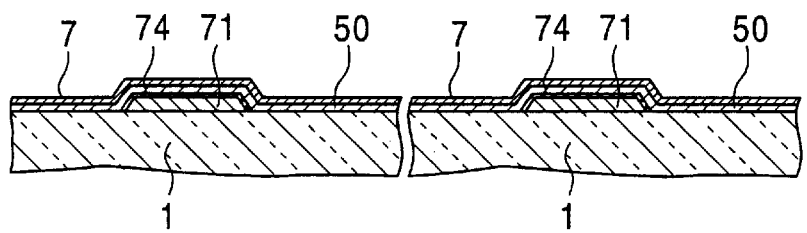
Figure 54C:
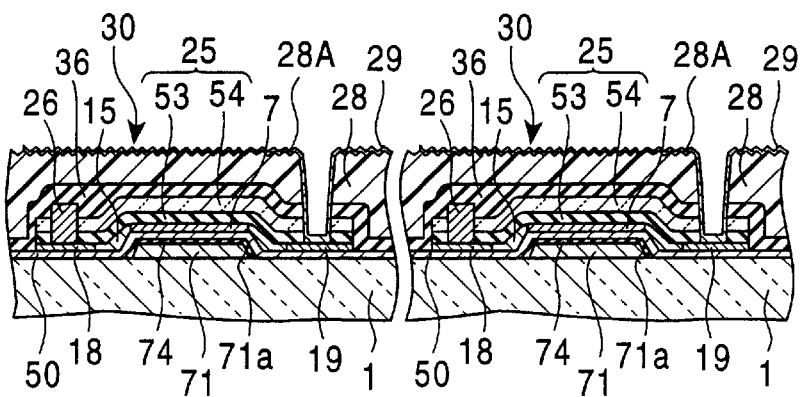

Then, as shown in FIG. 54B (Step 4), the crystalline sapphire thin film 50 is formed in the same manner as shown in FIGS. 51A and B, and the single crystal silicon layer 7 is hetero-epitaxially grown by the catalytic CVD method. Then, as shown in FIG. 54C (Step 5), the active matrix substrate 30 is manufactured by the same steps as shown in FIGS. 51C to 53D.

Next, in order to produce dual gate type MOSTFTs in the display region, the steps shown in FIG. 50A to 51B are repeated by the same method as described above.

Namely, as shown in FIG. 55A (Step 6), the crystalline sapphire thin film 50 is formed on the insulating films 72 and 73, and the single crystal silicon layer 7 is hetero-epitaxially grown by using the crystalline sapphire thin film 50 as a seed. Then, a $SiO_2$ film (thickness of about 200 nm) and a SiN film (thickness of about 100 nm) are continuously formed in this order over the entire region on the single crystal silicon thin film 7 by plasma CVD, catalytic CVD, or the like to form an insulating film 80 (corresponding to the above insulating film 8), and a: sputtered film 81 (thickness of about 500 to 600 nm) (corresponding to the above sputtered film 9) of a Mo.Ta alloy is further formed, in the same step as shown in FIG. 41A.

Next, as shown in FIG. 55B (Step 7), a photoresist pattern 10 is formed, and then top gate electrodes 82 (corresponding to the above gate electrodes 12 ) of a Mo.Ta alloy and gate insulating films 83 (corresponding to the above gate insulating films 11) are formed by continuous etching to expose the single crystal silicon thin film 7 in the same step as shown in FIG. 41B.

Next, as shown in FIG. 55C (Step 8), the top gate portions of nMOSTFTs are covered with photoresist 13, and the exposed source and drain regions of display nMOSTFTs are doped (ion implantation) with phosphorus ions 14 to form LDD portions 15 comprising a N- type layer in the same step as shown in 41C.

Next, as shown in FIG. 55D (Step 9), the gate portions and LDD portions of nMOSTFTs are covered with photoresist 16, and the exposed regions are doped (ion implantation) with phosphorus or arsenic ions 17 to form the source portions 18 and drain portions 19 of nMOSTFTs, which comprise a $N^+$ type layer, in the same step as shown in FIG. 42A.

Then, as shown in FIG. 56A (Step 10), the gate portions of pMOSTFTs are covered with photoresist 20, and the exposed regions are doped (ion implantation) with boron ions 21 to form the $P^+$ layer source and drain portions of pMOSTFTs in the peripheral driving circuit regions in the same step as shown in FIG. 42B.

Next, as shown in FIG. 56B (Step 11), in order to island the active elements and the passive elements, photoresist 24 is provided, and the single crystal silicon thin film layer is selectively removed by general-purpose photolithography and etching in the same step as shown in FIG. 42C except in the active elements and the passive elements.

Next, as shown in FIG. 56C (Step 12 ), a $SiO_2$ film 53 (thickness of about 200 nm) and a phosphosilicate glass (PSG) film 54 (thickness of about 300 nm) are formed over the entire surface by plasma CVD, thigh-density plasma CVD, catalytic CVD, or the like in the same step as shown in FIG. 43A. These films 53 and 54 correspond to the protective film 25. Then, the single crystal silicon layer is activated.

Next, as shown in FIG. 56D (Step 13), contact holes are formed in the source portions in the same step as shown in FIG. 43B. Then, a sputtered film of aluminum or aluminu containing 1% of Si is formed to a thickness of 400 to 500 over the entire surface, and source electrodes 26, data lines and gate lines are formed by general-purpose photolithography and etching.

Figure 57A:
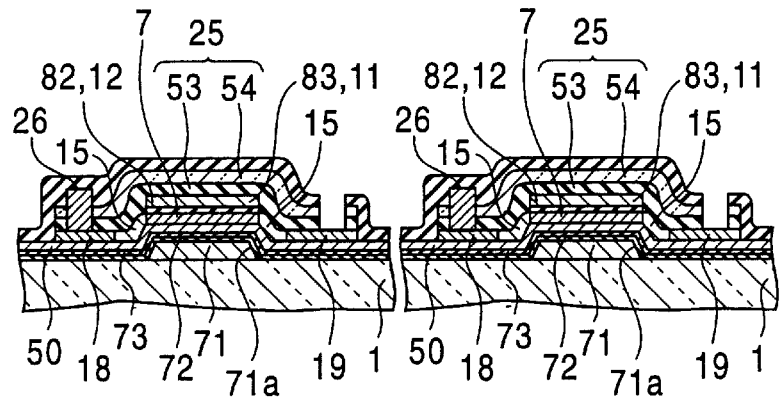
FIG. 57 is a sectional view showing the steps of the same LCD manufacturing process.

Next, as shown in FIG. 57A (Step 14), an insulating film 36 comprising a PSG film (thickness of about 300 nm) and a SiN film (thickness of about 300 nm) is formed over the entire surface, and contact holes are formed in the drain portions of display TFTs in the same step as shown in FIG. 44A.

Figure 57B:
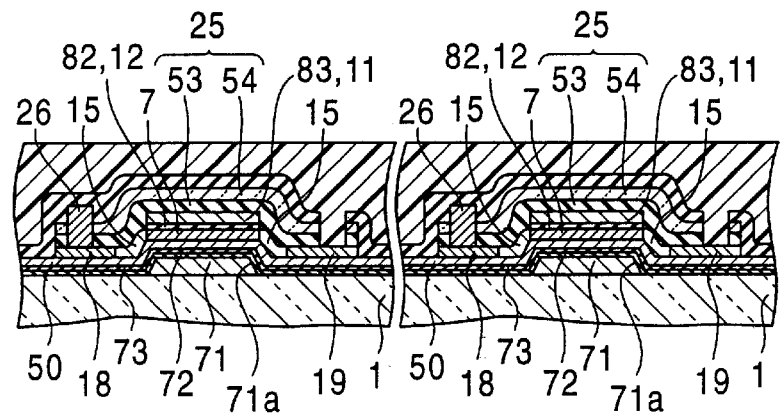
Figure 57C:
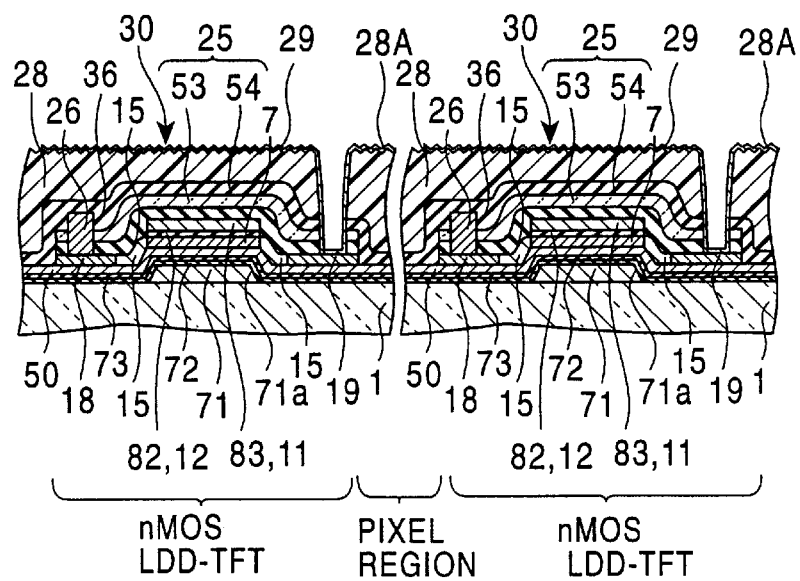

Next, as shown in FIG. 57B (Step 15), a photosensitive resin film 28 is formed to a thickness of 2 to 3 $\mu$m over the entire surface by spin coating or the like. Then, as shown in FIG. 57C (Step 16), a reflecting lower surface comprising an uneven rough surface 28A is formed at least in the display region, and at the same time, contact holes are formed in the drain portions of display TFTs in the same steps as shown in FIGS. 44B and 44C. Furthermore, in order to obtain optimum reflection characteristics and viewing angle characteristics, uneven aluminum reflecting portions 29 are formed to be connected to the drain portions 19 of display TFTS.

As described above, the active matrix substrate 30 of the type in which the display region and the peripheral driving circuit regions are integrated can be manufactured. In the substrate 30, the single crystal silicon layer 7 formed by the catalytic CVD method using the crystalline sapphire thin film 50 as a seed for hetero epitaxial growth is used for forming the dual gate type nMOSLDD-TFTs in the display regions, and the CMOS driving circuits comprising pMOST-FTs and nMOSTFTs in the peripheral driving circuit regions.
Eleventh Embodiment FIGS. 58 to 60 show an eleventh embodiment of the present invention.

Unlike the above-described embodiment, in this embodiment, gate electrodes of the top pate portions are formed by using a material with relatively low heat resistance, such as aluminum or the like.

First, when top gate type MOSTFTs are provided in both the display region and the peripheral driving circuit regions, the steps shown in FIGS. 40A to C in the eighth embodiment are repeated, and as shown in FIG. 58A (Step 3), N-type wells 7A are formed in pMOSTFTs of the peripheral driving circuit regions.

Next, as shown in FIG. 58B (Step 4),the entire portions of nMOS and pMOSTFTs in the peripheral driving regions, and the gate portions of nMOSTFTs in the display region are covered with photoresist 13, and the exposed source and drain regions in nMOSTFTs are doped (ion implantation) with phosphorus ions 14, for example, at 20 kV in a dosage of $5\times10^{13}$ atoms/$cm^2$ to form LDD portions 15 comprising a $N^-$ type layer in self alignment.

Next, as shown in FIG. 59A (Step 5), the entire portions of MOSTFTs in the peripheral driving circuit regions, and the gate portions of nMOSTFTs in the peripheral driving circuit regions, and the gate and LDD portions of nMOST-FTs in the display region are covered with photoresist 16, and the exposed regions are doped (ion implantation) with phosphorus or arsenic ions 17, for example, at 20 kV in a dosage of $5\times10^{15}$ atoms/$cm^2$ to form source portions 18, drain portions 19 and LDD portions 15 of nMOSTFTs, which comprise a $N^+$ type layer. In this case, the resist 13 is left as shown by phantom lines, and the resist 16 is provided to cover the remaining resist 13 so that the mask for forming the resist 16 can be aligned by using the resist 13 as a measure, thereby facilitating mask alignment and causing less deviation in alignment.

Next, as shown in FIG. 59B (Step 6), the entire portions of nMOSTFTs in the peripheral driving circuit regions, and the entire portions of nMOSTFTs and the gate portions of pMOSTFTs in the display region are covered with photoresist 20, and the exposed regions are doped (ion implantation) with boron ions 12, for example, at 10 kV in a dosage of $5 \times 10^{15}$ atoms/cm² to form source portions 22 and drain portions 23 of pMOSTFTs, which comprise a P⁺type layer.

Next, as shown in FIG. 59C (Step 7), after the resist 20 is removed, the single crystal silicon layer 7 (7A) is activated by the same method as described above, and a gate insulating film 12 and a gate electrode material (aluminum or aluminum containing 1% Si) 11 are further formed on the surface. The gate electrode material layer 11 can be formed by vacuum deposition or sputtering.

Next, the gate portions are formed by patterning, and then the active elements and the passive elements are islanded by the same method as described above. Then, as shown in FIG. 60A (Step 8), a $SiO_2$ film (thickness of about 200 nm) and a phosphosilicate glass (PSG) film (thickness of about 300 nm) are continuously formed in this order to form a protective film 25.

Next, as shown in FIG. 60B (Step 9), contact holes are formed in the source and drain portions of all TFTs in the peripheral driving circuit regions, and the source portions of display TFTs by general-purpose photolithography and etching.

Then, a sputtered film of aluminum or aluminum containing 1% Si is formed to a thickness of 500 to 600 nm over the entire surface, and source electrodes 26 of all TFTs in the peripheral driving circuit regions and the display region, and drain electrode 27 in the peripheral driving circuit regions are formed by general-purpose photolithography and etching, and at the same time, data lines and gate lines are formed. Then, sintering is performed in a forming gas ($N_2+H_2$) at about 400° C. for 1 hour.

Next, the steps shown in FIGS. 43C to 44C are repeated to manufacture an active matrix substrate 30 of the type in which the display and the peripheral driving circuit regions are integrated. In the active matrix substrate 30, top gate type nMOSLDD-TFTs and the CMOS driving circuits comprising pMOSTFT and nMOSTFT are formed by using aluminum for the gate electrodes in each of the display region and the peripheral driving circuit regions comprising the single crystal silicon layer 7.

In this embodiment, since the gate electrodes 11 made of aluminum or aluminum containing 1% of Si are formed after the single crystal silicon layer 7 is activated, the heat resistance of the gate electrode material is irrelevant to the effect of activation heat. Therefore, relatively low-heat-resistant and low-cost aluminum, aluminum containing 1% of Si, or copper can be used as the top gate electrode material, thereby widening the selection range of electrode materials. This applies to bottom gate type MOSTFTs in the display region.

Where dual gate type MOSTFTs are provided in the display region, and top gate type MOSTFTs are provided in the peripheral driving circuit regions, the steps shown in FIGS. 28A to 30C of the third embodiment are repeated to manufacture an active matrix substrate 30 of the type in which the display region and the peripheral driving circuit regions are integrated. In the active matrix substrate 30, the dual gate type nMOSLDD-TFTs, and the CMOS driving circuits comprising pMOSTFT and nMOSTFT are formed in the display region and the peripheral driving circuit region, respectively, by using aluminum or the like for the gate electrodes.

Twelfth Embodiment

FIGS. 61 and 62 show a twelfth embodiment of the present invention.

FIG. 61 shows an example of double gate type MOSTFT in which a plurality of self alignment LDD structure TFTs, for example, top gate type LDD-TFTs, are connected.

Figure 62A:
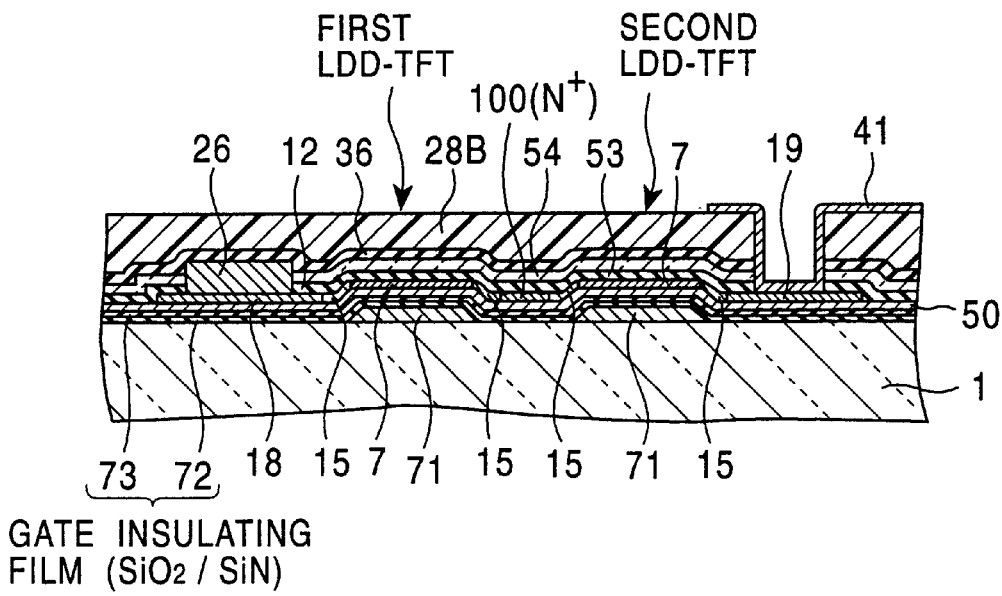
FIG. 62 is a sectional view showing principal portions of various TFTs of the same LCD.
Figure 62B:
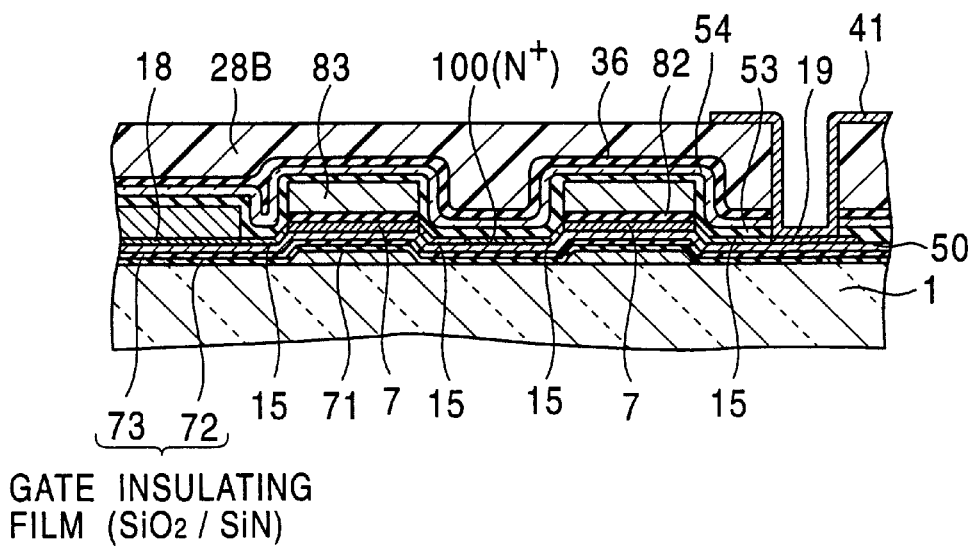

FIG. 62 shows examples including an example in which bottom gate type MOSTFT has a double gate structure (FIG. 62A), and an example in which dual gate type MOSTFT has a double gate structure (FIG. 62B).

Although these double gate type MOSTFTs have the same advantages as described above with reference to FIGS. 36 to 38.

Thirteenth Embodiment

FIGS. 63 to 71 show a thirteenth embodiment of the present invention.

As described above, top gate type, bottom gate type and dual gate type TFTs have structural and functional differences, and characteristics. Therefore, in using these types of TFTs in the display region and the peripheral driving circuit region, it is sometimes advantageous to provide TFTs in various combinations thereof in each of the regions.

For example, as shown in FIG. 63, when any one of the top gate type, bottom gate type and dual gate type TFTs is used in the display region, at least the top gate type of the top gate type, bottom gate type and dual gate type TFTs or a mixture thereof can be used in the peripheral driving circuit region. FIG. 63 shows 12 combinations (Nos. 1 to 12). Particularly, when MOSTFTs in the peripheral driving circuit region have the dual gate structure, the dual gate structure can be easily changed to the top gate type and the bottom gate type by selecting the upper and lower gate portions, respectively. When a portion of the peripheral driving circuit region requires TFT having the high driving ability, the dual gate type is required. For example, when the present invention is applied to organic LE, FED, or the like as an electrooptic device other than LCD, the dual gate type is thought to be necessary.

FIGS. 64 and 65 show examples in which MOSTFTs in the display region do not have the LDD structure, FIGS. 66 and 67 show example in which MOSTFTs in the display region have the LDD structure, FIGS. 68 and 69 show examples in which MOSTFTs in the peripheral driving circuit region contain TFTs having the LDD structure, and FIGS. 70 and 71 show examples in which both the peripheral driving circuit region and the display region comprise LDD-structure MOSTFTs. Each of the figures shows combinations of MOSTFTs in the peripheral driving circuit region and the display region for each of the channel conduction types (Nos. 1 to 216).

The combinations of the gate structures shown in FIG. 63 include the combinations shown in FIGS. 64 to 71. Even when the peripheral driving circuit region comprises a MOSTFT mixture of top gate type and another gate type, the same combinations as shown in these figures are possible. The combinations of TFTs shown in FIGS. 63 to 71 can be applied to not only the case in which the channel region of TFT is made of single crystal silicon, but also the case in which the channel region is made of polycrystalline silicon or amorphous silicon (however, only in the display region).

Fourteenth Embodiment

Figure 72A:
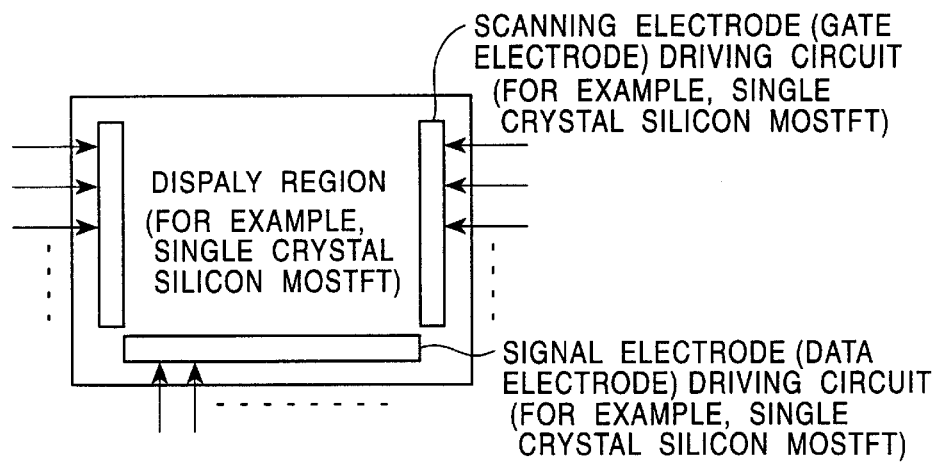
FIG. 72 is a drawing showing the schematic layout of LCD in accordance with a fourteenth embodiment of the present invention.
Figure 72B:
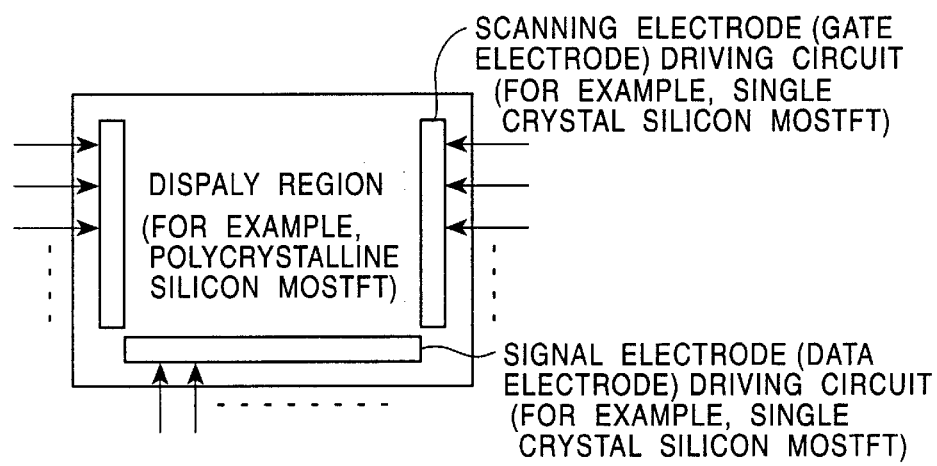
Figure 72C:
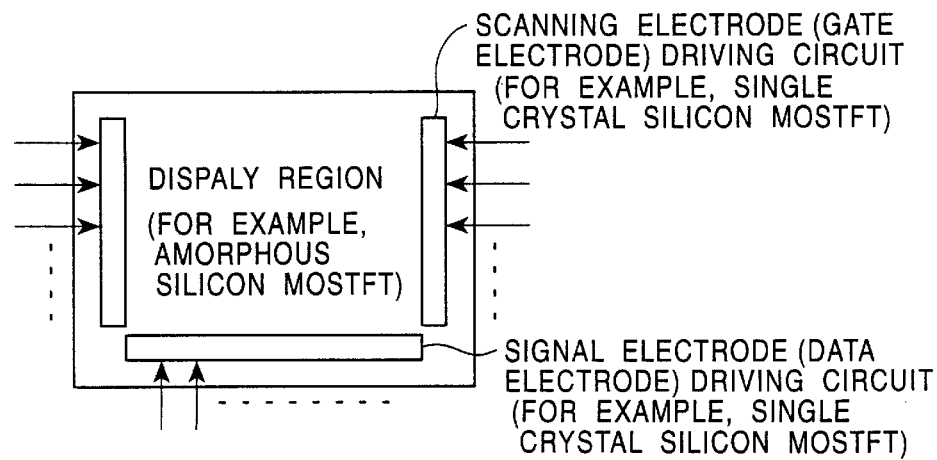

FIGS. 72 and 73 show a fourteenth embodiment of the present invention.

In this embodiment, in an active matrix driving LCD, the peripheral driving circuit region comprises TFTs formed by using the single crystal silicon layer on the basis of the present invention from the viewpoint of improvement in the driving ability. However, the TFTs are not limited to the top gate type, and mixtures with the other gate types may be used. Also various channel conduction types may be used, and MOSTFTs formed by using a polycrystalline silicon layer other than the single crystal silicon layer may be contained. On the other hand, MOSTFTs in the display region are preferably formed by using the single crystal silicon layer. However, the silicon layer used is not limited to this, and polycrystalline silicon and amorphous silicon layers may be used, or a mixture of at least two of the three types of silicon layers may be used. However, when the display region comprises nMOSTFTs, a practical switching speed can be obtained by using the amorphous silicon layer, but the single crystal silicon or polycrystalline silicon layer permits a reduction in the TFT area, and are more advantageous than amorphous silicon from the viewpoint of a reduction in number of pixel defects. Although, in some cases, not only single crystal silicon but also polycrystalline silicon are simultaneously produced in the above-described hetero epitaxial growth to form a so-called CGS (Continuous grain silicon) structure. However, this can also be used for forming the active elements and the passive elements.

FIG. 72A, B and C shows combinations of MOSTFTs in the regions, and FIG. 73 shows examples of these combinations. Using single crystal silicon causes improvement in the current driving ability, and thus permits a decrease in the element size and an increase in the screen size, as well as causing improvement in the aperture ratio in the display region.

In the peripheral driving circuit region, of course, an electronic circuit in which not only the MOSTFTs but also diodes, capacitors, resistors, inductors, etc. are integrated may be integrally formed on an insulating substrate (a glass substrate or the like).

Fifteenth Embodiment

Figure 74:
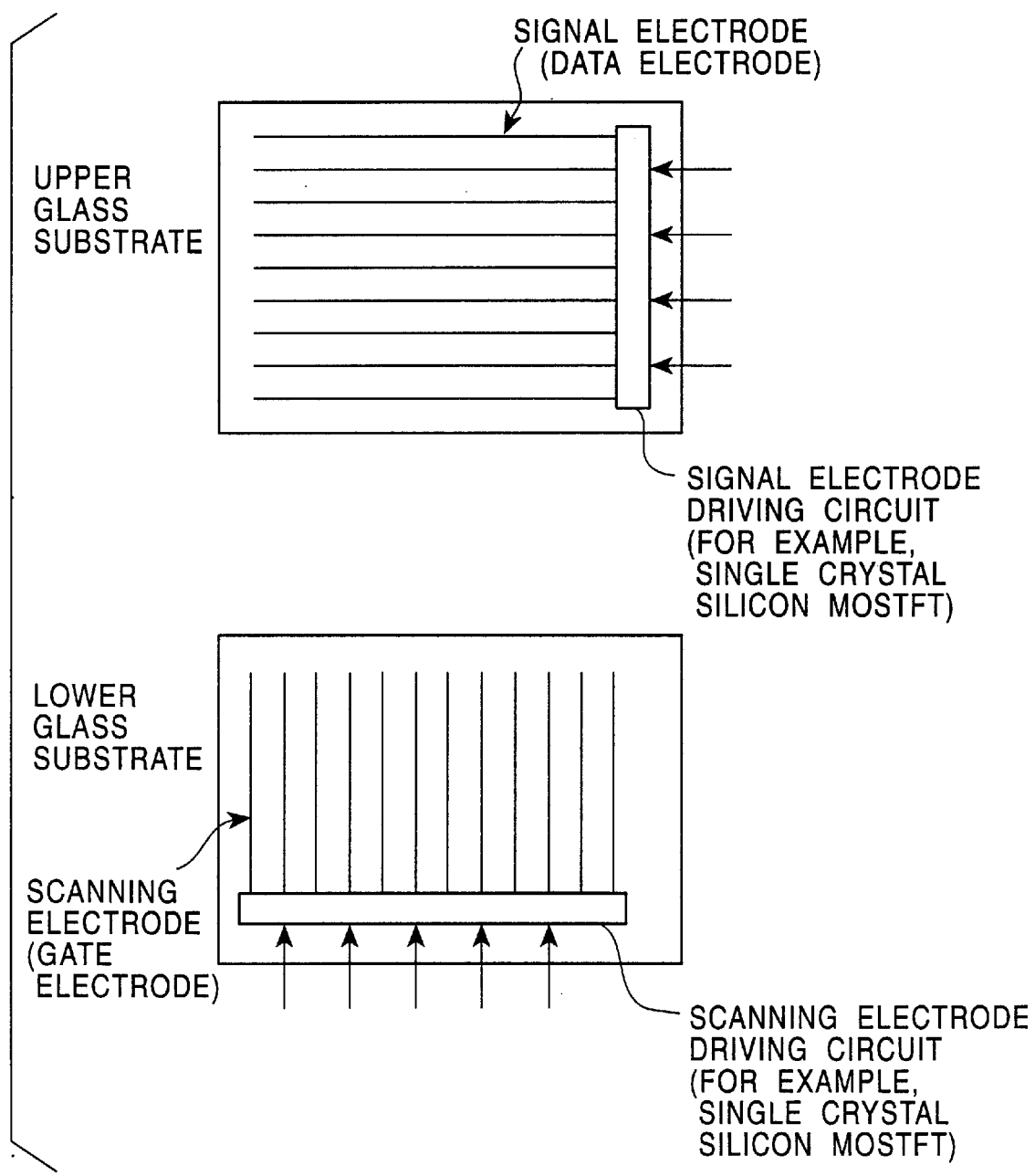
FIG. 74 is a drawing showing the schematic layout of a device in accordance with a fifteenth embodiment of the present invention.

FIG. 74 shows a fifteenth embodiment of the present invention.

Although each of the above embodiments relates to an example of active matrix driving, this embodiment relates to the application of the present invention to passive matrix driving.

Namely, the display region has no switching element comprising MOSTFT, and incident light or reflected light of the display region is modulated by using only a potential difference due to the voltage applied between a pair of electrodes formed on the counter substrate. Such modulated light devices include reflective and transmissive LCD, organic EL (electroluminescence device), FED (field emission type display device), LEPD (light emitting polymer display device), LED (light emitting diode display device), and the like.

Sixteenth Embodiment

FIG. 75 shows a sixteenth embodiment of the present invention.

In this embodiment, the present invention is applied to electrooptic devices other than LCD, such as an organic or inorganic EL (electroluminescence) device, FED (field emission type display device), LEPD (light emitting polymer display device), LED (light emitting diode display device), and the like.

Namely, FIG. 75A shows an active matrix driving EL device, for example, which comprises an organic EL layer 90 (or an inorganic EL layer made of ZnS:Mn) made of an amorphous organic compound and provided on a substrate 1, the transparent electrode (ITO) 41 formed below the EL layer 90, and a cathode 91 formed above the EL layer so that a voltage is applied between both electrodes to obtain emitted light of a predetermined color through a filter 61.

In this case, since a data voltage is applied to the transparent electrode 41 by active matrix driving, single crystal silicon MOSTFTs (i.e., nMOSLDD-TFTs) formed by the single crystal silicon layer, which is hetero-epitaxially grown by the catalytic CVD method using the sapphire film 50 and the step portions 4 on the substrate 1 as seeds in accordance with the present invention, are formed on the substrate 1. The same TFTs are also provided in the peripheral driving circuits. Since this EL device is driven by MOSLDD-TFTs comprising the single crystal silicon layer, the EL element exhibits a high switching speed and less leak current. If the EL layer 90 emits light of the specified color, the filter 61 can be omitted.

Since the EL device has a high driving voltage, it is advantageous to provide the above MOSTFTs and a highly voltage resistant driver device (highly voltage resistant cMOSTFT, bipolar element, or the like) in the peripheral driving circuit region.

FIG. 75B shows passive matrix driving FED in which a voltage is applied between both electrodes 92 and 93 to emit electrons from a cold cathode 94 in a vacuum portion between opposite glass substrates 1 and 32, and the electrons enter a fluorescent layer 96 opposite to the cold cathode 94 by selecting a gate line 95 to obtain light of a predetermined color.

Although an emitter line 92 is led to the peripheral driving-circuits and is driven by a data voltage, the peripheral driving circuits comprise MOSTFTs formed by using the single crystal silicon layer on the basis of the present invention, and contribute to high-speed driving of the emitter line 92. In this FED, MOSTFT can be connected to each of pixels to permit active matrix driving.

In the device shown in FIG. 75A, a known light emitting polymer can be used in place of the EL layer 90 to form a passive matrix or active matrix driving light emitting polymer display device (LEPD). A device similar to the device shown in FIG. 75B can also be formed, in which a diamond thin film is used on the cathode side. In a light emitting diode, a light emitting portion made of a gallium system (gallium aluminum-arsenic) film can be driven by MOSTFT comprising single crystal silicon, which is epitaxially grown in accordance with the present invention, or the film of the light emitting portion can be formed by single crystal growth by the epitaxial growth method according to the present invention.

Various modifications of the above-described embodiments of the present invention can be made on the basis of the technical idea of the present invention.

For example, in deposition of the single crystal silicon film 7 by the catalytic CVD method, diborane ($B_2H_6$), phosphine ($PH_3$), arsine ($AsH_3$), stibine ($SbH_3$), or the like is supplied, and decomposed to dope the single crystal silicon film 7 with, for example, boron, phosphorus, antimony, arsenic, or the like in an appropriate dosage so that the conduction type, i.e., the P type or N type, and the carrier concentration of the epitaxial grown silicon layer 7 can be freely controlled. The single crystal silicon film 7 can also be formed by the high-density plasma CVD method, for example, ECR (electron cyclotron resonance) plasma CVD.

In order to prevent ion diffusion from the glass substrate, a SiN film (for example, a thickness of 50 to 200 nm), and if required, a $SiO_2$ film (for example, a thickness of 100 nm) may be provided on the substrate surface, or the step portions 4 may be formed in these films. The step portions 4 can also be formed by not only RIE but also an ion milling method. As described above, of course, the step portions 4 may be formed in the substrate 1 as well as a crystalline sapphire film or a sapphire substrate itself within the thickness thereof.

Furthermore, a spinel structure (for example, magnesia spinel) (MgO.Al$_2$O$_3$), CaF$_2$, SrF$_2$, BaF$_2$, BP, (Y$_2$O$_3$)$_m$, (ZrO$_2$)$_{1-m}$, or the like, which has good lattice matching with single crystal silicon, can also be used in place of sapphire (Al$_2$O$_3$).

Although the present invention is suitable for TFTs in the peripheral driving circuit, active regions of elements such as diodes and the like, and a passive region comprising a resistor, a capacitor, an inductor, etc. can also be formed by the single crystal silicon layer according to the present invention.

In the present invention, particularly, single crystal silicon is hetero-epitaxially grown by the catalystic CVD or high-density plasma CVD method using as a seed a material layer such as a crystalline sapphire film or the like having good lattice matching with a single crystal semiconductor such as single crystal silicon so that the thus-obtained single crystal silicon thin film layer is used for at least the active elements of the active elements such as top gate type MOSTFT of the peripheral driving circuit region of an electrooptic device such as LED in which the display region and the peripheral driving circuit region are integrated, or the like, and the passive elements thereof. Therefore, the following significant effects (A) to (G) can be obtained.

(A) Since the material layer (for example, a crystalline sapphire film) having good lattice matching with single crystal silicon is formed on the substrate, and used as a seed for hetero expitaxial growth to form a single crystal semi-conductor layer such as a single crystal silicon thin film having a high electron mobility of 540 cm$^2$/v·sec, an electrooptic device such as a thin film semiconductor device for display comprising a built-in high-performance driver can be manufactured.

(B) Particularly, single crystal silicon top gate type TFT comprising the single crystal silicon thin film permits a structure in which the display region comprising nMOS, pMOSTFT or cMOSTFT having the LDD structure and high switching properties, and the peripheral driving circuit region comprising cMOS, nMOS or pMOSTFT having high driving ability, or a mixture thereof are integrated, realizing a display panel having high image quality, high definition, a narrow frame, high efficiency, and a large screen.

(C) Since the single crystal silicon layer can be formed on the material layer by a low-temperature deposition technique such as the catalytic CVD (chemical vapor growth using a catalyst: substrate temperature of 200 to 800° C., particularly 300 to 400° C.) or the like using the material layer as a seed for hetero epitaxial growth, a single crystal semiconductor layer of single crystal silicon can be uniformly formed on the substrate at low temperature. Therefore, it is possible to use a substrate easily obtained and having low cost and good physical properties, such as a glass substrate having a relatively low strain point, a heat-resistant organic substrate, or the like. It is also possible to increase the size of the substrate.

(D) Unlike the solid growth method, annealing at medium temperature for a long time, and excimer laser annealing are unnecessary, thereby causing high productivity and no need for an expensive manufacturing apparatus. This permits cost reduction.

(E) In the hetero epitaxial growth, a wide range of P-type or N-type conduction single crystal silicon thin films with high mobility can easily be obtained by controlling the crystallinity of the material layer of crystalline sapphire or the like, the gas composition ratio of catalytic CVD, the heating temperature of the substrate, the cooling rate, etc., thereby permitting easy control of Vth, and a high-speed operation due to a decrease in resistance.

(F) In deposition of single crystal silicon by catalytic CVD or the like, doping with an appropriate amount of III-group or V-group impurity element (boron, phosphorus, antimony, arsenic, bismuth, aluminum, or the like) can be separately carried out by using a doping gas to arbitrarily control the type and/or concentration of the impurity of the single crystal silicon thin film formed by hetero epitaxial growth, i.e., the conduction type such as P type or N type, and/or the carrier concentration.

(G) Since the material layer such as a crystalline sapphire thin film or the like functions as a diffusion barrier for various atoms, it is possible to suppress impurity diffusion from the glass substrate.

What is claimed is:

1. A method of manufacturing an electrooptic device comprising a first substrate comprising a display region in which pixel electrodes are arranged, and a peripheral driving circuit region arranged in the periphery of the display region, a second substrate, and an optical material interposed between a first substrate and a second substrate, the method comprising the steps of:

forming step portions in one side of the first substrate;

depositing a single crystal semiconductor layer on the first substrate including the step portions by graphoepitaxial growth by a catalytic CVD or high-density plasma CVD method using the step portions as seeds;

forming channel, source and drain regions in the single crystal semiconductor layer after growth of the single crystal semiconductor layer; and forming gate portions of the channel regions to form top gate type first thin film transistors which constitute at least a portion of the peripheral driving circuit region, wherein the first thin film transistors are respectively provided in the step portions of the first substrate.

2. A method of manufacturing an electrooptic device according to claim 1, wherein the step portions are formed into recessed portions having a sectional shape in which a side is at a right angle with a bottom or inclined toward a lower end, so as to be used as the seeds for graphoepitaxial growth of the single crystal semiconductor layer.

3. A method of manufacturing an electrooptic device according to claim 1, wherein the step portions are formed in the first substrate by dry etching, and the single crystal semiconductor layer is formed at 200 to 800° C.

4. A method of manufacturing an electrooptic device according to claim 1, wherein the single crystal semiconductor layer is a single crystal silicon layer, which is formed on the first substrate by the catalytic CVD method comprising bringing a gas containing silicon hydride as a main component into contact with a heated catalyst.

5. A method of manufacturing an electrooptic device according to claim 4, wherein silane is used as the silicon hydride, and at least one material selected from the group consisting of tungsten, tungsten containing thorium oxide, molybdenum, platinum, palladium, silicon, alumina, ceramics with metals adhered thereto, and silicon carbide.

6. A method of manufacturing an electrooptic device according to claim 1, wherein a diffusion barrier layer is formed on the first substrate, and the single crystal semiconductor layer is formed on the diffusion barrier layer.

7. A method of manufacturing an electrooptic device according to claim 1, wherein in deposition of the single crystal semiconductor layer, III-group or V-group impurity element is mixed to control the type and/or concentration of the impurity of the single crystal semiconductor layer.

8. A method of manufacturing an electrooptic device according to claim 1, wherein the first thin film transistors are respectively provided in recessed portions of the first substrate, which are formed by the step portions.

9. A method of manufacturing an electrooptic device according to claim 1, wherein each of the step portions is formed along at least one side of an element region comprising the channel, source and drain regions of each of the first thin film transistors.

10. A method of manufacturing an electrooptic device according to claim 1, wherein after growth of the single crystal semiconductor layer, an upper gate portion comprising a gate insulating film and a gate electrode is formed on the single crystal semiconductor layer so that a III-group or V-group element is introduced into the single crystal silicon layer by using the upper gate portion as a mask to form the channel, source and drain regions.

11. A method of manufacturing an electrooptic device according to claim 1, wherein besides the first thin film transistors, a thin film transistor comprising a channel region made of a polycrystalline or amorphous silicon layer, or at least one element selected from the group consisting of a diode, a resistor, a capacitor, and an inductor is provided in the peripheral driving circuit region.

12. A method of manufacturing an electrooptic device according to claim 1, wherein switching elements are provided on the first substrate, for switching each of the pixel electrodes in the display region.

13. A method of manufacturing an electrooptic device according to claim 12, wherein the first thin film transistors are top gate type thin film transistors, and the switching elements comprise second thin film transistors.

14. A method of manufacturing an electrooptic device according to claim 13, wherein the second thin film transistors are bottom gate type or dual gate type, and lower gate electrodes comprising a heat resistant material are provided below channel regions of the second thin film transistors, and gate insulating films are formed on the lower gate electrodes to form lower gate portions, followed by the step of forming the step portions, and the step of forming the first thin film transistors.

15. A method of manufacturing an electrooptic device according to claim 14, wherein the second thin film transistors are the dual gate type thin film transistors, and upper gate electrodes of the second thin film transistors are made of a material common to the gate portions of the first thin film transistors.

16. A method of manufacturing an electrooptic device according to claim 14, wherein after the single crystal semiconductor layer is formed on the lower gate portions, a III-group or V-group element is introduced into the single crystal semiconductor layer to form source and drain regions, followed by activation.

17. A method of manufacturing an electrooptic device according to claim 16, wherein after the single crystal semiconductor layer is formed, source and drain regions of each of the first and second thin film transistors are formed by ion implantation of the III-group or V-group element using a resist mask, followed by activation.

18. A method of manufacturing an electrooptic device according to claim 13, wherein the second thin film transistors are a top gate type, and after the single crystal semiconductor layer is formed, source and drain regions of each of the first and second thin film transistors are formed by ion implantation of the III-group or V-group element using a resist mask, and a gate portion of each of the first and second thin film transistors, which comprises a gate insulating film and a gate electrode, is then formed after activation.

19. A method of manufacturing an electrooptic device according to claim 13, wherein the second thin film transistors are top gate type, and after the single crystal semiconductor layer is formed, a gate insulating film and a gate electrode made of heat resistant material are formed to form a gate portion in each of the first and second thin film transistors, and source and drain regions are formed by ion implantation of an impurity element using the gate portion in each of the first and second thin film transistors as a mask, followed by activation.

20. A method of manufacturing an electrooptic device according to claim 13, wherein at least some of the thin film transistors in the peripheral driving circuit region and the display region have a LDD (lightly doped drain) structure.

21. A method of manufacturing an electrooptic device according to claim 20, wherein a resist mask used for forming the LDD structure is left, and another resist mask is formed to cover the remaining resist mask and used for forming the source and drain regions by ion implantation.

22. A method of manufacturing an electrooptic device according to claim 1, wherein the first substrate is a glass substrate or a heat-resistant organic substrate.

23. A method of manufacturing an electrooptic device according to claim 1, wherein when the pixel electrodes are reflective electrodes, irregularity is formed in a resin film so that the pixel electrodes are transparent electrodes, a surface of the resin film is flattened by a transparent planarizing film so that the pixel electrodes are provided on the planarizing film.

24. A method of manufacturing an electrooptic device according to claim 1, wherein the first thin film transistors are respectively provided in projected portions of the first substrate, which are formed by the step portions.

25. A method of manufacturing a driving substrate for an electrooptic device comprising a substrate on which a display region in which pixel electrodes are arranged, and a peripheral driving circuit region arranged in the periphery of the display region are provided, the method comprising the steps of:

forming step portions in one side of the substrate;

depositing a single crystal semiconductor layer on the substrate including the step portions by graphoepitaxial growth by a catalytic CVD or high-density plasma CVD method using the step -portions as seeds; and forming channel, source and drain regions in the single crystal semiconductor layer after growth of the single crystal semiconductor layer; and forming gate portions of the channel regions to form top gate type first thin film transistors which constitute at least a portion of the peripheral driving circuit region, wherein the first thin film transistors are respectively provided in the step portions of the substrate.

26. A method of manufacturing an electrooptic device comprising a first substrate comprising a display region in which pixel electrodes are arranged, and a peripheral driving circuit region arranged in the periphery of the display region, a second substrate, and an optical material interposed between the first and second substrates, the method comprising the steps of:

forming a material layer having high lattice matching with a single crystal semiconductor on a side of the first substrate;

depositing a single crystal semiconductor layer on the first substrate including the material layer by heteroepitaxial growth by a catalytic CVD or high-density plasma CVD using the material layer as a seed; and forming active elements by predetermined processing of the single crystal semiconductor layer.

27. A method of manufacturing a driving substrate for an electrooptic device comprising a substrate comprising a display region in which pixel electrodes are arranged, and a peripheral driving circuit region arranged in the periphery of the display region, the method comprising the steps of:

forming a material layer having high lattice matching with a single crystal semiconductor on a side of the substrate;

depositing a single crystal semiconductor layer on the substrate including the material layer by heteroepitaxial growth by a catalytic CVD or high-density plasma CVD using the material layer as a seed; and forming at least active elements by predetermined processing of the single crystal semiconductor layer.

* * * * *